(12) United States Patent
Nakamura et al.

(10) Patent No.: US 7,115,944 B2
(45) Date of Patent: Oct. 3, 2006

(54) SEMICONDUCTOR DEVICE

(75) Inventors: Katsumi Nakamura, Hyogo (JP); Shigeru Kusunoki, Hyogo (JP); Hideki Nakamura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/204,048

(22) Filed: Aug. 16, 2005

(65) Prior Publication Data

US 2005/0280029 A1 Dec. 22, 2005

Related U.S. Application Data

(62) Division of application No. 10/221,273, filed as application No. PCT/JP01/00373 on Jan. 19, 2001, now Pat. No. 6,953,968.

(51) Int. Cl.
*H01L 29/76* (2006.01)
(52) U.S. Cl. .............. 257/328; 257/329; 257/330; 257/301; 257/302
(58) Field of Classification Search ........... 257/328, 257/329, 330, 301, 302
See application file for complete search history.

(56) References Cited

U.S. PATENT DOCUMENTS

| | | | |
|---|---|---|---|
| 4,994,871 A | 2/1991 | Chang et al. | |
| 5,001,078 A | 3/1991 | Wada | |
| 5,623,152 A | 4/1997 | Majumdar et al. | |
| 5,894,149 A | 4/1999 | Uenishi et al. | |
| 5,895,951 A | 4/1999 | So et al. | |
| 6,040,599 A | 3/2000 | Takahashi | |
| 6,111,290 A * | 8/2000 | Uenishi et al. | 257/331 |
| 6,323,717 B1 * | 11/2001 | Omura et al. | 327/434 |
| 6,392,272 B1 * | 5/2002 | Hasegawa | 257/329 |
| 6,396,102 B1 * | 5/2002 | Calafut | 257/331 |
| 6,465,298 B1 | 10/2002 | Forbes et al. | |
| 6,566,691 B1 * | 5/2003 | Inoue et al. | 257/139 |

FOREIGN PATENT DOCUMENTS

| | | |
|---|---|---|
| JP | 03-109775 | 5/1991 |
| JP | 05-033546 | 4/1993 |
| JP | 07-50405 | 2/1995 |
| JP | 08-222728 | 8/1996 |

(Continued)

OTHER PUBLICATIONS

"Carrier Stored Trench-Gate Bipolar Transistor (CSTBT)—A Novel Power Device for High Voltage Application", H. Takahashi et al., 1996 IEEE, pp. 349-352.

(Continued)

*Primary Examiner*—Douglas Menz
(74) *Attorney, Agent, or Firm*—McDermott Will & Emery LLP

(57) ABSTRACT

A semiconductor device of the present invention has an insulating gate type field effect transistor portion having an n-type emitter region (3) and an n⁻ silicon substrate (1), which are opposed to each other sandwiching a p-type body region (2), as well as a gate electrode (5a) which is opposed to p-type body region (2) sandwiching a gate insulating film (4a), and also has a stabilizing plate (5b). This stabilizing plate (5b) is made of a conductor or a semiconductor, is opposed to n⁻ silicon substrate (1) sandwiching an insulating film (4, 4b) for a plate, and forms together with n⁻ silicon substrate (1), a capacitor. This stabilizing plate capacitor formed between stabilizing plate (5b) and n⁻ silicon substrate (1) has a capacitance greater than that of the gate-drain capacitor formed between gate electrode (5a) and n⁻ silicon substrate (1).

6 Claims, 56 Drawing Sheets

FOREIGN PATENT DOCUMENTS

| | | |
|---|---|---|
| JP | 08-264772 | 10/1996 |
| JP | 09-275212 | 10/1997 |
| JP | 09-283754 | 10/1997 |
| JP | 09-331063 | 12/1997 |
| JP | 10-308512 | 11/1998 |
| JP | 11-17176 | 1/1999 |
| JP | 11-330466 | 11/1999 |

OTHER PUBLICATIONS

"The Field Stop IGBT (FS IGBT)—A New Power Device Concept with a Great Improvement Potential", T. Laska et al., 2000 IEEE, pp. 355-358.

"NPT-IGBT—Optimizing for Manufacturability", Darryl Burns et al., 1996 IEEE, pp. 331-334.

"Analysis of IPM Current Oscillation under Short Circuit Condition", M. Takei et al., Proceedings of the 1998 International Symposium on Power Semiconductor Devices & ICs, Kyoto, pp. 89-93.

"4500 V IEGTs having Switching Characteristics Superior to GTO", Mitsuhiko Kitagawa et al., Proceedings of 1995 International Symposium on Power Semiconductor Devices & ICs, Yokohama, pp. 486-491.

"Concept For the Low Forward Voltage Drop 4500V Trench IGBT", T. Nitta et al., Proceedings of 1998 International Symposium on Power Semiconductor Devices & ICs, Kyoto, pp. 43-46.

* cited by examiner

MOS TRANSISTOR PORTION
$I = \beta \cdot W/L \cdot (Vg-Vth) \cdot Vd$

DIODE PORTION
$I = A \exp\{k \cdot (Vc-Vd)\}$ $\beta$, A AND k ARE APPROXIMATELY CONSTANT NUMBERS CHANGE : di/dt CHANGE : dVd/dt

US 7,115,944 B2

SEMICONDUCTOR DEVICE

RELATED APPLICATION

This application is a divisional of application Ser. No. 10/221,273 filed Sep. 10, 2002 now U.S. Pat. No. 6,953,968, which is a 371 of PCT/JP01/00373 filed Jan. 19, 2001.

TECHNICAL FIELD

The present invention relates to a semiconductor device and to a high voltage withstanding semiconductor device in which suppression of short circuiting current, reduction in gate capacitance and suppression of oscillation at the time of short circuiting can be achieved at the same time.

BACKGROUND ART

In the field of a high voltage withstanding semiconductor device that controls a voltage exceeding several hundred volts, element characteristics wherein heat emission, that is to say, loss is suppressed are required because the current handled is great. In addition, as for a driving system of a gate that controls this voltage and current, a voltage drive element of which the driving circuit is small so that the loss therein is small is desirable.

In recent years, because of the above described reasons, an insulated gate bipolar transistor, that is to say, an IGBT, has come into wide use as an element wherein a voltage drive is possible and loss is small in this field. The structure of this IGBT is a structure wherein the impurity concentration of the drain is lowered so as to secure the withstanding voltage in a MOS (metal oxide semiconductor) transistor and the drain can be regarded as a diode in order to reduce the drain resistance.

Thus, a diode carries out a bipolar operation in an IGBT and, therefore, in the present application the source of the MOS transistor of an IGBT is referred to as an emitter and the drain is referred to as a collector.

A voltage of several hundred volts is applied between the collector and the emitter of an IGBT, which is a voltage drive element and which is controlled by the gate voltage of which the voltage is ±several volts to several tens of volts. In addition, in many cases an IGBT is used as an inverter, wherein the voltage between the collector and the emitter is low in the case that the gate is in the on condition so that a great amount of current flows while no current flows and the voltage between collector and the emitter is high in the case that the gate is in the off condition.

Since the operation of an IGBT is carried out conventionally in the above described mode, the loss is divided into constant loss, which is a product of current and voltage in the on condition, and switching loss at the time of transition wherein the on condition and the off condition are switched. The product of leak current and-voltage in the off condition is so small that it can be ignored.

On the other hand, it is important to prevent breakdown of the element during an abnormal state such as, for example, in the case that the load is short circuited. In this case, the gate is turned on while the power source voltage of several hundred volts is applied between the collector and the emitter so that a large current flows.

In an IGBT having a structure wherein a MOS transistor and a diode are connected in series the maximum current is controlled by the saturation current of the MOS transistor. Therefore, the current control works even at the time of short circuiting, as described above, so that breakdown of the element due to heat emission of a constant period of time can be prevented.

In IGBTs of recent years, however, a trench gate IGBT that has adopted a trench gate in order to further reduce loss has come into wide use. Since a trench gate IGBT is an element wherein the MOS transistor portion is miniaturized, the gate capacitance becomes large and the saturation current becomes very large at the time of short circuiting so as to tend to break down for a short period of time due to a great heat emission.

Furthermore, in recent years there has been a phenomenon wherein a malfunction is caused by the occurrence of oscillation in the gate voltage, gate current, collector-emitter voltage and collector current at the time of short circuiting due to the feedback capacitance of an IGBT as described in, for example, "Proceedings of 1998 International Symposium on Power Semiconductor Devices & ICs, p. 89." Such an oscillation phenomenon due to the feedback capacitance has become an increasingly serious problem in an element of which the gate capacitance is large such as a trench gate IGBT. A prior art and problems thereof are described from such a point of view in the following.

FIG. 52 is a cross sectional view schematically showing the configuration of a high voltage withstanding semiconductor device according to a prior art. In reference to FIG. 52, a p-type body region 102 is formed in the first main surface of an n⁻ silicon substrate 101, which has a concentration of approximately $1 \times 10^{14}$ cm⁻³. The concentration of this p-type body region 102 is approximately $1 \times 10^{16}$ cm⁻³ to $1 \times 10^{18}$ cm⁻³ and the depth from the first main surface is approximately 3 μm. An n-type emitter region 103 and a p⁺ impurity region 106 are formed in the first main surface within this p-type body region 102.

The concentration of this n-type emitter region 103 is $1 \times 10^{19}$ cm⁻³, or greater, and the depth is approximately 0.5 μm. The p⁺ impurity region 106 is formed so as to provide a low resistance contact with p-type body region 102 and has the concentration of approximately $1 \times 10^{20}$ cm⁻³.

A trench 101a for a gate, of which the depth is 3 μm to 10 μm, is created so as to penetrate this n-type emitter region 103 and p-type body region 102 and to reach n⁻ silicon substrate 101. The pitch of this trench 101a for a gate is, in general, 2.0 μm to 6.0 μm. A gate insulating film 104a, made of, for example, a silicon oxide film having a thickness of 30 nm to 200 nm, is formed so as to line the inner surface of this trench 101a. A gate electrode 105a made of polycrystal silicon, into which phosphorous, for example, is introduced at a high concentration, is formed so as to fill in this trench 101a for a gate.

An insulating film 109 is formed on the first main surface and a hole 109a for opening a portion of the first main surface is provided in this insulating film 109. A barrier metal layer 110 is formed at the bottom of this hole 109a. An emitter electrode 111 is electrically connected to p-type body region 102 and to n-type emitter region 103 via this barrier metal layer 110.

An n-type buffer region 107 and a p-type collector region 108 are formed in the second main surface of n⁻ silicon substrate 101. A collector electrode 112 made of, for example, an aluminum compound is electrically connected to this p-type collector region 108.

In the above described semiconductor device, for example, at the time of the connection of an inverter, the gate potential G of gate electrode 105a is −15V in the off condition in reference to the emitter potential E and is a control signal in a pulse form set at +15V in the on condition while the collector potential of collector electrode 112 follows the gate potential so as to be approximately in the operational voltage range between the power supply voltage and saturation voltage.

FIG. 53 shows a schematic cross sectional view showing a terminal portion of the cell region of a high voltage withstanding semiconductor device according to a prior art. In reference to FIG. 53, a p-type impurity region 121 is formed so as to have a concentration of, for example, $1 \times 10^{16}$ cm$^{-3}$ to $1 \times 10^{18}$ cm$^{-3}$ in the first main surface of the terminal portion of the region wherein a plurality of cells are arranged. This p-type impurity region 121 is formed deeper than p-type body region 102 from the first main surface and has a structure that mitigates the electrical field due to the potential gap between the outer most peripheral portion of the chip and the cell region.

The structure of FIG. 52 has been improved so as to gain semiconductor devices as disclosed in U.S. Pat. No. 6,040,599 and in Japanese Patent Laying-Open No. 9-331063. In the following, these semiconductor devices are described.

FIG. 54 is a cross sectional view schematically showing the configuration of the semiconductor device disclosed in U.S. Pat. No. 6,040,599. In reference to FIG. 54, the structure of this semiconductor device substantially differs from the configuration of FIG. 52 in the point that a high concentration n-type impurity region 114 is added. This high concentration n-type impurity region 114 is provided in a portion that contacts p-type body region 102 within n$^-$ silicon substrate 101.

Here, the parts of the configuration other than this are substantially the same as the above described configuration shown in FIG. 52 and, therefore, the same signs are attached to the same members, of which the descriptions are omitted.

In the configuration shown in FIG. 54, a barrier against carriers can be formed because of the existence of high concentration n-type impurity region 114. Therefore, the carrier concentration on the emitter side of n$^-$ silicon substrate 101 can be increased without reducing the area of p-type body region 102. Thereby, the on resistance and the on voltage can be reduced.

FIG. 55 is a cross sectional view schematically showing the configuration of a semiconductor device disclosed in the Japanese Patent Laying-Open No. 9-331063. In reference to FIG. 55, the configuration of this semiconductor device differs from the configuration shown in FIG. 52 in the point that a so-called emitter trench is provided. This emitter trench is formed of a trench 101b for an emitter provided in the first main surface of the substrate, an insulating film 104b for an emitter formed along the inner surface of this trench 101b for an emitter and an emitter electrode 105b that fills in trench 101b for an emitter. This electrode 105b for an emitter is electrically connected to an emitter electrode 111 via a hole 109b provided in insulating layers 109A and 109B. Such an emitter trench is provided in a region that is, for example, sandwiched by two trenches 101a for gates.

Here, the parts of the configuration other than this are substantially the same as the above described configuration shown in FIG. 52 and, therefore, the same signs are attached to the same members, of which the descriptions are omitted.

According to the above described gazette, when the distance dx between trench 101a for a gate and trench 101b for an emitter is 0.2 μm and the pitch Pi of trenches 101a for gates is 5.3 μm in the configuration of FIG. 55, the carrier concentration on the emitter side increases and the on resistance (that is to say, voltage between the collector and the emitter in the IGBT under a constant current; saturation voltage) of the IGBT can be reduced so that the steady-state loss can be suppressed.

However, in the configuration (FIG. 54) disclosed in U.S. Pat. No. 6,040,599 the depletion layer becomes resistant to expansion from gate 105a because of the existence of high concentration n-type impurity region 114. Thereby, the gate capacitance on the drain side becomes great so that a problem arises wherein oscillation occurs at the time of short circuiting.

In addition, in the configuration disclosed in U.S. Pat. No. 6,040,599 the saturation current becomes very great in the case that trenches 101a for gates are designed with a conventional pitch and a problem arises wherein the withstanding capacity, itself, against short circuiting is lowered.

Furthermore, in the configuration disclosed in U.S. Pat. No. 6,040,599, since the gate capacitance is great, a problem arises wherein a switching time delay occurs and a gate drive circuit of a large capacitance becomes necessary.

In addition, in the configuration (FIG. 55) disclosed in Japanese Patent Laying-Open No. 9-331063, the saturation voltage is lowered by reducing (2×dx)/Pi. In order to lower the saturation voltage, however, it is not necessary for conductive layer 105b, which fills in trench 101b for an emitter, to be at the emitter potential and oscillation control is not taken into consideration. Therefore, in the case that the potential of conductive layer 105b, which fills in trench 101b for an emitter, becomes of the gate potential or of a floating potential or in the case that other conditions have fluctuated, a problem arises wherein oscillation occurs at the time of short circuiting even if conductive layer 105b becomes of the emitter potential. This is described in detail in the following.

In order to gain the effects of the invention disclosed in Japanese Patent Laying-Open No. 9-331063, it is essential for (2×dx)/Pi to be small. Here, (2×dx)/Pi is a ratio of p-type body region 102 that is connected to the emitter potential E in a cell.

In addition, in Japanese Patent Laying-Open No. 7-50405 that discloses an invention that is similar to the invention according to Japanese Patent Laying-Open No. 9-331063, it is cited as a requirement that (Pi+dy)/(2×dx) is no less than five when the difference between the depth of a trench and the depth of a p-type body region is dy. Here, dx is the width of a p-type body region that is connected to the emitter potential E and that corresponds to one channel of a MOS transistor.

That is to say, in the invention according to Japanese Patent Laying-Open No. 9-331063, the requirement for the lowering of the saturation voltage specifies that Pi/dx is large, irregardless of dy and does not specify that conductive layer 105b, which fills in trench 101b for an emitter, becomes of the emitter potential.

FIG. 56 is a diagram showing an equivalent circuit of an IGBT. In reference to FIG. 56, in the inventions according to Japanese Patent Laying-Open No. 7-50405 and Japanese Patent Laying-Open No. 9-331063, Pi/dx is increased so that Pi is increased in reference to dx, which is restricted because of a microscopic processing limitation. Therefore, a portion of a MOS transistor structure formed in a unit area is reduced. Accordingly, the voltage drop Vmos in the MOS transistor Tr portion becomes greater than that in the structure of FIG. 52 wherein there is no emitter trench.

On the other hand, in the inventions according to Japanese Patent Laying-Open No. 7-50405 and Japanese Patent Laying-Open No. 9-331063, the carrier concentration in a region in the vicinity of the emitter side of n-type substrate 101 rises, as shown in Japanese Patent Laying-Open No. 7-50405 and, therefore, the voltage drop Vdi in the diode Di portion becomes smaller than in the structure of FIG. 52 wherein there is not emitter trench.

The saturation voltage of the IGBT is represented by the sum of Vmos and Vdi and, therefore, the condition wherein (Pi+dy)/(2×dx) is no less than five, as described in Japanese Patent Laying-Open No. 7-50405, has no basis.

In reference to this, "Proceedings of 1995 International Symposium on Semiconductor Devices & ICs," pp. 486–491 describes wherein in the case that a parameter of the MOS transistor portion is made a constant, the saturation voltage rises because the voltage drop in the MOS transistor becomes great when Pi/dx is made too large.

The optimal range of Pi/dx changes depending on the parameters of the MOS transistor portion, such as the thickness of the gate insulating film and the channel length, the parameters of the diode portion, such as the thickness of the substrate and the lifetime within the substrate, the depth of the trench, current density, and the like, when the collector injection efficiency is set at a constant, as shown in "Proceedings of 1998 International Symposium on Semiconductor Devices & ICs," pp. 43–46.

However, when the existing general parameters of an IGBT are used and dx is set at 1.5 µm to 2.5 µm, which are realistic values, the optimal Pi/dx becomes approximately five to eight in a high voltage withstanding IGBT of the 5000 V class. In addition, in the case that the collector injection efficiency is low, such as in an NPT (non-punch through) type IGBT of the 1000 V class, the effects of lowering the saturation voltage can be gained when Pi/dx is approximately eight while, contrarily, the saturation voltage increases when Pi/dx is approximately three in the case that dx is 2 µm and the current density is 100 A/cm$^2$.

Thus, in the invention according to Japanese Patent Laying-Open No. 9-331063, the necessity for the conductive layer 105$b$, which fills in trench 101$b$ for an emitter, to be of the emitter potential merely requires that no channel be formed on a sidewall of trench 101$b$ for an emitter. However, in the configuration shown in FIG. 55 disclosed in the above described gazette, an n$^+$ emitter region 103 is not provided on a sidewall of trench 101$b$ for an emitter so that no channel is formed on the sidewall. Accordingly, conductive layer 105$b$, which fills in trench 101$b$ for an emitter, is not at the emitter potential and, even in the case that it is, for example, at a floating potential or at the gate potential, the effects of the reduction of the saturation voltage can be gained so that the necessity for lowering the saturation voltage does not require conductive layer 105$b$, which fills in trench 101$b$ for an emitter, to be at the emitter potential.

Accordingly, in the case that the potential of conductive layer 105$b$, which fills in trench 101$b$ for an emitter, becomes of the gate potential or at a floating potential, or in the case that other conditions fluctuate even if the potential of the conductive layer becomes of the emitter potential, oscillation occurs at the time of short circuiting.

Here, the oscillation of an IGBT is briefly described.

FIG. 57 is a diagram showing an equivalent circuit of an IGBT. In reference to FIG. 57, in the case that the gate of a MOS transistor Tr is turned on under the short circuited condition and the gate voltage becomes Vg, MOS transistor Tr changes from the off condition to the on condition and, therefore, the potential Vd on the drain side suddenly drops so as to have a change of dVd. On the other hand, since the main current i changes by di/dt, the potential Vs on the source side rises by Re·di/dt when the resistance of the emitter is Re.

Accordingly, when the capacitance on the drain side is Cd and the capacitance on the source side is Cs, the current igd that flows into the gate from the drain side becomes as follows:

$$igd = Cd \cdot dVd/dt \ (dVd/dt<0)$$

In addition, the current igs that flows into the gate from the source side becomes as follows:

$$igs = Cs \cdot Re \cdot di/dt \ (di/dt>0)$$

Accordingly, the sum of the current ig that flows into the gate becomes igd+igs and the gate voltage changes by dVg=Rg·ig so as to become Vg' when the gate resistance is Rg. Here, Vg' is represented as follows:

$$Vg' = Vg + Rg \cdot ig = Vg + Rg \cdot (Cd \cdot dVd/dt + Cs \cdot Re \cdot di/dt)$$

Since, in practice, a time difference occurs between dVd/dt and di/dt due to parasitic inductance, a phenomenon, which is ignored here because a qualitative description is given, occurs wherein gate voltage surges at the on time.

In addition, Cd and Cs change due to Vd and Vg and this change is also ignored in the qualitative portion of the present description.

In addition, because of the above reason, when the main current is in the short circuited condition so that the MOS transistor is in the saturation condition, the current change di=i'-i becomes as follows:

$$di = gm(Vg' - Vth)^k - gm(Vg - Vth)^k$$

Here, k has a value of from 1 to 2. gm is a transconductance.

In addition, the potential Vd' on the drain side again changes depending on the change in this current. The behavior of the IGBT at the time of short circuiting changes depending on how the above repeated feedback is applied.

At the time of the change from the off condition to the short circuiting (on condition), in the case of Cs·Re·di/dt+Cd·dVd/dt>0, Vg' becomes as follows when Vg' is the gate voltage dt periods of time after Vg:

$$Vg' = Vg + Rg \cdot ig = Vg + Rg \cdot (Cd \cdot dVd/dt + Cs \cdot Re \cdot di/dt)$$

Because of (Cd·dVd/dt+Cs·Re·di/dt)>0 in the above equation, Vg'>Vg is gained.

That is to say, the gate voltage increases further. The main current i' after dt periods of time is represented as follows;

$$i' = gm(Vg' - Vth)^k$$

Therefore, together with the increase in the gate voltage, the main current increases further. Positive feedback is thus applied.

In addition, together with the increase in the gate voltage, the voltage Vd between the drain and the source drops further and the change therein, dVd', is smaller than dVd. Thus, dVd/dt becomes smaller over time and, therefore, the change in Vg becomes smaller over time. Furthermore, di/dt becomes smaller over time and, therefore, convergence is finally gained such that no oscillation occurs.

When Cs·Re·di/dt+Cd·dVd/dt is very large, however, the positive feedback is too great so that the main current momentarily becomes very great and a breakdown may occur due to heat emission.

In the case of Cs·Re·di/dt+Cd·dVd/dt<0, negative feedback is applied.

That is to say, the effects of the lowering of the potential Vd, in the vicinity of the drain, due to the turning on of the gate is great so that a current flows into the gate.

$$Vg' = Vg + Rg \cdot ig = Vg + Rg \cdot (Cd \cdot dVd/dt + Cs \cdot Re \cdot di/dt)$$

Because of (Cd·dVd/dt+Cs·Re·di/dt)<0 in the above equation, Vg'<Vg is gained.

That is to say, the gate voltage after dt periods of time is lowered.

Because i'=gm (Vg'-Vth)$^k$, the main current, in turn, decreases together with the lowering of the gate voltage. Under this condition, the main current i' becomes lower.

In the case of Vg'<Vth, the channel that has once been turned on converts to the off condition and, therefore, i' decreases remarkably while Vd' increases remarkably. Then, in this case there is, in turn, an opposing change from the on condition to the off condition so as to be dVd'/dt>0 and di'/dt<0 and, therefore, the MOS transistor portion of the IGBT converts to the condition that is close to off condition wherein Cs·Re·di'/dt+Cd·dVd'/dt>0 and, in turn, the following is again gained.

$$Vg'=Vg'+Rg·ig'=Vg'+Rg·(Cd·dVd'/dt+Cs·Re·di'/dt)$$

Then, because of Re·di'/dt+Cd'dVd'/dt>0, Vg">Vg' is gained so that the gate potential becomes very high.

Though this is repeated so as to cause an oscillation, in the case that the relationship between dVd (n) that has occurred at the nth oscillation and dVd (n+1) that has occurred at the (n+1)th oscillation is dVd (n)>dVd (n+1), the oscillation converges. Though in the case of dVd (n)<dVd (n+1), the oscillation becomes greater, dVd becomes of the maximum from the condition sufficiently turned on to the condition sufficiently turned off and, therefore, the oscillation amplitude has an upper limit and the oscillation continues under that condition.

Here, the coefficient cited as a feedback coefficient in the present application is a ratio of the change in dVd, dVd (OFF→ON)/dVd(ON→OFF), being a ratio of dVd in the case of conversion from the off condition to the on condition to dVd in the case of subsequent conversion from the on condition to the off condition wherein no less than −1 (finally converging to −1), approximately −0.9 (oscillation gradually converges) and approximately −0.1 (oscillation converges suddenly) are cited as examples.

Here, dVd (OFF→ON)/dVd(OF→OFF) and dVd (ON→OFF)/dVd(OFF→ON) are assumed to be the same (in practice).

In addition, in the configuration (FIG. 55) of Japanese Patent Laying-Open No. 9-331063, an emitter trench of a considerable width, relative to the pitch Pi of trench 10a for a gate, is required or a p-type body region 102 at a floating potential requires a considerable amount of space relative to the pitch Pi of trench 101a for a gate.

In the case that an emitter trench of a broad width is created, the conductor filled therein is deposited very thickly so that it is necessary to be etched back and a problem arises wherein productivity is lowered.

In addition, though in the case that dx is made very small the problem of productivity is resolved, the density of the MOS transistor becomes great and, therefore, a problem arises wherein a delay in switching time occurs due to the increase in gate capacitance and a gate drive circuit of a large capacitance is required.

In addition, because of the increase in the MOS transistor density, the lowering of the withstanding capacity against short circuiting due to the increase in the saturation current also becomes a problem.

In addition, in a technique wherein a p-type body region of a wide floating potential is secured, there is a possibility that latch up may occur due to a lack of area of the p-type body region of the emitter potential as shown in, for example, U.S. Pat. No. 4,994,871.

DISCLOSURE OF THE INVENTION

A purpose of the present invention is to provide a semiconductor device that can reduce the on resistance and, the saturation voltage and, in addition, reduce the saturation current and, furthermore, can suppress oscillation.

A semiconductor device according to one aspect of the present invention is provided with an insulating gate type field effect transistor portion and a stabilizing plate. The insulating gate type field effect transistor portion has a source region and a drain region that sandwich the channel formation region and are opposed to each other and a gate electrode that is opposed to the channel formation region by sandwiching a gate insulating film there between. The stabilizing plate is formed of a conductor or a semiconductor and is opposed to the drain region by sandwiching an insulating film for a plate there between and forms, together with the drain region, a capacitor. The stabilizing plate capacitor formed the stabilizing plate and the drain region has a greater capacitance than the gate-drain capacitor formed between the gate electrode and the drain region.

In accordance with the semiconductor device according to one aspect of the present invention, the stabilizing plate capacitor has a greater capacitance than the gate-drain capacitor and, therefore, it becomes possible to suppress the oscillation at the time of short circuiting.

In addition, the MOS transistor density can be reduced while suppressing the saturation voltage by providing the stabilizing plate. Therefore, a switching time delay due to increase in the gate capacitance can be prevented and a gate drive circuit of a large capacitance can be made unnecessary.

In addition, since the density of the insulating gate type field effect transistor can be reduced, the saturation current can be reduced and the withstanding capacity against short circuiting can be increased.

In addition, it is not necessary to have a configuration wherein a stabilizing plate is filled in into a trench of a broad width. Therefore, the deterioration in productivity with respect to the etching back of the gate electrode material at the time when the above described configuration is formed can be avoided.

The stabilizing plate is preferably electrically connected to the source region according to the above described aspect.

Thereby, oscillation can be effectively prevented.

The stabilizing plate preferably forms, together with the source potential, a capacitor according to the above described aspect.

Thereby, the freedom of configuration can be enhanced while preventing oscillation.

The film thickness of the insulating film for the plate in a portion wherein the stabilizing plate is opposed to the drain region is preferably thinner than the film thickness of the gate insulating film in a portion wherein the gate electrode is opposed to the drain region according to the above described aspect.

Thereby, oscillation can be prevented by using a simple configuration wherein the film thickness of the insulating film for the plate is merely made thicker than the film thickness of the gate insulating film.

The dielectric constant of the insulating film for the plate in the portion wherein the stabilizing plate is opposed to the drain region is preferably greater than the dielectric constant of the gate insulating film in the portion wherein the gate electrode is opposed to the drain region according to the above described aspect.

Thereby, oscillation can be prevented by using simple configuration wherein the dielectric constant of the insulating film for the plate is merely made greater than the dielectric constant of the gate insulating film.

The area where the stabilizing plate is opposed to the drain region is preferably larger than the area where the gate electrode is opposed to the drain region according to the above described aspect.

Thereby, oscillation can be suppressed by using a simple configuration.

The impurity concentration of the drain region in the portion that is opposed to the stabilizing plate is preferably higher than the impurity concentration of the drain region in the portion that is opposed to the gate electrode according to the above described aspect.

Thereby, oscillation can be suppressed by using a simple configuration wherein the impurity concentration is merely controlled.

A plurality of insulating gate type field effect transistors are preferably arranged side by side and two, or more, stabilizing plates are arranged in the regions sandwiched between two insulating gate type field effect transistors according to the above described aspect.

Thereby, the density of the insulating gate type field effect transistors can be reduced while preventing oscillation.

The impurity concentration of the region sandwiched between two, or more, stabilizing plates in the drain region is preferably higher than the impurity concentration of other regions in the drain region according to the above described aspect.

These regions of high impurity concentration restrict the expansion of the depletion layer and, thereby, the capacitance of the stabilizing plates can be maintained at a high level.

The channel formation region is preferably within a body region of a conductive type opposite to that of the source region and of drain region and the ratio of the length where the drain region is opposed to the stabilizing plate to the length where the body region is opposed to the stabilizing plate is greater than the ratio of the length where the drain region is opposed to the gate electrode to the length where the body region is opposed to the gate electrode according to the above described aspect.

Thereby, the capacitance of the stabilizing plate can be made greater than that of the gate-drain capacitor.

A semiconductor substrate that has a first main surface and a second main surface in opposition to each other and that has a trench for the gate created in the first main surface is preferably further provided and the gate electrode fills in the trench for the gate according to the above described aspect.

Thereby, oscillation can be prevented also in the configuration wherein the channel formation region is formed perpendicular to the surface of the substrate.

The gate electrode preferably has two sides in opposition to each other and each of the two sides face the channel formation region according to the above described aspect.

Thereby, it becomes possible to form channels on two sides of the gate electrode.

The electrode on the source side and the electrode on the drain side are both preferably formed in the first main surface of the semiconductor substrate according to the above described aspect.

Thereby, oscillation can also be suppressed in the configuration wherein the channel formation region is formed in parallel to the surface of the substrate.

The electrode on the source side is preferably formed in the first main surface of the semiconductor substrate while the electrode on the drain side is preferably formed on the second main surface side according to the above described aspect.

Thereby, oscillation can also be suppressed in the configuration wherein the channel formation region is formed perpendicular to the surface of the substrate.

The trench for the gate preferably reaches to the drain region according to the above described aspect.

Thereby, a capacitor can be formed between the gate electrode and the drain region.

A plural number of cells, which include the insulating gate-type field effect transistor portions, are preferably arranged side by side and the stabilizing plate is arranged in a terminal portion of the arranged plural number of cells.

Thereby, the change in potential that has occurred in the drain of an insulating gate type field effect transistor portion within a cell is restricted from having effects outside the cell so that the withstanding capacity can be increased.

A plural number of stabilizing plates are preferably arranged in a terminal portion of the arranged plural number of cells according to the above described aspect.

Thereby, the effect of suppressing oscillation can be further enhanced.

A semiconductor device according to another aspect of the present invention is provided with a semiconductor substrate, first and second insulating gate type field effect transistor portions and first and second stabilizing plates. The semiconductor substrate has a first main surface and a second main surface that are opposed to each other. Each of the first and second insulating gate type field effect transistors has a source region and a drain region opposed to each other sandwiching a channel formation region and a gate electrode opposed to the channel formation region sandwiching a gate insulating film. The first stabilizing plate is opposed to the drain region of the first insulating gate type field effect transistor portion sandwiching an insulating film for the first plate and, together with the drain region of the first insulating gate type field effect transistor portion, a capacitor and is made of a conductor or a semiconductor. The second stabilizing plate is opposed to the drain region of the second insulating gate type field effect transistor portion sandwiching an insulating film for the second plate and forms, together with the drain region of the second insulating gate type field effect transistor portion, a capacitor and is made of a conductor or a semiconductor. The first insulating gate type field effect transistor portion is formed in the first main surface while the second insulating gate type field effect transistor portion is formed in the second main surface and a current is allowed to flow between the first and second insulating gate type field effect transistor portions.

In accordance with the semiconductor device according to another aspect of the present invention, the capacitance of the stabilizing plates is made greater than the gate-drain capacitance and, thereby, it becomes possible to suppress oscillation at the time of short circuiting even in the configuration wherein each of the two insulating gate type field effect transistor portions is arranged so as to be opposed to the two surfaces of the substrate easily causing oscillation.

In addition, by providing the stabilizing plates, the density of the insulating gate type field effect transistor can be reduced while suppressing the saturation voltage. Therefore, a switching time delay due to increase in the gate capacitance can be provided and a gate driving circuit of a large capacitance can be made unnecessary.

In addition, since the density of the insulating gate type field effect transistor can be reduced, the saturation current can be reduced so that the withstanding capacity against short circuiting can be increased.

In addition, it is not necessary to provide a configuration wherein a stabilizing plate is filled in into a trench of a broad width. Therefore, the deterioration in productivity with respect to the etching back at the time when the above described configuration is formed can be avoided.

In the above described other aspect, the first stabilizing plate capacitor formed between the first stabilizing plate and the drain region of the first insulating gate type field effect transistor portion has a greater capacitance than the first gate-drain capacitor formed between the gate electrode and the drain region of the first insulating gate type field effect transistor portion. The second stabilizing plate capacitor formed between the second stabilizing plate and the drain region of the second insulating gate type field effect transistor portion has a greater capacitance than the second gate-drain capacitor formed between the gate electrode and the drain region of the second insulating gate type field effect transistor portion.

Thereby, it becomes possible to suppress oscillation.

In the above described other aspect, a plurality of transistors of the same type as the first insulating gate type field effect transistor are preferably arranged side by side and two, or more, of the plates of the same type as the first stabilizing plate are arranged in a region sandwiched by two of the transistors of the same type as the first insulating gate type field effect transistor. A plurality of transistors of the same type as the second insulating gate type field effect transistor are preferably arranged side by side and two, or more, of the plates of the same type as the second stabilizing plate are arranged in a region sandwiched by two of the transistors of the same type as the second insulating gate type field effect transistor. The impurity concentration of a region that is sandwiched by two, or more, of the plates of the same type as the first stabilizing plate and the impurity concentration of a region that is sandwiched by two, or more, of the plates of the same type as the second stabilizing plate are higher than the impurity concentration of other regions in the drain region.

Because of these regions of high impurity concentration, the depletion layer becomes resistant to expansion and, therefore, the capacitances of the stabilizing plates can be kept large.

In the above described other aspect, the semiconductor substrate preferably has a first trench for a gate created in the first main surface and a second trench for a gate created in the second main surface. The gate electrode of the first insulating gate type field effect transistor portion fills in the first trench for a gate. The gate electrode of the second insulating gate type field effect transistor portion fills in the second trench for a gate.

Thereby, oscillation can be suppressed in the configuration wherein the channel formation region is formed perpendicular to the surface of the substrate.

In the above described other aspect, the gate electrode of the first insulating gate type field effect transistor portion has two sides opposed to each other and is opposed to the channel formation region of the first insulating gate type field effect transistor portion on each of the two sides. The gate electrode of the second insulating gate type field effect transistor portion has two sides opposed to each other and is opposed to the channel formation region of the second insulating gate type field effect transistor portion in each of the two sides.

Thereby, a channel can be formed on both sides of the gate electrode.

In the above described other aspect, a plurality of cells that include the first and second insulating gate type field effect transistor portions are arranged side by side and the first and second stabilizing plates are arranged in a terminal portion of the arranged plurality of cells.

Thereby, the change in potential that has occurred in the drain of an insulating gate type field effect transistor portion within a cell can be restrained from having effects outside of the cell so that the withstanding capacity can be increased.

In the above described other aspect, a plurality of plates of the same types as of the first and second stabilizing plates, respectively, is arranged in the terminal portion of the arranged plurality of cells.

Thereby, oscillation suppression effects are further enhanced.

A semiconductor device according to still another aspect of the present invention is provided with an insulating gate type field effect transistor portion and a stabilizing plate. The insulating gate type field effect transistor portion has a source region and a drain region opposed to each other sandwiching a channel formation region and a gate electrode opposed to the channel formation region sandwiching a gate insulating film. The stabilizing plate is opposed to the drain region sandwiching an insulating film for a plate and forms, together with the drain region, a capacitance and is made of a conductor or a semiconductor. A plurality of cells, each of which includes the insulating gate type field effect transistor portion, is arranged side by side and the stabilizing plate is arranged in the terminal portion of the arranged plurality of cells.

In accordance with the semiconductor device according to still another aspect of the present invention, the change in potential that has occurred in the drain of an insulating gate type field effect transistor portion within a cell is restricted from having effects outside the cell so that the withstanding capacity can be increased.

In the above described still other aspect, a plurality of stabilizing plates is arranged in the terminal portion of the arranged plurality of cells.

Thereby, the oscillation suppression effects are further enhanced.

BEST MODE FOR CARRYING OUT THE INVENTION

In the following, the embodiments of the present invention are described in reference to the drawings.

(Embodiment 1)

Figure 1:
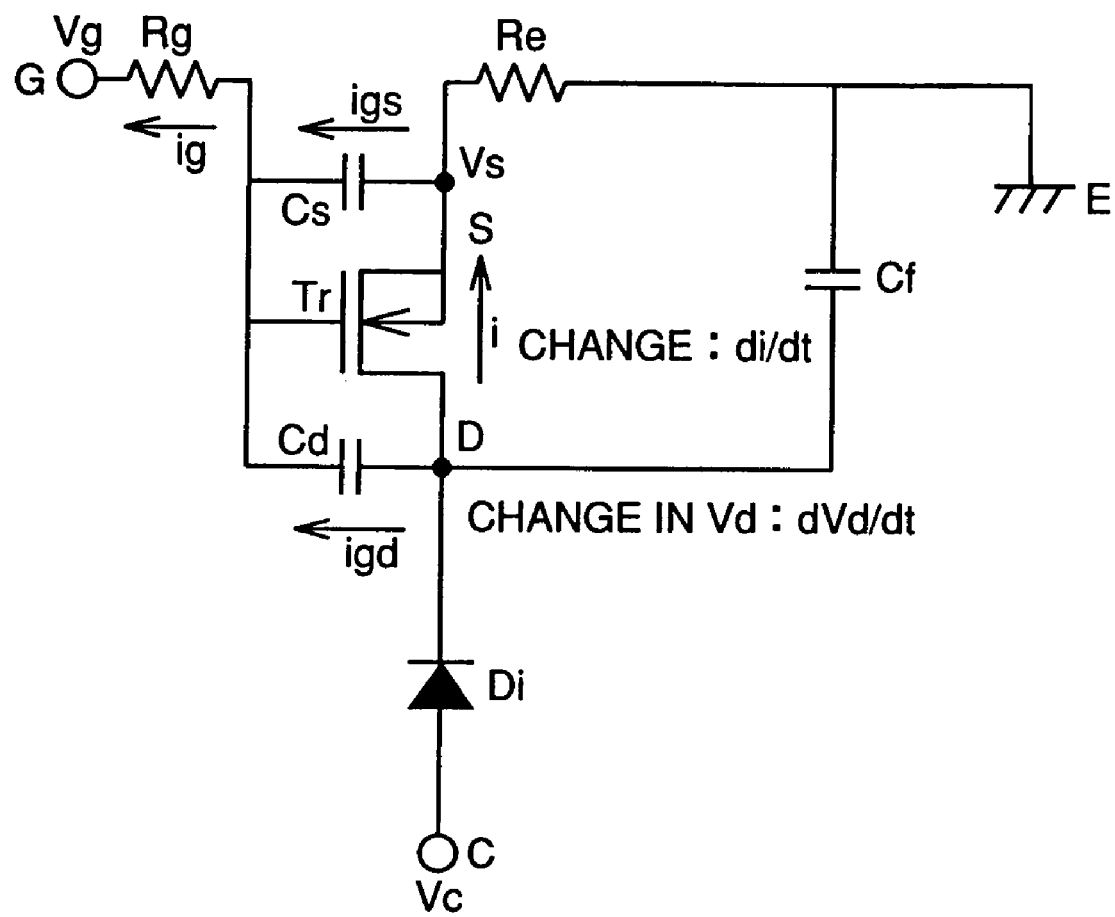
FIG. 1 is a circuit diagram schematically showing the configuration of a semiconductor device according to Embodiment 1 of the present invention.
Figure 2:
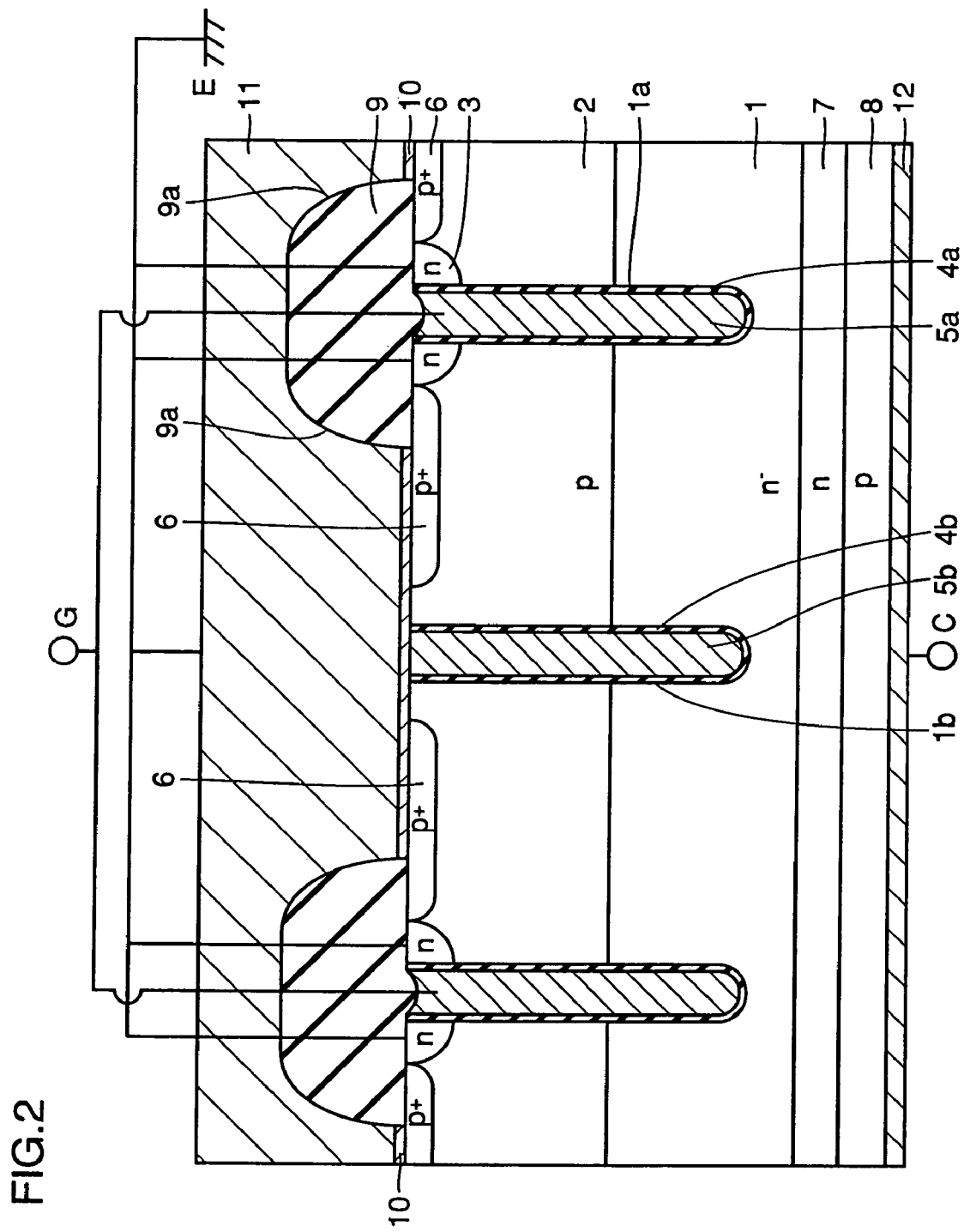
FIG. 2 is a cross sectional view schematically showing the configuration of the semiconductor device according to Embodiment 1 of the present invention.

FIGS. 1 and 2 are a circuit diagram and a schematic cross sectional view showing the configuration of a semiconductor device according to Embodiment 1 of the present invention.

Referring primarily to FIG. 2, the semiconductor device of the present embodiment is a trench gate type IGBT formed in a semiconductor substrate having a thickness of, for example, 100 μm to 200 μm. An n⁻ silicon substrate 1 has a concentration of, for example, approximately $1 \times 10^{14}$ cm⁻³. A p-type body region 2 made of a p-type semiconductor, of which the concentration is, for example, approximately $1 \times 10^{16}$ cm⁻³ to $1 \times 10^{18}$ cm⁻³ and of which the depth from the first main surface is approximately 3 μm, is formed on the first main surface side of the above n⁻ silicon substrate 1. An n-type emitter region 3 made of an n-type semiconductor, of which the concentration is, for example, $1 \times 10^{19}$ cm⁻³, or higher, and of which the depth from the first main surface is approximately 0.5 μm, is formed in the first main surface within p-type body region 2. A p⁺ impurity diffusion region 6 for forming a low resistance contact with p-type body region 2 is formed, in the first main surface, having a concentration of, for example, approximately $1 \times 10^{20}$ cm⁻³ so as to adjoin the above n-type emitter region 3.

A trench 1a for a gate that penetrates n-type emitter region 3 and p-type body region 2 and that reaches to n⁻ silicon substrate 1 is created in the first main surface. This trench 1a for a gate has the depth of, for example, 3 μm to 10 μm from the first main surface and the pitch of trench 101a for a gate is, for example, 2.0 μm to 6.0 μm. A gate insulating film 4a made of a silicon oxide film, of which the thickness is, for example, 30 nm to 200 nm, is formed on the inner surface of the above trench 1a for a gate. A gate electrode 5a made of a polycrystal silicon, into which phosphorous, for example, is introduced so as to have a high concentration, is formed so as to fill in trench 1a for a gate. Gate electrode 5a is electrically connected to a control electrode that provides a gate potential G.

Thus, a gate trench is formed of trench 1a for a gate, gate insulating film 4a and gate electrode 5a. In addition, an insulating gate type field effect transistor portion (here MOS transistor portion) having n⁻ silicon substrate 1 as a drain and n-type emitter region 3 as a source is formed of n⁻ silicon substrate 1, n-type emitter region 3 and the gate trench.

A plurality of MOS transistor portions are arranged in the first main surface and an emitter trench is formed between two MOS transistor portions. This emitter trench has a trench 1b for an emitter, an insulating film 4b for an emitter and a conductive layer 5b for an emitter. Trench 1b for an emitter is created so as to penetrate p-type body region 2 and so as to reach to n⁻ silicon substrate 1 and has a depth of, for example, 3 μm to 10 μm from the first main surface. Insulating film 4b for an emitter made of a silicon oxide film having a thickness of, for example, 30 nm to 200 nm is formed along the inner surface of this trench 1b for an emitter. Conductive layer 5b for an emitter that is made of a polycrystal silicon into which phosphorous is, for example, introduced so as to have a high concentration, and that becomes a stabilizing plate is formed so as to fill in trench 1b for an emitter.

An interlayer insulating film 9 is formed in the first main surface and a hole 9a that reaches to the first main surface is provided in this interlayer insulating film 9. A barrier metal layer 10 is formed at the bottom of this hole 9a. An emitter electrode 11 that provides an emitter potential E is electrically connected to a stabilizing plate 5b, a p+ impurity diffusion region 6 and an n-type emitter region 3 via the above barrier metal layer 10.

In addition, an n-type buffer region 7 and a p-type collector region 8 are formed in this order on the second main surface side of n− silicon substrate 1. A collector electrode 12 that provides a collector potential C is electrically connected to this p-type collector region 8. The material of this collector electrode 12 is, for example, an aluminum compound.

Referring primarily to FIG. 1, the configuration of the IGBT shown in FIG. 2 is formed of a MOS transistor Tr and a diode Di. In addition, a capacitor Cd on the drain side is formed between gate electrode 5a and n− silicon substrate 1 while a capacitor Cs on the source side is formed between gate electrode 5a n-type emitter region 3. In addition, a stabilizing plate capacitor Cf is formed between stabilizing plate 5b and n silicon substrate 1. Then, in the present embodiment, this stabilizing plate capacitor Cf is formed so as to have a greater capacitance than capacitor Cd on the drain side.

In the semiconductor device of the present embodiment, at the time of inverter connection, for example, the gate potential G of the control electrode is a control signal in a pulse form set at −15V in the off condition and at +15V in the on condition in reference to the emitter potential while the collector potential C of collector electrode 12 is set at a voltage approximately between the power supply voltage and the saturation voltage according to gate potential G.

Here, in the case that the distance between trench 1a for a gate and trench 1b for an emitter is denoted as dx and the pitch of trench 1a for a gate is denoted as Pi, there is no limitation of Pi/dx.

The present inventors examined waveforms at the time of short circuiting in each of the semiconductor devices of the prior art and of the present embodiment.

Figure 54:
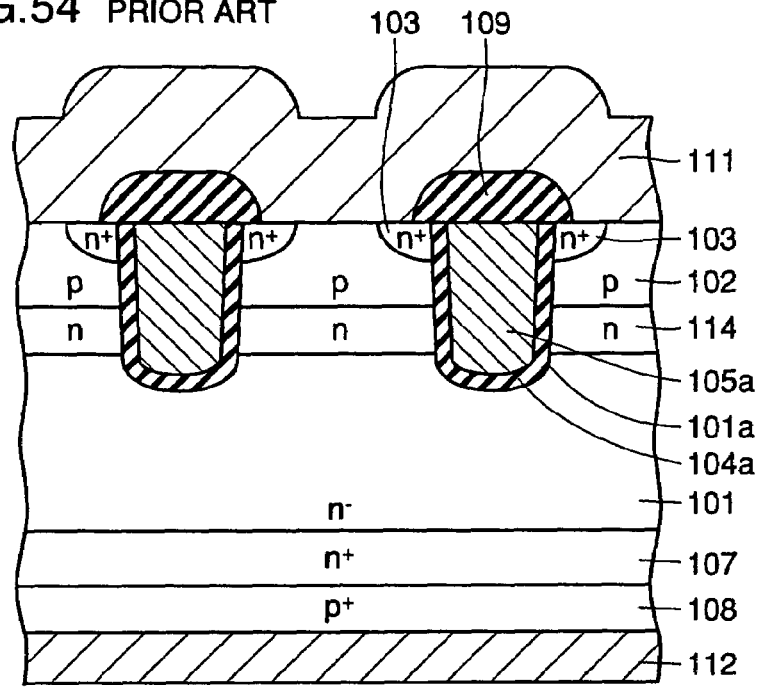
FIG. 54 is a cross sectional view schematically showing the configuration of the semiconductor device disclosed in U.S. Pat. No. 6,040,599.
Figure 55:
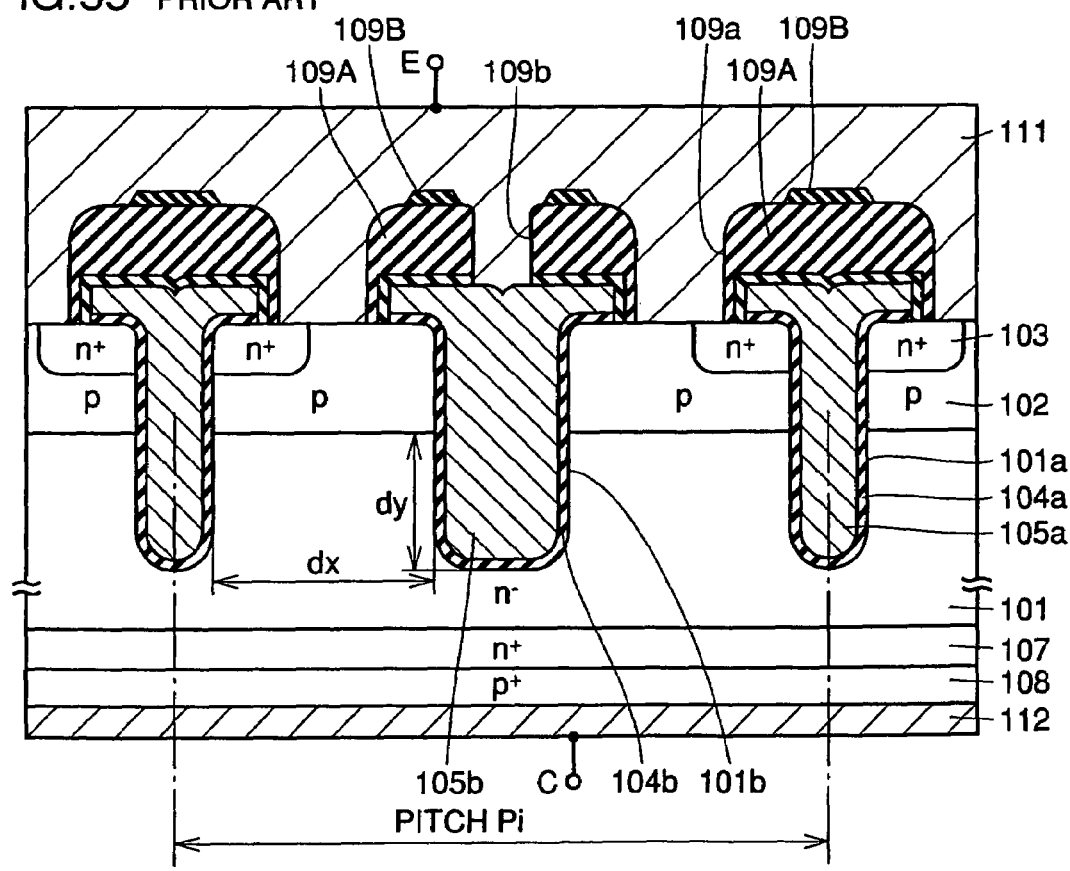
FIG. 55 is a cross sectional view schematically showing the configuration of the semiconductor device disclosed in Japanese Patent Laying-Open No. 9-331063.
Figure 56:
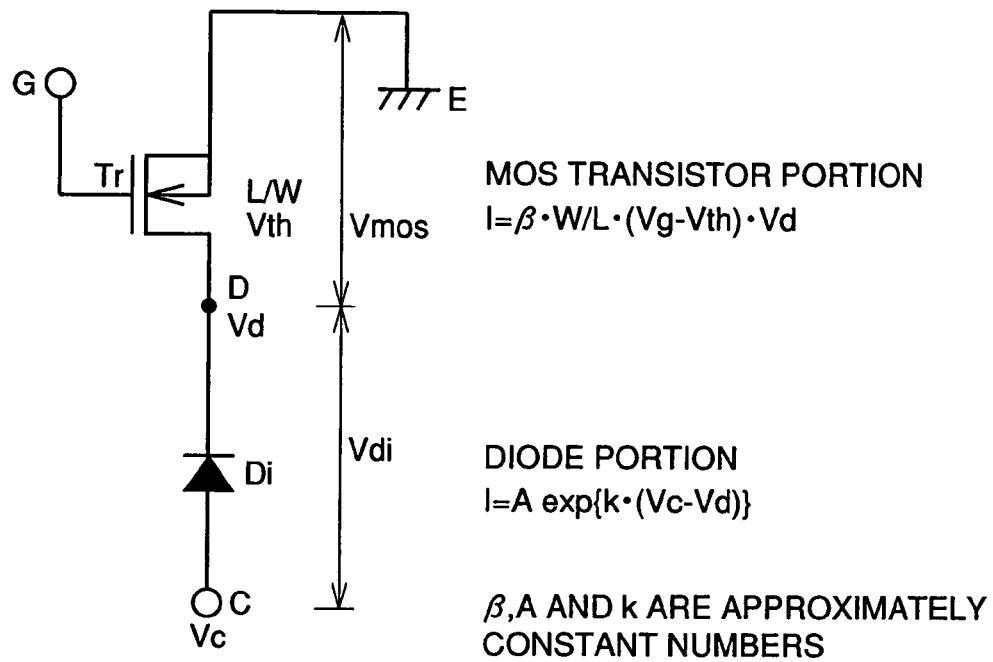
FIG. 56 is a diagram for describing voltages applied to the transistor portion and to the diode portion, respectively, of an IGBT.

As for the prior art, the semiconductor device described in U.S. Pat. No. 6,040,599 shown in FIG. 54 is used, in addition, the power supply voltage is set at 400V and a single pulse signal in the range of from −15V to +14V, of which the on pulse width is 10 μsec, is given to the gate in order to carry out the measurement. The result thereof is shown in FIGS. 3A to 3D and in FIG. 4.

Here, in FIGS. 3A to 3D, Ig, Vg, Vce or Ic is shown along the longitudinal axis while time is shown along the lateral axis. In addition, FIG. 4 shows an enlarge portion of FIGS. 3A to 3D, wherein Vce or Ic is shown along the longitudinal axis and time is shown along the lateral axis.

Figure 3A:
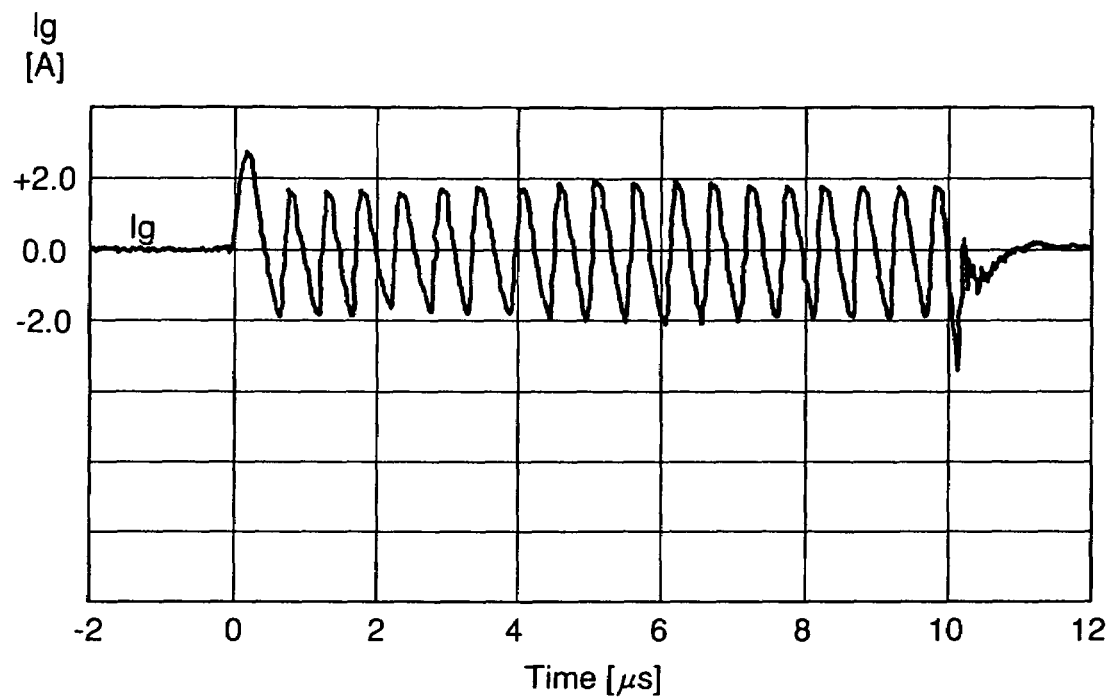
FIGS. 3A, 3B, 3C and 3D are diagrams showing the appearance of the occurrence of oscillation according to a prior art.
Figure 3B:
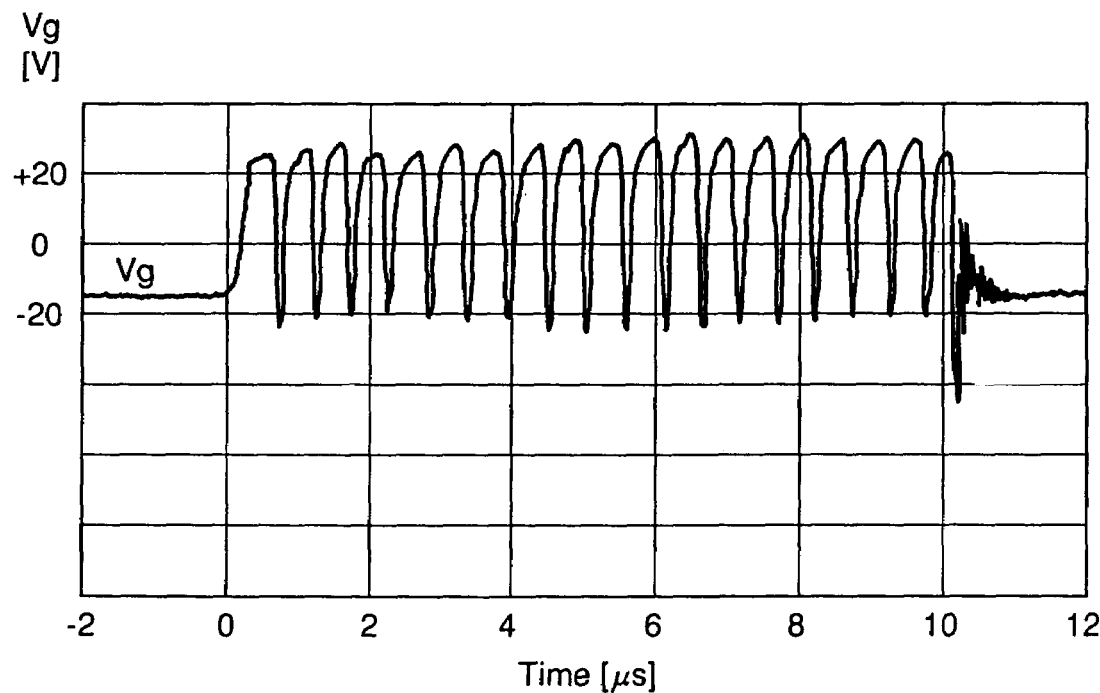
Figure 3C:
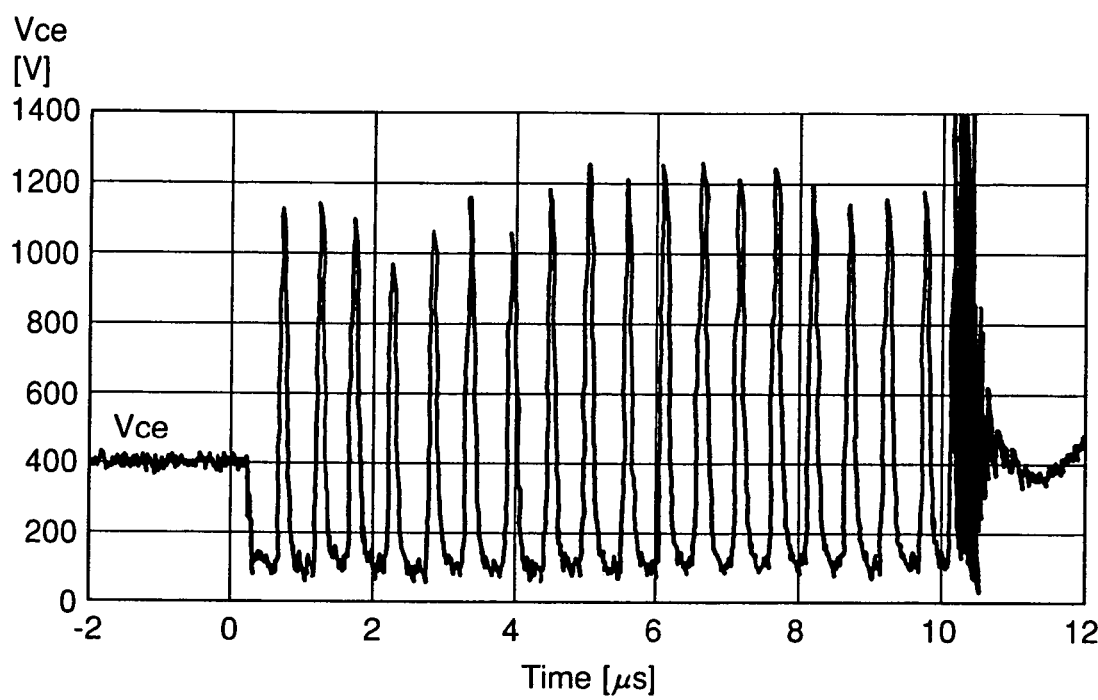
Figure 3D:
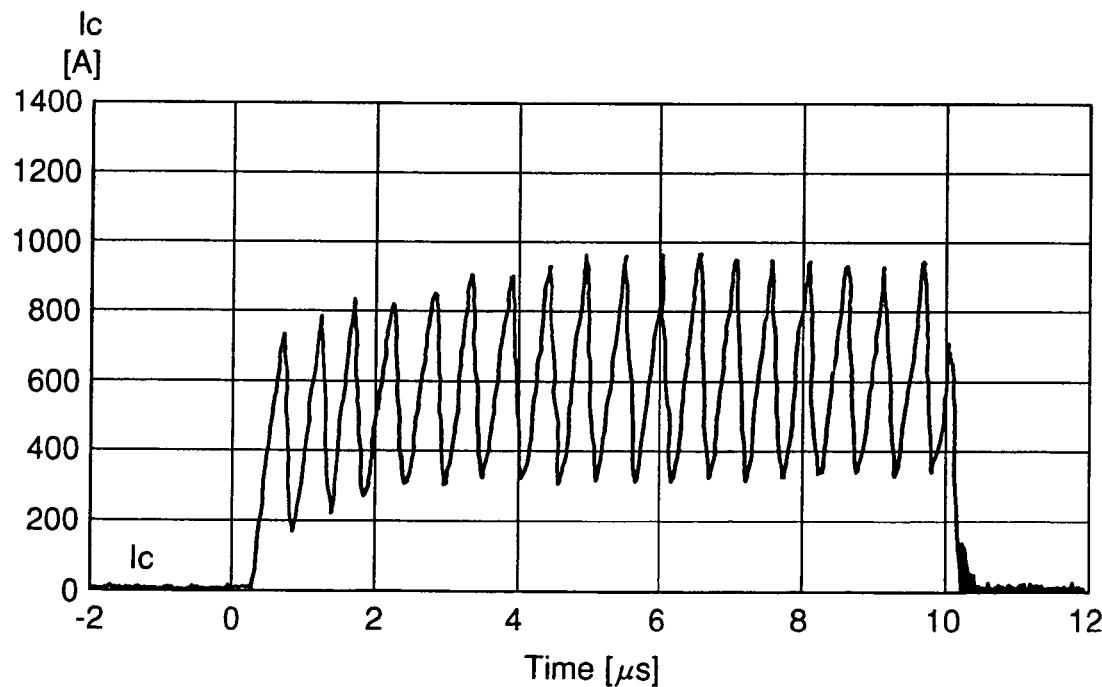
Figure 4:
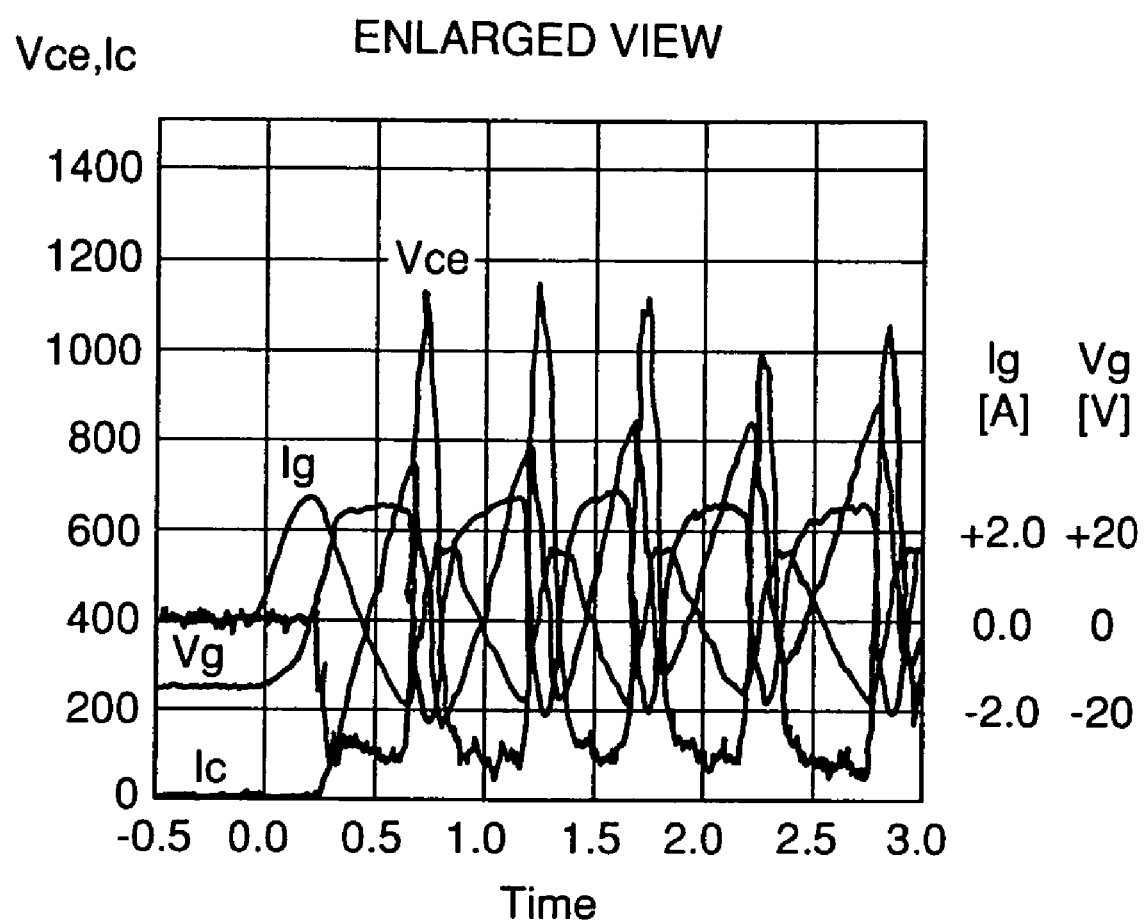
FIG. 4 is an enlarged diagram of portions of FIGS. 3A, 3B, 3C and 3D.
Figure 5A:
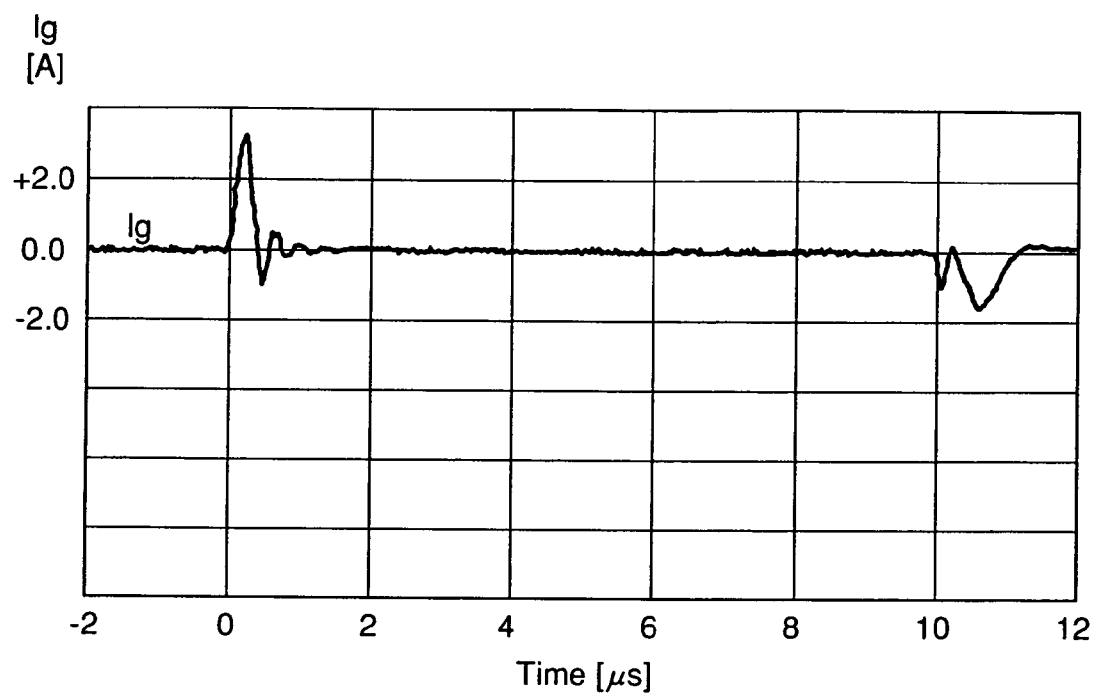
FIGS. 5A, 5B, 5C and 5D are diagrams showing the suppression of oscillation in the semiconductor device according to Embodiment 1 of the present invention.
Figure 5B:
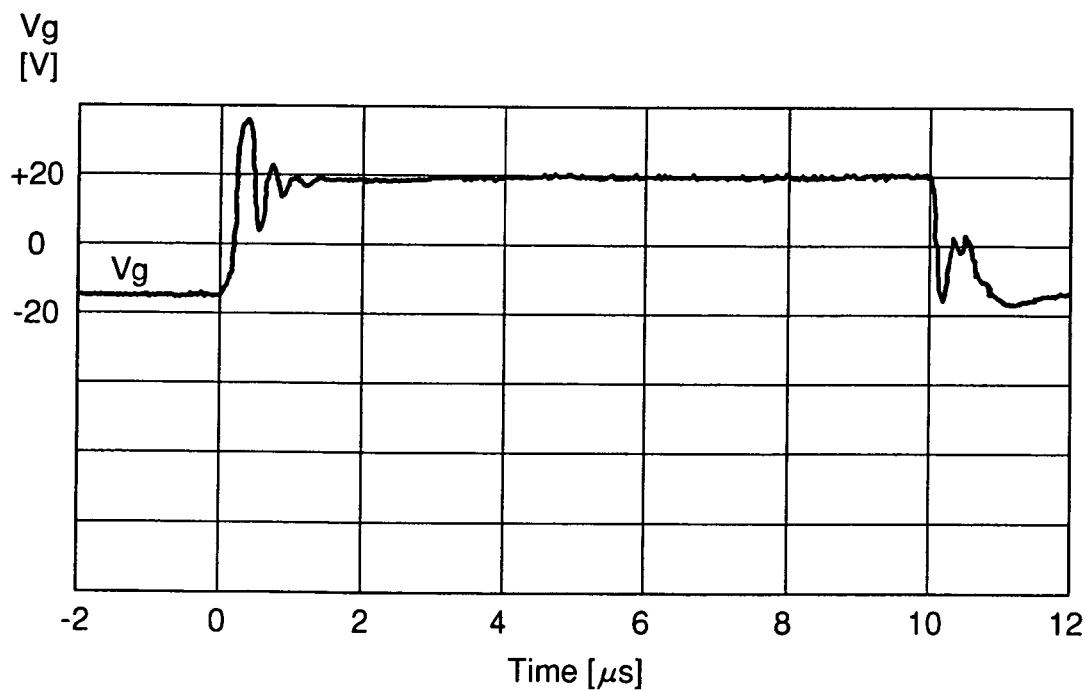
Figure 5C:
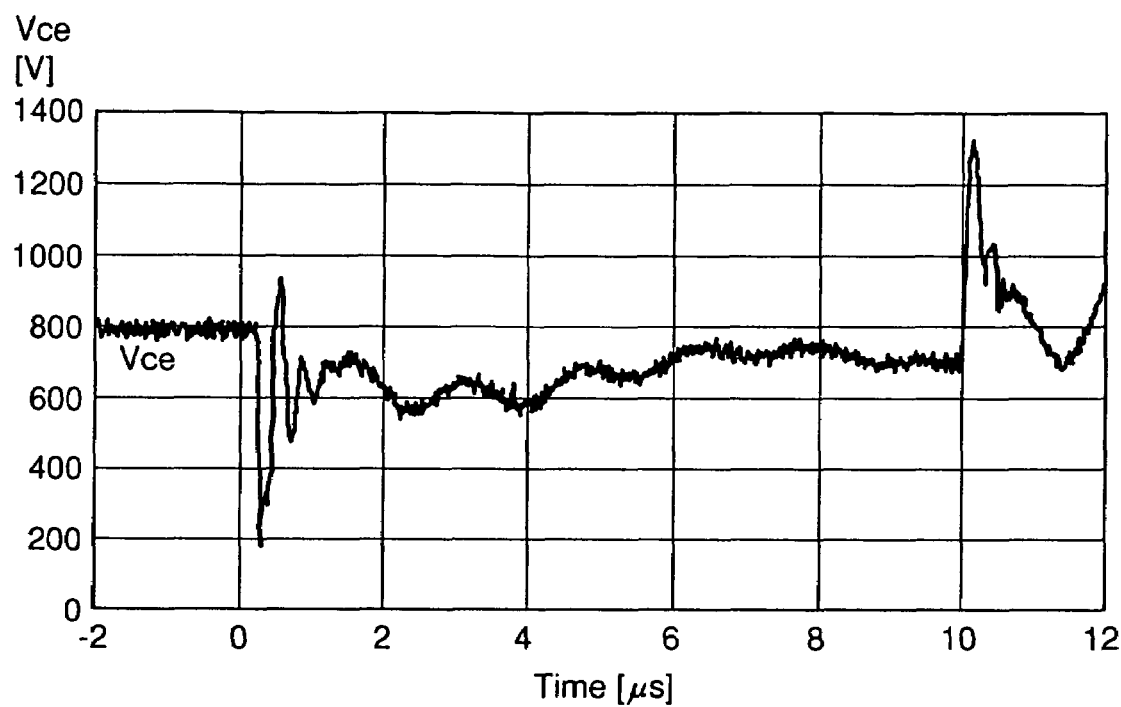
Figure 5D:
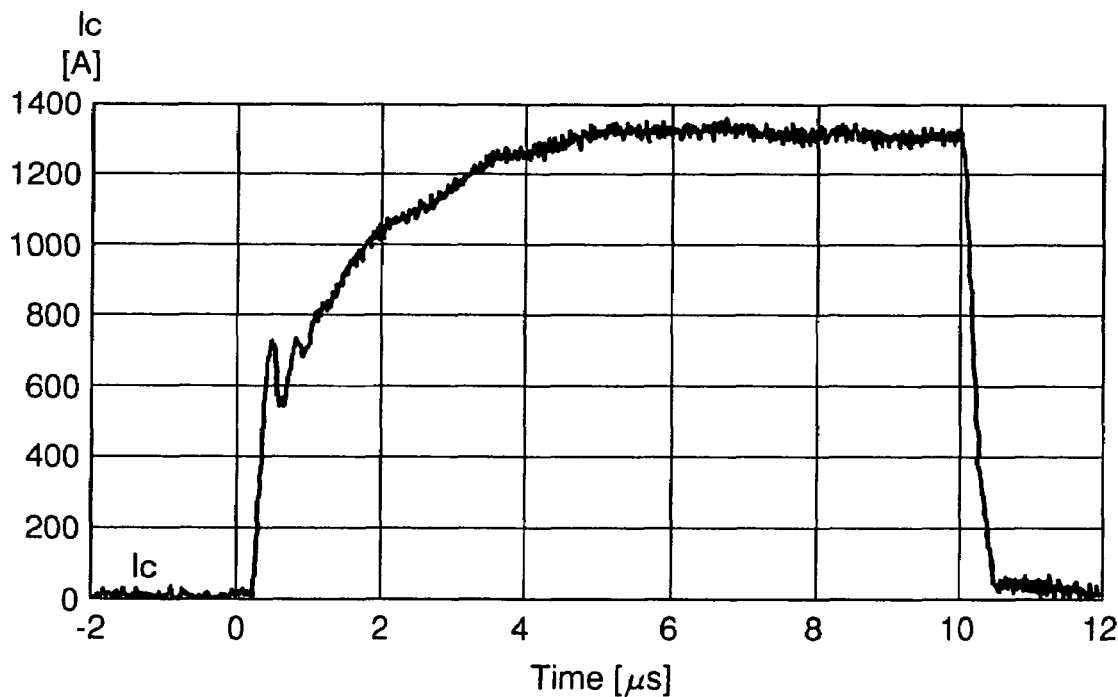

In reference to FIGS. 3A and 3D and to FIG. 4, after an on pulse is inputted to the gate, a maximum of −2 A of a negative gate current flows from 0.4 μsec to 0.7 μsec in the structure shown in FIG. 54. Thereby, the gate voltage Vg drops to approximately −10V 0.75 μsec thereafter and the channel, which is once turned on, closes again and, thereby, it is found the gate is again turned on. In this structure excessive negative feedback is applied causing oscillation and it is found that the oscillation does not attenuate but, rather, continues.

In addition, in the structure of the present embodiment shown in FIG. 2, the power supply voltage is set at 800V and a single pulse signal in the range of from −15V to +19V, of which the on pulse width is 10 μsec, is given to the gate. Then, the waveforms at the time of short circuiting are shown in FIGS. 5A to 5D and in FIG. 6.

Figure 6:
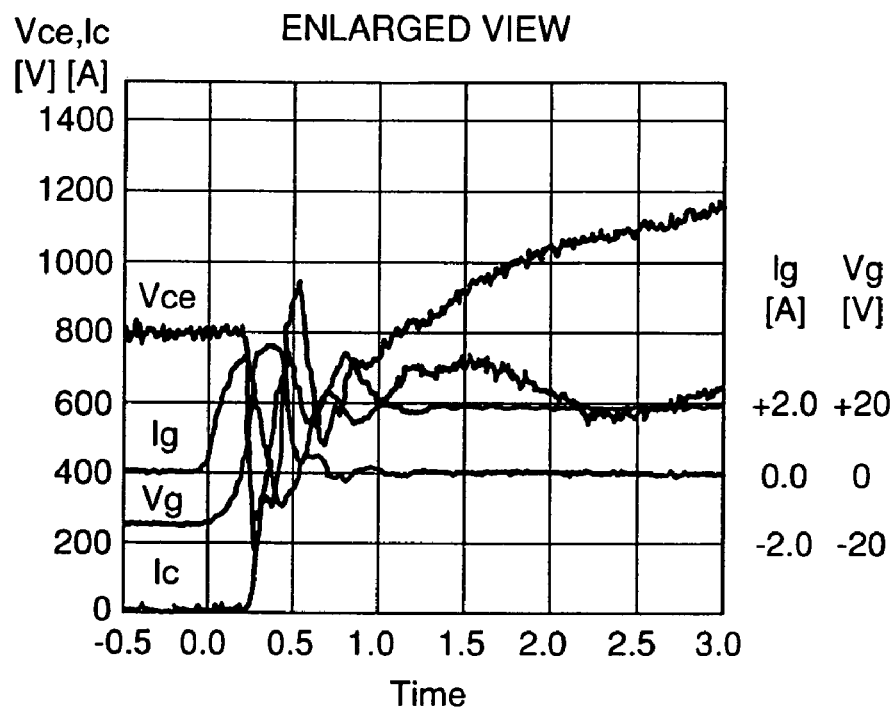
FIG. 6 is an enlarged diagram of portions of FIGS. 5A, 5B, 5C and 5D.

Here, in FIGS. 5A to 5D, Ig, Vg, Vce or Ic is shown along the longitudinal axis and time is shown along the lateral axis. FIG. 6 is a diagram showing enlarged portions of FIGS. 5A to 5D, wherein Vce or Ic is shown along the longitudinal axis while time is shown along the lateral axis.

In reference to FIGS. 5A to 5D and to FIG. 6, after an on pulse is inputted to the gate, a maximum of −1 A of a negative gate current Ig flows from 0.4 μsec to 0.55 μsec in the structure shown in FIG. 2. Thereby, gate voltage Vg momentarily drops to approximately 0V 0.55 μsec thereafter causing oscillation while it is found that the next oscillation is almost controlled. In the structure of FIG. 2, excessive negative feedback is applied causing a temporary oscillation and since the coefficient k of the feedback is in the range of −1<k<0, which a value close to 0.1, the oscillation suddenly attenuates. Thus, the oscillation is suppressed according to the structure of the present embodiment at the power supply voltage of 800V, or less, and when the range of the gate voltage at the on time is 19V, or less.

The reason why the oscillation can be suppressed at the time of short circuiting in the configuration of the present embodiment is described in the following.

In reference to FIG. 1, in the short circuited condition, the off condition is switched to the on condition while the power supply voltage is applied in the present embodiment. Then, the charge Qd that occurs in the vicinity of the drain is distributed to the capacitor Cd on the drain side and to the stabilizing plate capacitor Cf since stabilizing plate 5b is provided. Therefore, dVd has a dimension of Cd/(Cd+Cf) in comparison with the case wherein there is no stabilizing plate 5b. Accordingly, in the case that stabilizing plate capacitor Cf has a large value in comparison to capacitor Cd on the drain side, such as in the present embodiment, dVd becomes small and the amount of gate current Ig that flows in becomes small even when Cd becomes large and the lowering of Vg is reduced. Accordingly, the feedback becomes small and oscillation is suppressed.

In addition, the present inventors examined the relationships between the collector current and the collector voltage in each of the semiconductor devices of the prior art and of the present embodiment. The result thereof is shown in FIG. 7.

Figure 7:
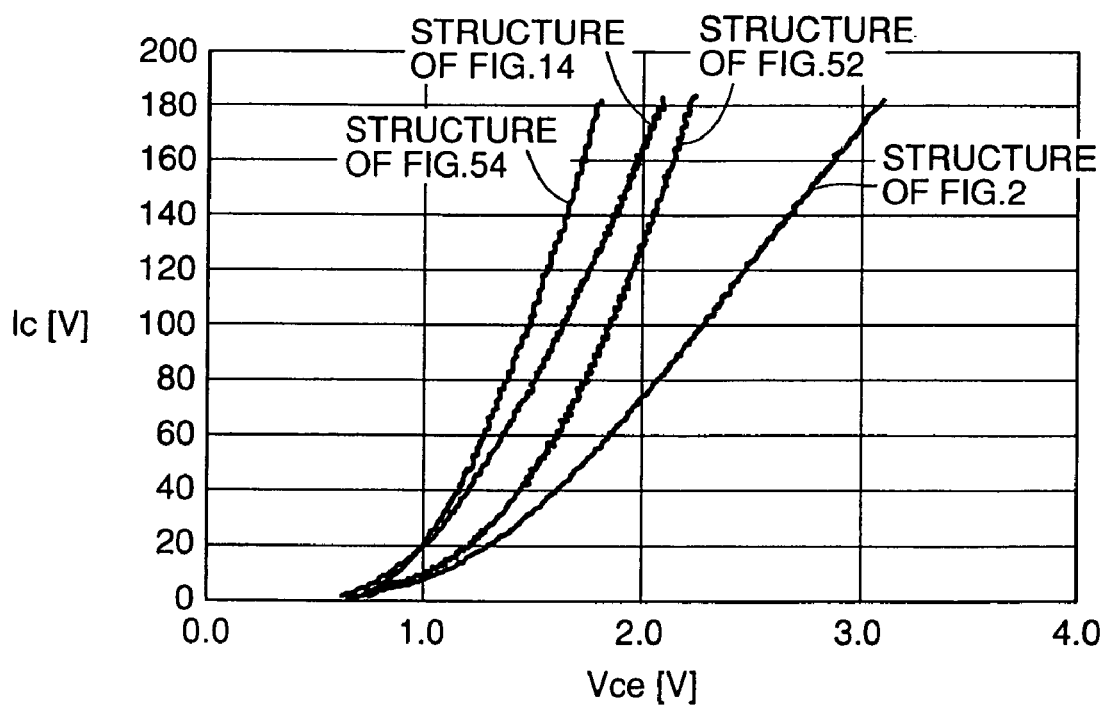
FIG. 7 is a diagram showing the relationship between Ic and Vce.
Figure 52:
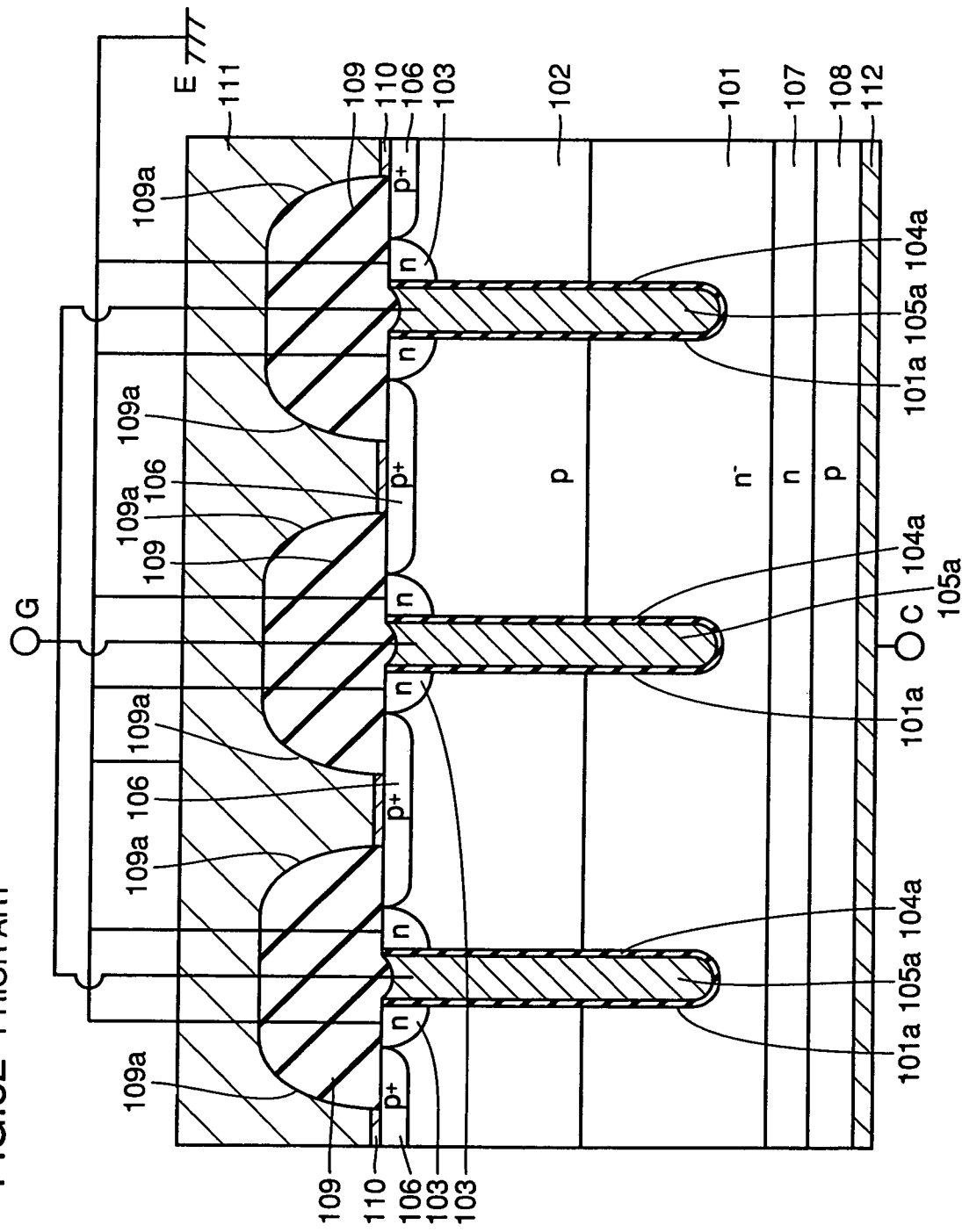
FIG. 52 is a cross sectional view schematically showing the configuration of a semiconductor device according to a prior art.
Figure 53:
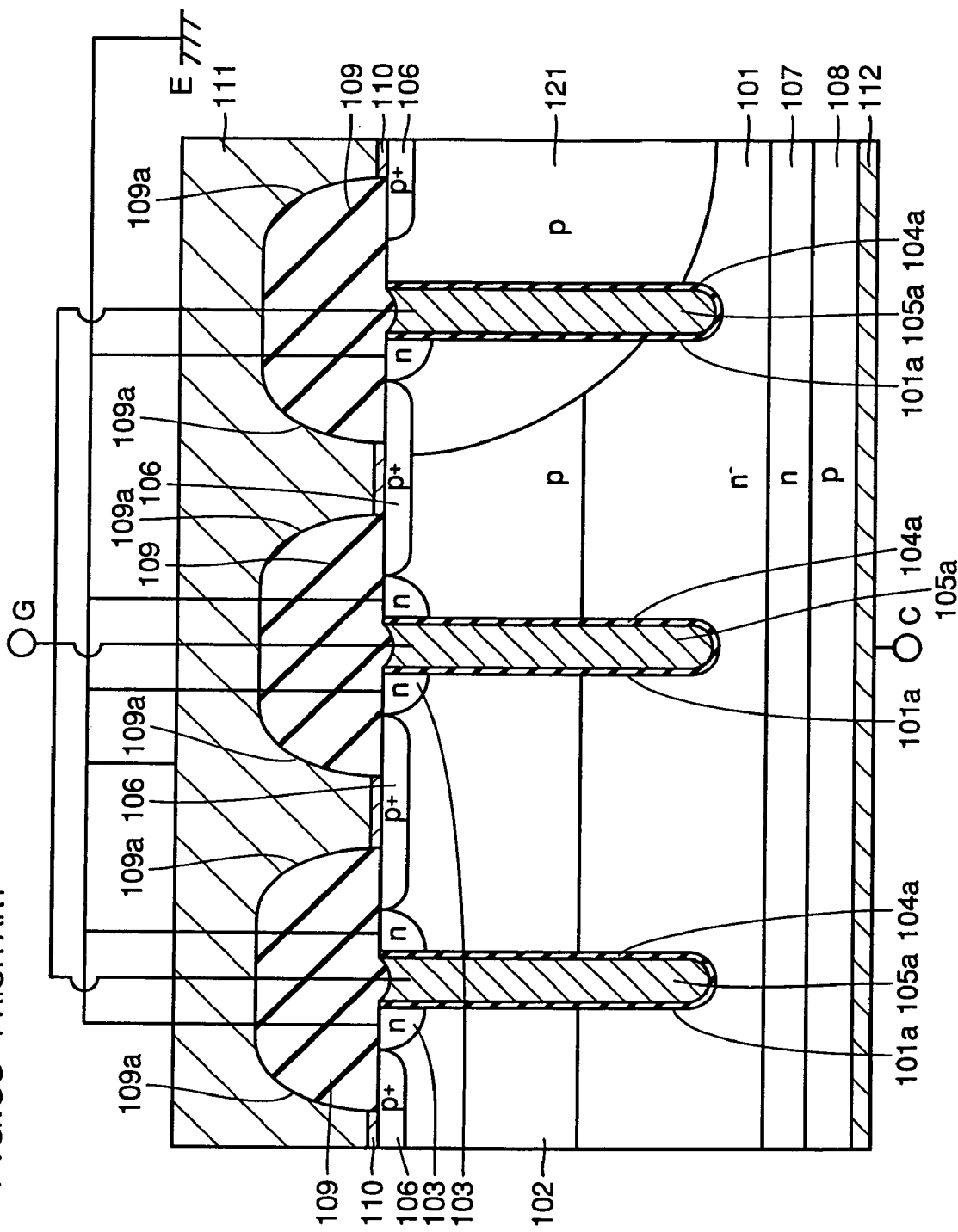
FIG. 53 is a schematic cross sectional view showing the terminal structure of the semiconductor device according to the prior art.

From the results of FIG. 7, in the semiconductor device of the present embodiment it is found that the collector current at the time when the collector voltage is fixed can be made small in comparison to the conventional semiconductor devices shown in FIGS. 52 and 54.

As described above, the present embodiment is formed so that stabilizing plate capacitor Cf has a capacitance greater than that of capacitor Cd on the drain side and, thereby, oscillation at the time of short circuiting can be suppressed.

In addition, the potential within the semiconductor substrate is fixed at an approximately constant potential via the capacitor of stabilizing plate 5b, which also has the effect of suppressing oscillation.

In addition, it is also important for oscillation suppression that MOS transistor portions be formed on both sides of the gate trench so as to reduce the capacitance of capacitor C on the drain side.

In addition, in the case that a lack of uniformity occurs in a portion within a chip so that dVd/dt is locally caused, the potential is fixed via the capacitance of stabilizing plate 5b and, therefore, effects to the periphery can be suppressed.

In addition, the density of the MOS transistors can be reduced by providing stabilizing plate 5b. Thereby, a switching time delay due to increase in the gate capacitance can be prevented and a gate driving circuit of a large capacitance can be made unnecessary.

In addition, since the density of the MOS transistors can be reduced, the saturation current can be made small and the withstanding capacity against short circuiting can be increased. In addition, it is not necessary to have a configuration wherein stabilizing plate 5b is filled in into a trench of a broad width and, thereby, deterioration in productivity with respect to the etching back at the time when such a configuration having a broad width is formed can be avoided.

Here, though in the present embodiment an IGBT of a trench gate structure is described, the invention can be applied to a switching element having an insulating gate type field effect transistor portion, such as a thyristor of a MOS gate structure or a MOS transistor, and the same effects can, of course, be expected.

In addition, the present invention can gain the same effects regardless of the structure that the collector structure takes.

Figure 8:
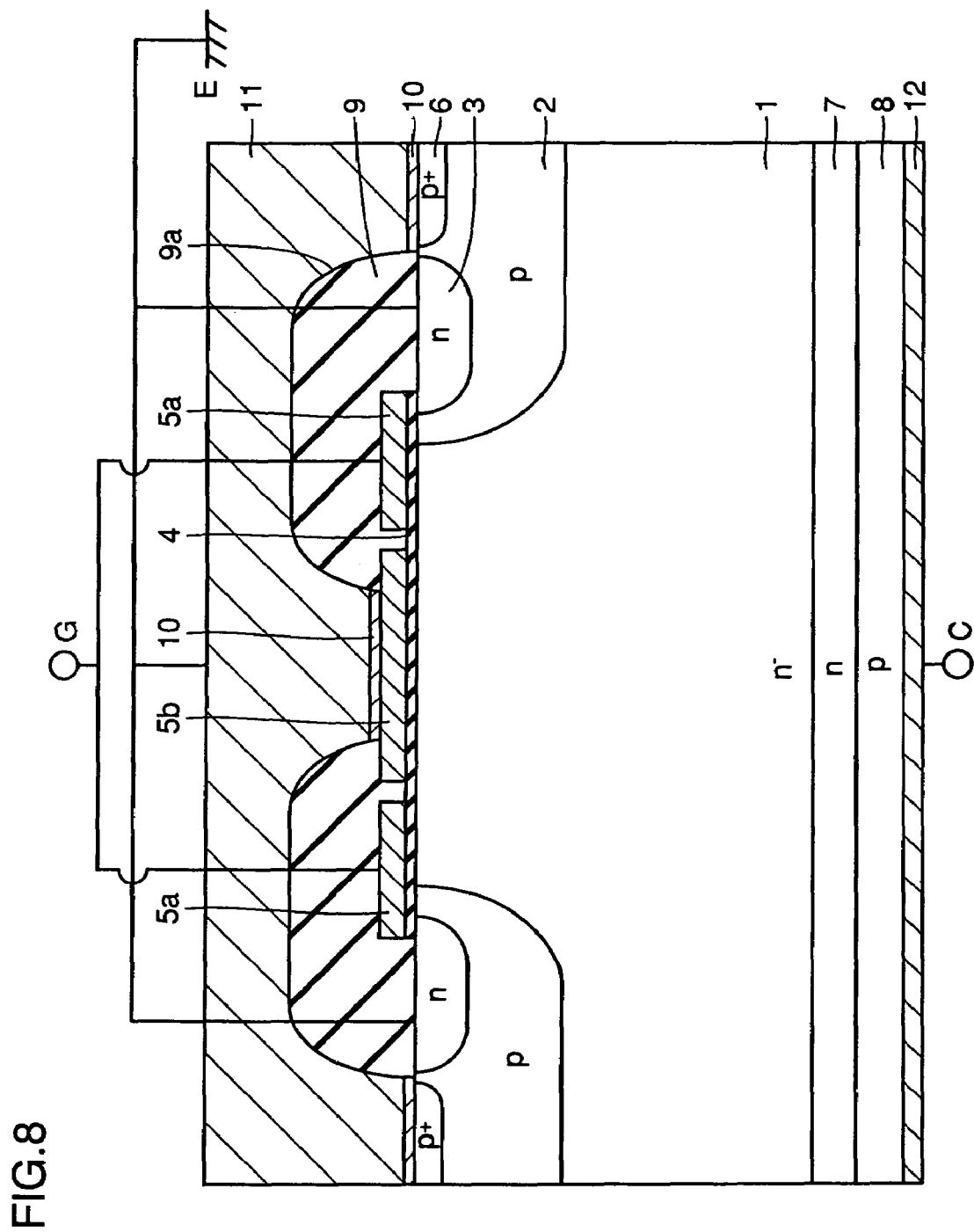
FIG. 8 is a cross sectional view schematically showing the configuration of a semiconductor device according to Embodiment 2 of the present invention.

Furthermore, the same effects can, of course, be gained when the present invention is applied to a plane gate-type switching element, such as a plane gate-type IGBT as shown in FIG. 8.

In addition, it is obvious that the same effects are gained when a trench-type stabilizing plate 5b is used in order to raise the area efficiency in the plane gate-type element shown in FIG. 8.

In addition, there is a phenomenon in a plane gate-type element wherein current is restricted from flowing through a current path in the vicinity of stabilizing plate 5b at the on time due to the existence of stabilizing plate 5b. Measures such as expanding the distance between gate 5a and stabilizing plate 5b or enhancing the n-type impurity concentration in the region of n⁻ silicon substrate 1 opposed to stabilizing plate 5b can easily be proposed in order to control the above.

In addition, the invention is similarly effective in an element, wherein the conductive types are reversed.

Furthermore, though in the present embodiment an example wherein stabilizing plate 5b is connected to emitter electrode 11 is described, stabilizing plate 5b may be an electrode having a constant potential rather than emitter potential E or having a variable potential in the direction so as to cancel the negative feedback.

In addition, by enhancing the n-type impurity concentration in the sidewall of stabilizing plate 5b on the n⁻ silicon substrate 1 side, the effects can be gained wherein the capacitance of stabilizing plate capacitor Cf is increased leading to an increase in the oscillation suppression characteristics.

In addition, the greater the capacitance of stabilizing plate capacitor Cf is in comparison with that of capacitor Cd on the drain side, the more it effects the potential stabilization. Therefore, by using any of the structures shown in FIGS. 9 to 17, or a combination thereof, the capacitance of the stabilizing plate capacitor Cf is increased and, thereby, the oscillation suppression effects can be further enhanced.

Figure 18:
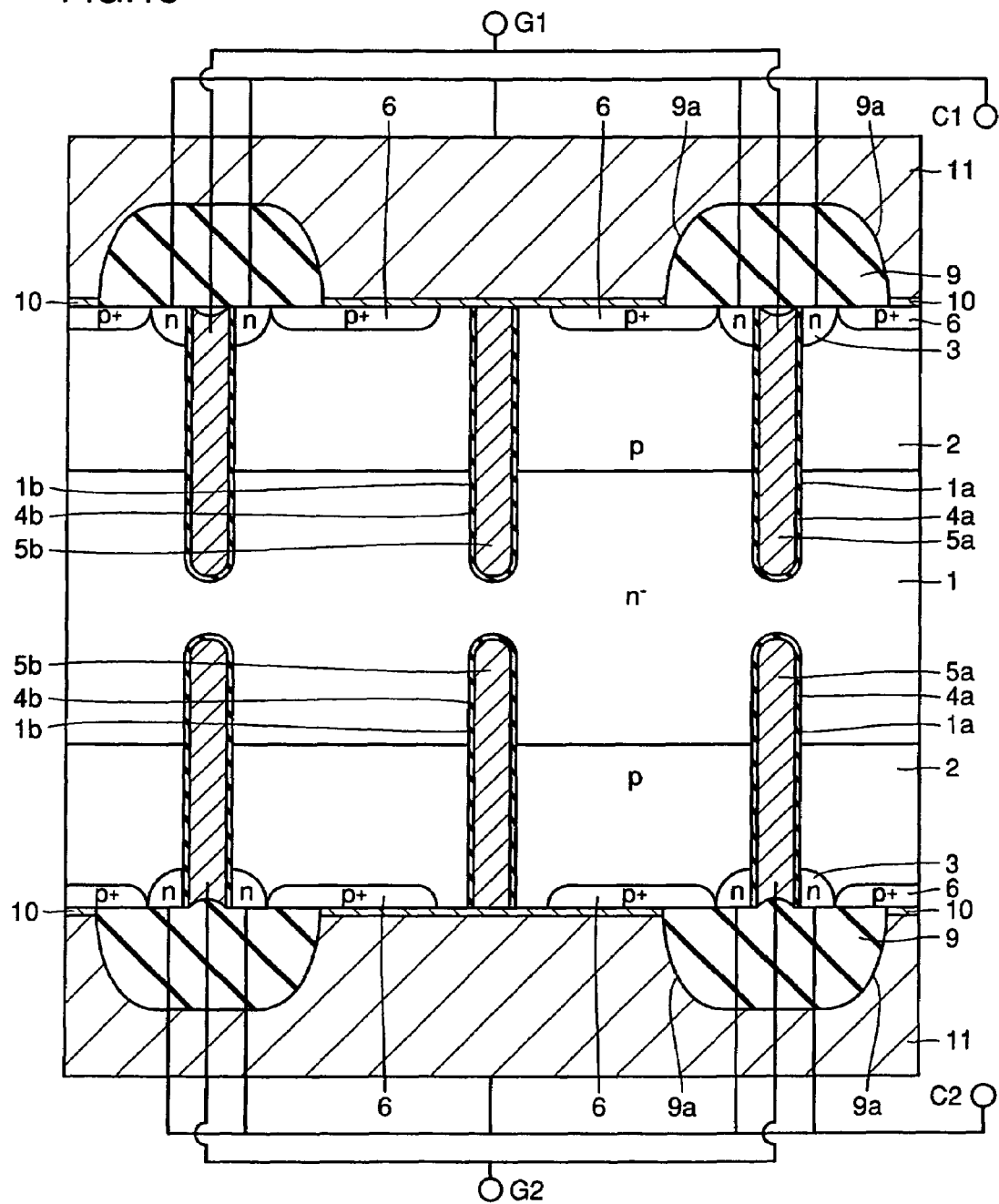
FIG. 18 is a cross sectional view schematically showing the configuration of a semiconductor device according to Embodiment 8 of the present invention.

In addition, the structure of the present invention is effective in an element wherein the insulating gate type field effect transistor structures are provided in both the first main surface and in the second main surface of the semiconductor substrate, as shown in FIG. 18, or in an element wherein the collector and the emitter are both formed in the first main surface.

Figure 19:
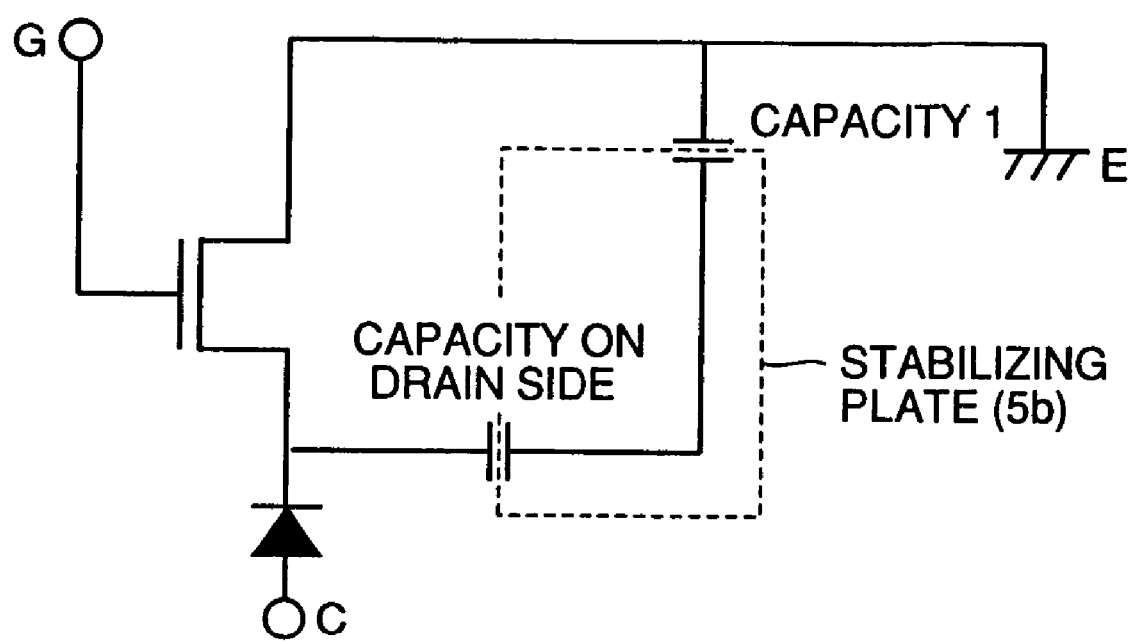
FIG. 19 is a circuit diagram showing the appearance wherein a stabilizing plate is in a floating condition.

In addition, as shown in the equivalent circuit of FIG. 19, instead of setting the stabilizing plate directly at a constant potential, the stabilizing plate is allowed to have a floating potential by forming, together with n⁻ silicon substrate 1, a capacitor and by forming, together with the emitter potential, a capacitor so that stabilization of the potential is achieved because of the combination of the capacitances.

In the following, the above applied examples are described.

(Embodiment 2)

FIG. 8 is a cross sectional view schematically showing the configuration of a semiconductor device according to Embodiment 2 of the present invention. In reference to FIG. 8, the semiconductor device of the present embodiment is a plane gate-type IGBT that is formed in a semiconductor substrate of which the thickness is, for example, approximately 100 μm to 200 μm. A p-type body region 2 made of a p-type semiconductor is selectively formed on the first main surface side of an n⁻ silicon substrate 1 having a concentration of, for example, approximately $1 \times 10^{14}$ cm⁻³. p-type body region 2 has a concentration of, for example, approximately $1 \times 10^{16}$ cm⁻³ to $1 \times 10^{18}$ cm⁻³ and has a depth of approximately 3 μm from the first main surface. An n-type emitter region 3 made of an n-type semiconductor having a concentration of, for example, $1 \times 10^{19}$ cm⁻³, or greater, of which the depth from the first main surface is approximately 0.5 μm is formed in the first main surface within p-type body region 2. A p⁺ impurity diffusion region 6 for forming a low resistance contact with p-type body region 2 is formed adjoining this n-type emitter region 3 having a high concentration of, for example, approximately $1 \times 10^{20}$ cm⁻³.

A gate electrode 5a is formed on the first main surface via a gate insulating film 4 so as to be opposed to p-type body region 2, which is sandwiched between n⁻ silicon substrate 1 and n-type emitter region 3.

Thus, n⁻ silicon substrate 1, n-type emitter region 3 and gate electrode 5a form an insulating gate type field effect transistor portion (here MOS transistor portion) having n⁻ silicon substrate 1 as the drain and having n-type emitter region as the source.

A conductive layer 5b for an emitter that becomes a stabilizing plate is formed, via insulating film 4, on the first main surface, which is sandwiched between two MOS transistor portions. A polycrystal silicon to which phosphorus, for example, is introduced so as to have a high concentration, a high melt point metal material, a high melt point metal silicide, or a film compounded of these, is used for the material of the above stabilizing plate 5b and gate electrode 5a.

An interlayer insulating film 9 is formed on the first main surface and a hole 9a that reaches to a portion of the surface of the first main surface is created in this interlayer insulating film 9. A barrier metal layer 10 is formed at the bottom of this hole 9a. An emitter electrode 11 is electrically connected, via this barrier metal layer 10, to stabilizing plate 5b, p⁺ impurity diffusion region 6 and n-type emitter region 3 so as to provide emitter potential E.

In addition, an n-type buffer region 7 and a p-type collector region 8 are sequentially formed on the second main surface side of n⁻ silicon substrate 1. A collector electrode 12 that provides collector potential C is electrically connected to p-type collector region 8. The material of this collector electrode 12 is, for example, an aluminum compound.

Here, in the present embodiment, the electrode on the source side and the electrode on the drain side are both formed on the first main surface side.

In the present embodiment, also, stabilizing plate capacitor Cf formed between stabilizing plate 5b and n⁻ silicon substrate 1 is formed so as to have a capacitance greater than that of capacitor Cd on the drain side formed between gate electrode 5a and n⁻ silicon substrate 1.

In the semiconductor device of the present embodiment, at the time of inverter connection, for example, a control signal in a pulse form, which is set at −15V in the off condition and is set at +15V in the on condition, is applied to gate potential G of a control electrode in reference to emitter potential E while collector potential C of a collector electrode 12 is set at a voltage approximately between the power supply voltage and the saturation voltage according to gate potential G.

In the present embodiment, also, since stabilizing plate capacitor Cf is set to have a greater capacitance than capacitor Cd on the drain side, oscillation at the time of short circuiting can be suppressed in the same manner as in Embodiment 1.

In addition, the same effects as in Embodiment 1 can be gained with respect to effects other than the above.

(Embodiment 3)

Figure 9:
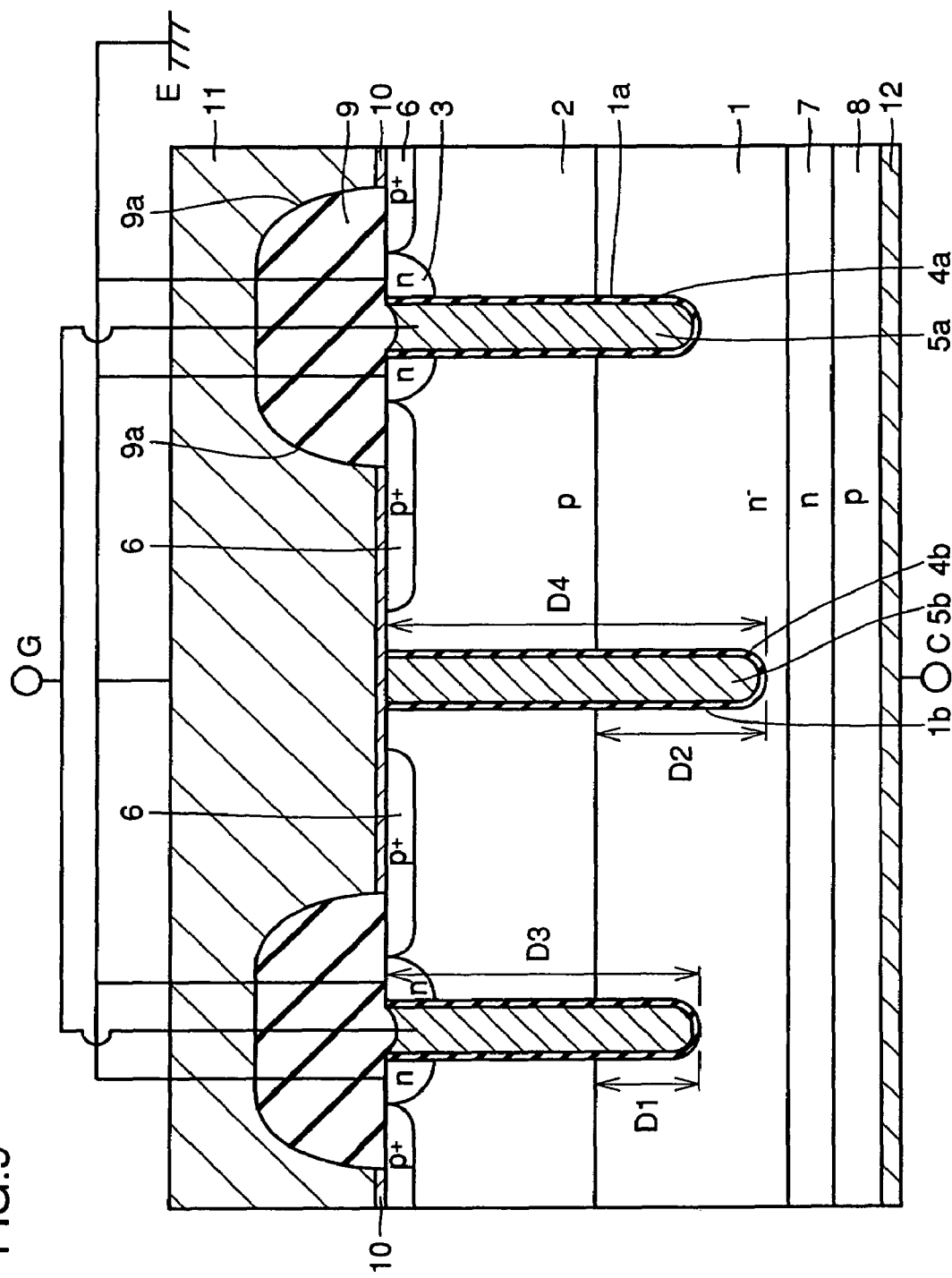
FIG. 9 is a cross sectional view schematically showing the configuration of a semiconductor device according to Embodiment 3 of the present invention.

FIG. 9 is a cross sectional view schematically showing the configuration of a semiconductor device according to Embodiment 3 of the present invention. In reference to FIG. 9, the configuration of the present embodiment differs from the configuration of Embodiment 1 in the relationship between trench 1a for a gate and the depth of trench 1b for an emitter. In the present embodiment, depth D2 where trench 1b for an emitter extends within the n⁻ silicon substrate is set at a value greater than depth D1 where trench 1a for a gate extends within the n⁻ silicon substrate. Thereby, a stabilizing plate capacitor Cf formed between stabilizing plate 5b and n⁻ silicon substrate 1 has a capacitance greater than that of a capacitor Cd on the gate side formed between gate electrode 5a and n⁻ silicon substrate 1.

Here, each depth D3 or D4 of trench 1a for gate or of trench 1b for an emitter from the first main surface is within a range of, for example, from 3 μm to 10 μm.

Here, the other parts of the configuration are approximately the same as in the configuration of the above described Embodiment 1 and, therefore, the same symbols are attached to the same members, of which the descriptions are omitted.

The present embodiment is also formed so that stabilizing plate capacitor Cf has a capacitance greater than that of capacitor Cd on the drain side by adjusting depth D1 of trench 1a for a gate and depth D2 of trench 1b for an emitter and, therefore, oscillation at the time of short circuiting can be suppressed in the same manner as in Embodiment 1.

In addition, the same effects as in Embodiment 1 can be gained with respect to the effects other than the above.

Here, in the configuration shown in FIG. 8, oscillation at the time of short circuiting can be suppressed by making the area wherein stabilizing plate 5b is opposed to n⁻ silicon substrate 1 greater than the area wherein gate electrode 5a is opposed to n⁻ silicon substrate 1.

(Embodiment 4)

Figure 10:
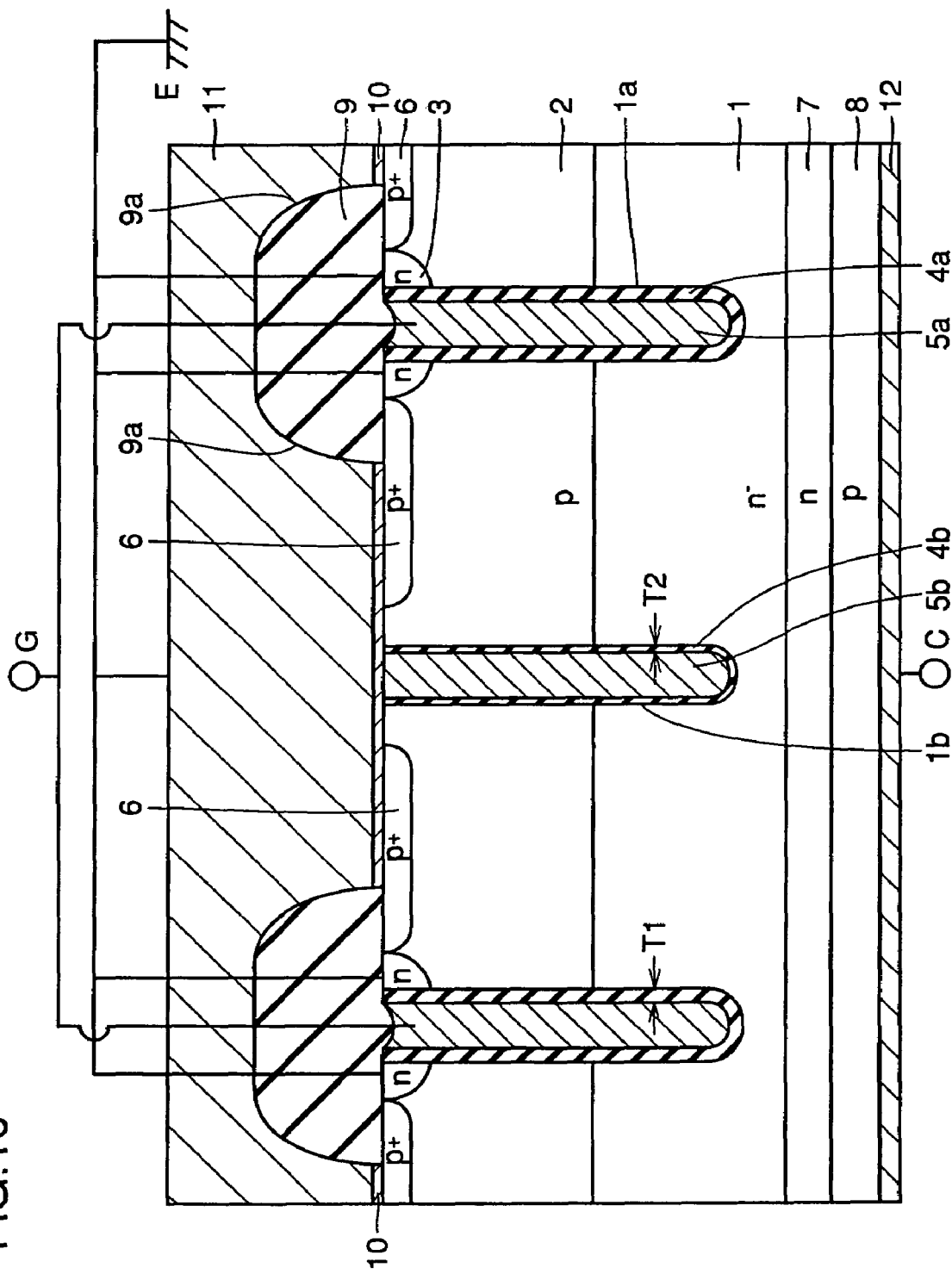
FIG. 10 is a cross sectional view schematically showing the configuration of a semiconductor device according to Embodiment 4 of the present invention.

FIG. 10 is a cross sectional view schematically showing the configuration of a semiconductor device according to Embodiment 4 of the present invention. In reference to FIG. 10, the configuration of the present embodiment differs from the configuration of Embodiment 1 in the relationship between the film thicknesses of gate insulating film 4a and insulating film 4b for an emitter. In the present embodiment, the same material such as of a silicon oxide film is used for gate insulating film 4a and insulating film 4b for an emitter and, in addition, thickness T2 of insulating film 4b for an emitter is formed so as to be thinner than thickness T1 of gate insulating film 4a. Thereby, stabilizing plate capacitor Cf is formed so as to have a capacitance greater than that of capacitor Cd on the drain side.

Here, the other parts of the configuration are approximately the same as in the configuration of the above described Embodiment 1 and, therefore, the same symbols are attached to the same members, of which the descriptions are omitted.

In the present embodiment, stabilizing plate capacitor Cf is formed so as to have a capacitance greater than that of capacitor Cd on the drain side by adjusting thickness T2 of insulating film 4b for an emitter and thickness T1 of gate insulating film 4a and, therefore, oscillation at the time of short circuiting can be suppressed in the same manner as in Embodiment 1.

In addition, the same effects as in Embodiment 1 can be gained with respect to effects other than the above.

Here, though in the above description, a case wherein the film thicknesses of gate insulating film 4a and of insulating film 4b for an emitter are respectively adjusted, stabilizing plate capacitor Cf may be formed so as to have a capacitance greater than that of capacitor Cd on the drain side by making the dielectric constant of insulating film 4b for an emitter greater than the dielectric constant of gate insulating film 4a in the configuration of FIG. 1.

In the case that the dielectric constant is adjusted, stabilizing plate capacitor Cf has a capacitance greater than that of capacitor Cd on the drain side and, thereby, oscillation can be suppressed in the same manner as Embodiment 1.

(Embodiment 5)

Figure 11:
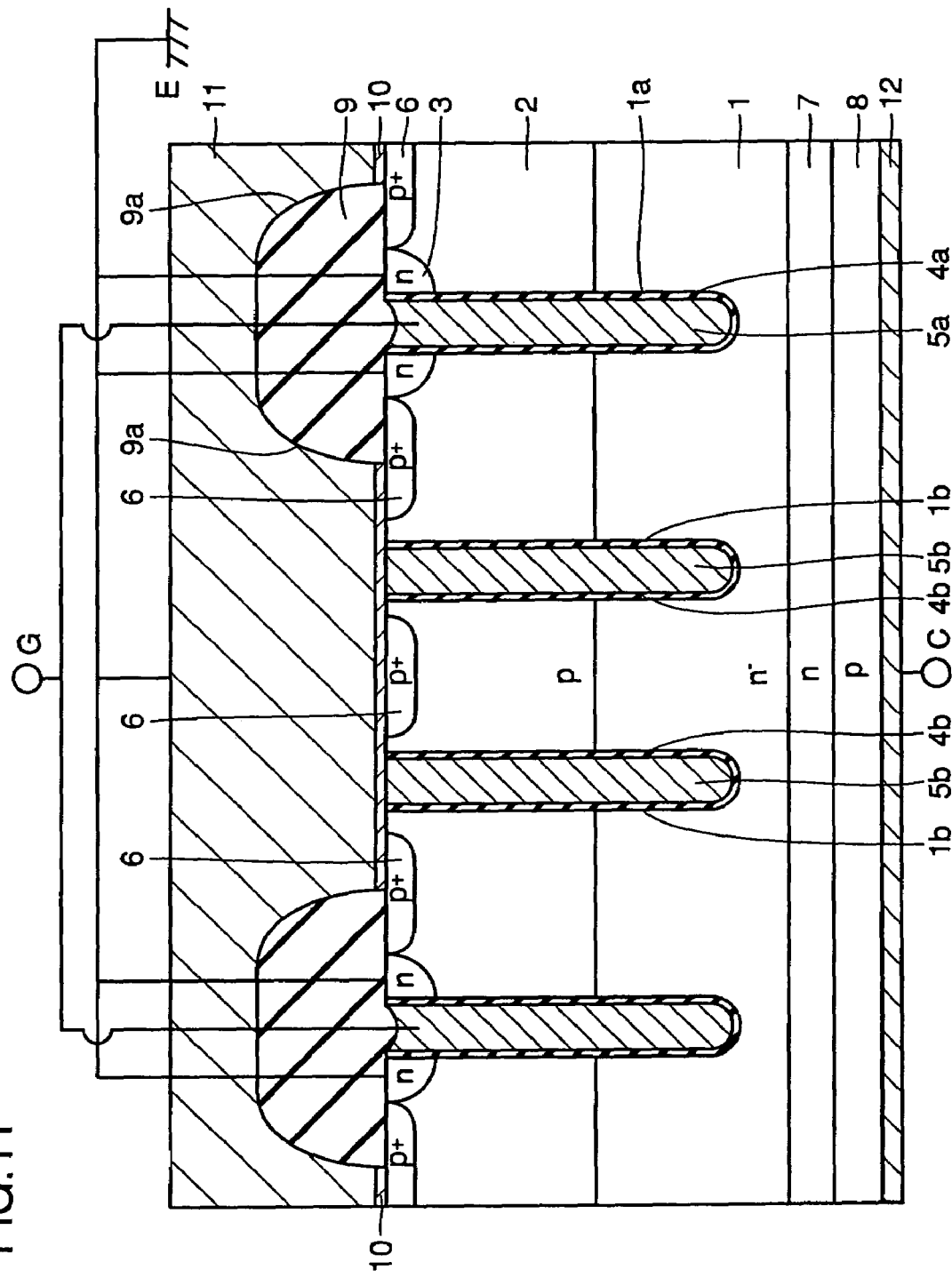
FIG. 11 is a cross sectional view schematically showing the configuration of a semiconductor device according to Embodiment 5 of the present invention.

FIG. 11 is a cross sectional view schematically showing the configuration of a semiconductor device according to Embodiment 5 of the present invention. In reference to FIG. 11, the configuration of the present embodiment differs from the configuration of Embodiment 1 in the point that a plurality of emitter trenches are provided in a region sandwiched between two MOS transistor portions. In the present embodiment, two emitter trenches are, for example, provided in the first main surface of a region sandwiched between two MOS transistors.

Each of these emitter trenches is formed of trench 1b for an emitter, insulating film 4b for an emitter and a stabilizing plate 5b in the same manner as in Embodiment 1. In addition, a p⁺ impurity diffusion region 6 for forming a low resistance contact with a p-type body region 2 is formed so as to have a high concentration of, for example, approximately $1 \times 10^{20}$ cm⁻³ in the first main surface sandwiched between two emitter trenches.

Here, the other parts of the configuration are approximately the same as in the configuration of the above described Embodiment 1 and, therefore, the same symbols are attached to the same members, of which the descriptions are omitted.

In the present embodiment, since a plurality of stabilizing plates 5b is provided in a region sandwiched by two MOS transistor portions, the capacitance of stabilizing plate capacitor Cf can be made greater than that of capacitor Cd on the drain side and, therefore, oscillation at the time of short circuiting can be suppressed in the same manner as in Embodiment 1.

In addition, the same effects as in Embodiment 1 can be gained with respect to effects other than the above.

Here, a region sandwiched between stabilizing plates 5b need not to be at the emitter potential but, rather, may be at a floating potential. In the case of a floating potential, the same effects as the effects in Japanese Patent Laying-Open No. 9-331063 can be gained although it should be noted that there is a risk of the lowering of the withstanding capacity against latch up, as shown in U.S. Pat. No. 4,994,871.

(Embodiment 6)

Figure 12:
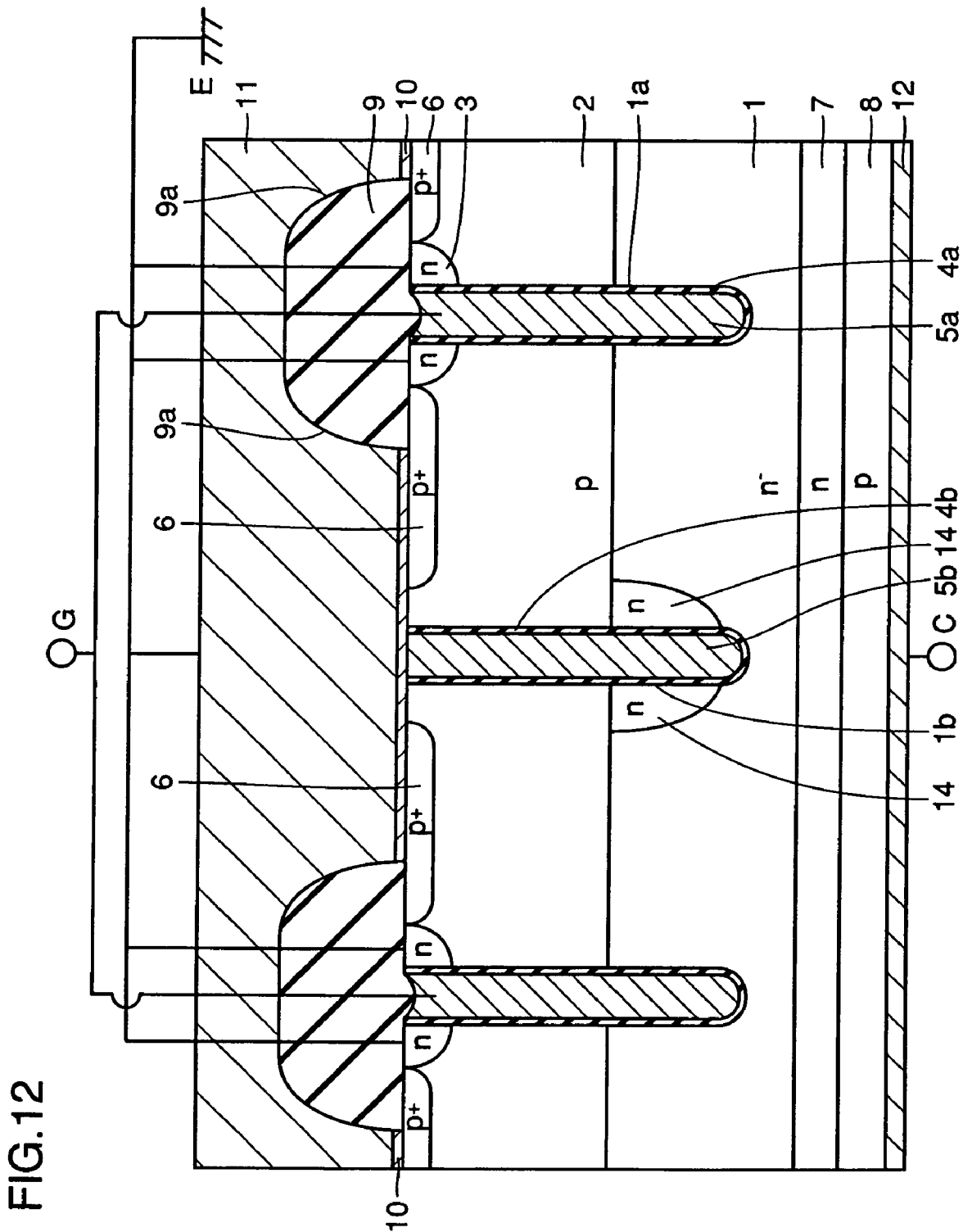
FIG. 12 is a cross sectional view schematically showing a configuration of a semiconductor device according to Embodiment 6 of the present invention.

FIG. 12 is a cross sectional view schematically showing the configuration of a semiconductor device according to Embodiment 6 of the present invention. In reference to FIG. 12, the configuration of the present embodiment differs from the configuration of Embodiment 1 in the point that the impurity concentration of n⁻ silicon substrate 1 is adjusted. In the present embodiment, the n-type impurity concentration of a region in n⁻ silicon substrate 1 that is opposed to stabilizing plate 5b is higher than the other regions of n⁻ silicon substrate 1. That is to say, an n⁺ impurity diffusion region 14 is provided in the region in n⁻ silicon substrate 1 that is opposed to stabilizing plate 5b and this n⁺ impurity diffusion region 14 has an n-type impurity concentration higher than that of n⁻ silicon substrate 1 having a concentration of, for example, approximately $1 \times 10^{14}$ cm$^{-3}$.

Here, the other parts of the configuration are approximately the same as in the configuration of the above described Embodiment 1 and, therefore, the same symbols are attached to the same members, of which the descriptions are omitted.

In the present embodiment, an n⁺ impurity diffusion region 14 of a high concentration is provided in a position opposed to stabilizing plate 5b. Thereby, the depletion layer becomes resistant to expansion so that it becomes possible to gain stabilizing plate capacitor Cf having a large capacitance. Therefore, the capacitance of stabilizing plate capacitor Cf can be made greater than that of capacitor Cd on the drain side and, therefore, oscillation at the time of short circuiting can be suppressed in the same manner as in Embodiment 1.

In addition, the same effects as in Embodiment 1 can be gained with respect to effects other than the above.

Here, n⁺ impurity diffusion region 14 can be formed through an ion implantation and diffusion from the surface of the semiconductor substrate, or can be formed through an ion implantation and diffusion from a sidewall of trench 1b for an emitter at the time of the creation of trench 1b for an emitter.

Here, though in the configuration shown in FIG. 12 n⁺ impurity diffusion region 14 of a high concentration is placed in the vicinity of both sidewalls of stabilizing plate 5b, the effect of oscillation suppression can be gained even in the case that the n⁺ impurity diffusion region is provided in the vicinity of only one sidewall of stabilizing plate 5b.

In addition, as shown in FIG. 8, the n⁺ impurity diffusion region having a high concentration can, of course, be provided in a region of the first main surface in n⁻ silicon substrate 1, which is opposed to stabilizing plate 5b, in the plane gate type IGBT so as to gain the same effects as of the present embodiment.

In addition, the configuration of the present embodiment can also be applied in the configuration wherein a plurality of emitter trenches exists within a region sandwiched between two MOS transistors as shown in FIG. 11. That is to say, in reference to FIG. 13, n⁺ impurity diffusion region 14 of a high concentration is provided in a region of n⁻ silicon substrate 1 sandwiched between two emitter trenches and, thereby, the same effects as the present embodiment can be gained.

Figure 13:
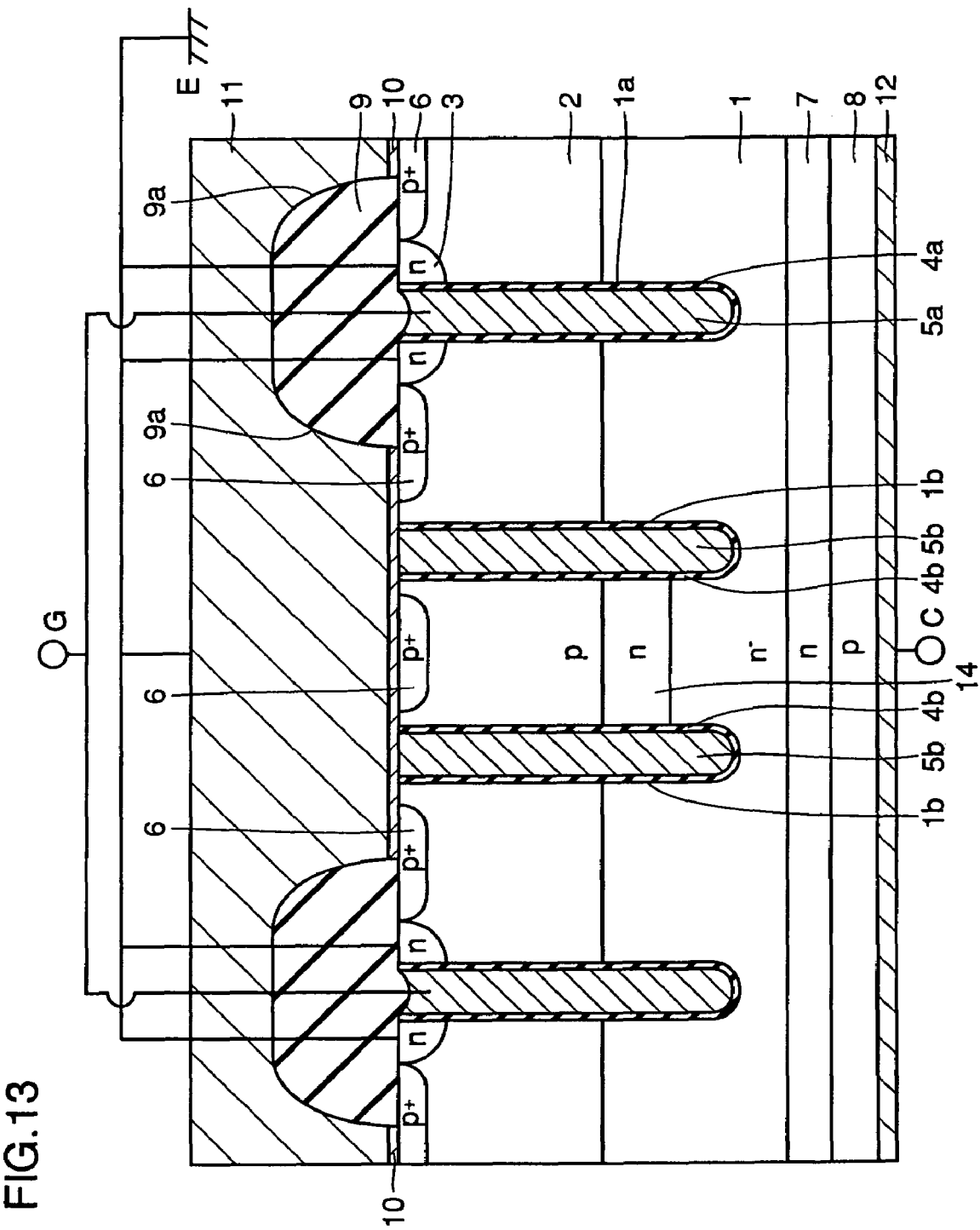
FIG. 13 is a schematic cross sectional view showing another configuration of the semiconductor device according to Embodiment 6 of the present invention.

In addition, in the case that p-type body region 2 sandwiched between stabilizing plates 5b is set at the emitter potential as shown in FIG. 13, the effects of the lowering of the saturation voltage can be gained according to the carrier storage effects caused by the existence of n⁺ impurity diffusion region 14 of a high concentration.

Figure 14:
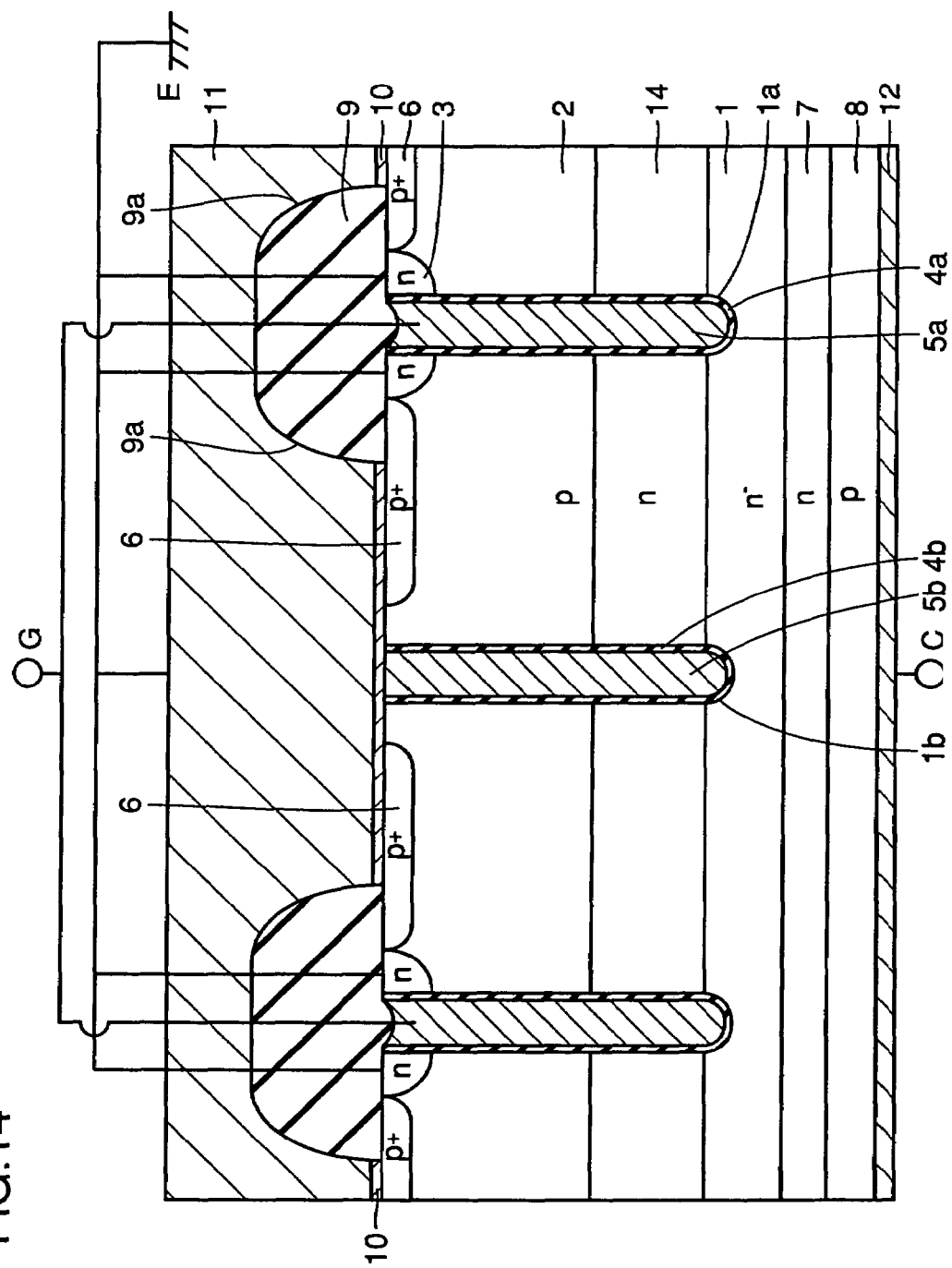
FIG. 14 is a schematic cross sectional view showing another configuration of the semiconductor device according to Embodiment 6 of the present invention.
Figure 15:
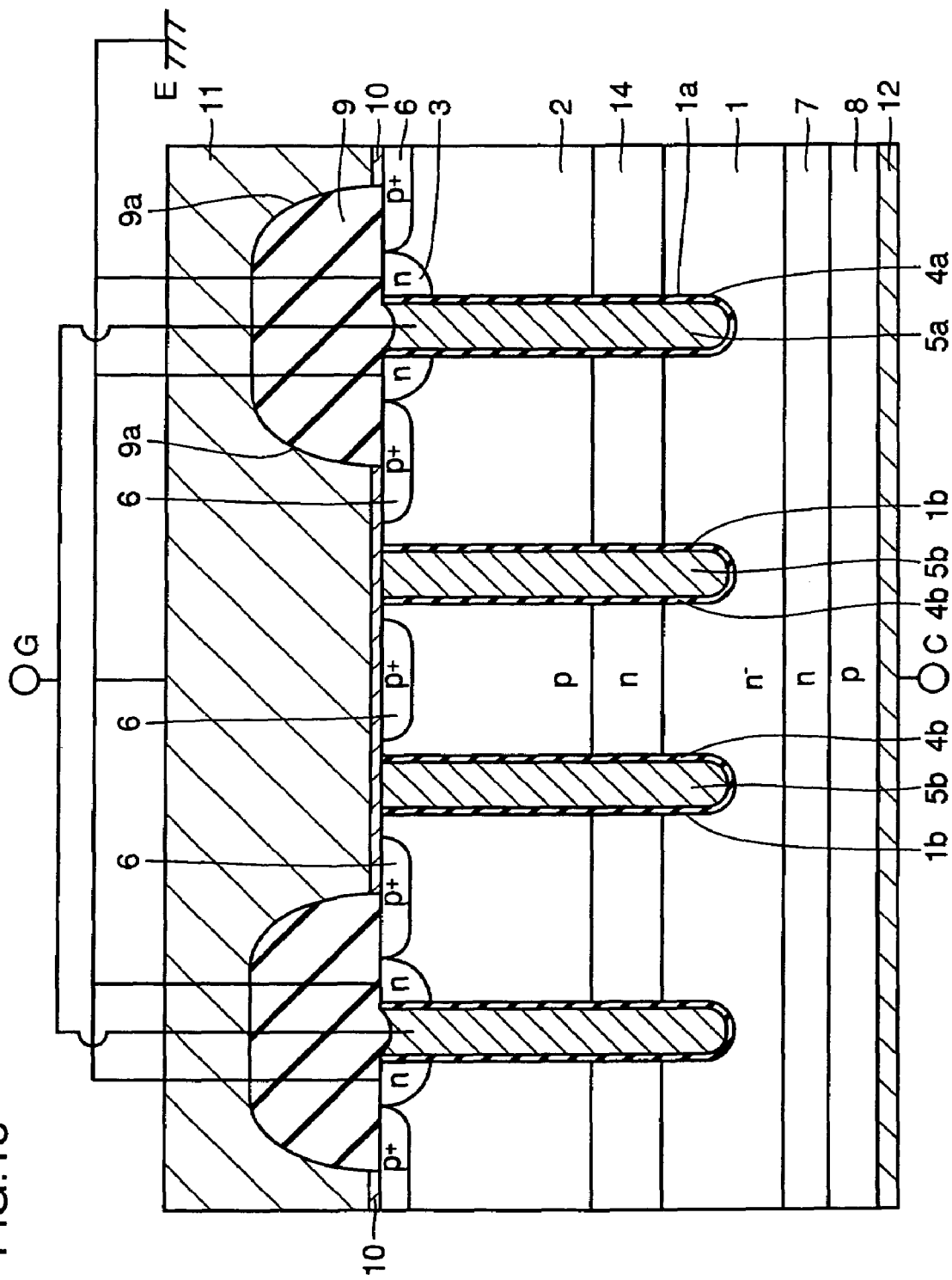
FIG. 15 is a schematic cross sectional view showing another configuration of the semiconductor device according to Embodiment 6 of the present invention.

Here, n⁺ impurity diffusion region 14 of a high concentration may be provided over the entirety of a region in the vicinity of the lower surface of p-type body region 2 as shown in FIGS. 14 and 15. The effects of lowering the saturation voltage can be gained by providing n⁺ impurity diffusion region 14 of a high concentration in the entirety of the region directly beneath p-type body region 2 in such a manner.

In addition, in the configuration shown in FIGS. 14 and 15, n-type impurity concentration of n⁺ impurity diffusion region 14 or of n⁻ silicon substrate 1 in the vicinity of stabilizing plate 5b can be made higher than the concentration in the other n-type regions and, thereby, the expansion of the depletion layer can be sufficiently suppressed and, in addition, capacitor Cd on the drain side can be made small.

Here, the parts of the configuration of FIGS. 12 to 15 other than in the above description are approximately the same as in the configuration of Embodiment 1 shown in FIG. 2 or as in the configuration of Embodiment 5 shown in FIG. 11 and, therefore, the same symbols are attached to the same members, of which the descriptions are omitted.

In addition, the present inventors examined the relationship between the collector current and the collector voltage in the semiconductor device of the present embodiment shown in FIG. 14. FIG. 7 shows, among other things, the result thereof.

It is found from the result of FIG. 7 that, in the semiconductor device of the present embodiment, the collector current at the time when the collector voltage is fixed can be made small in comparison with the semiconductor device according to the prior art shown in FIG. 54.

(Embodiment 7)

Figure 16:
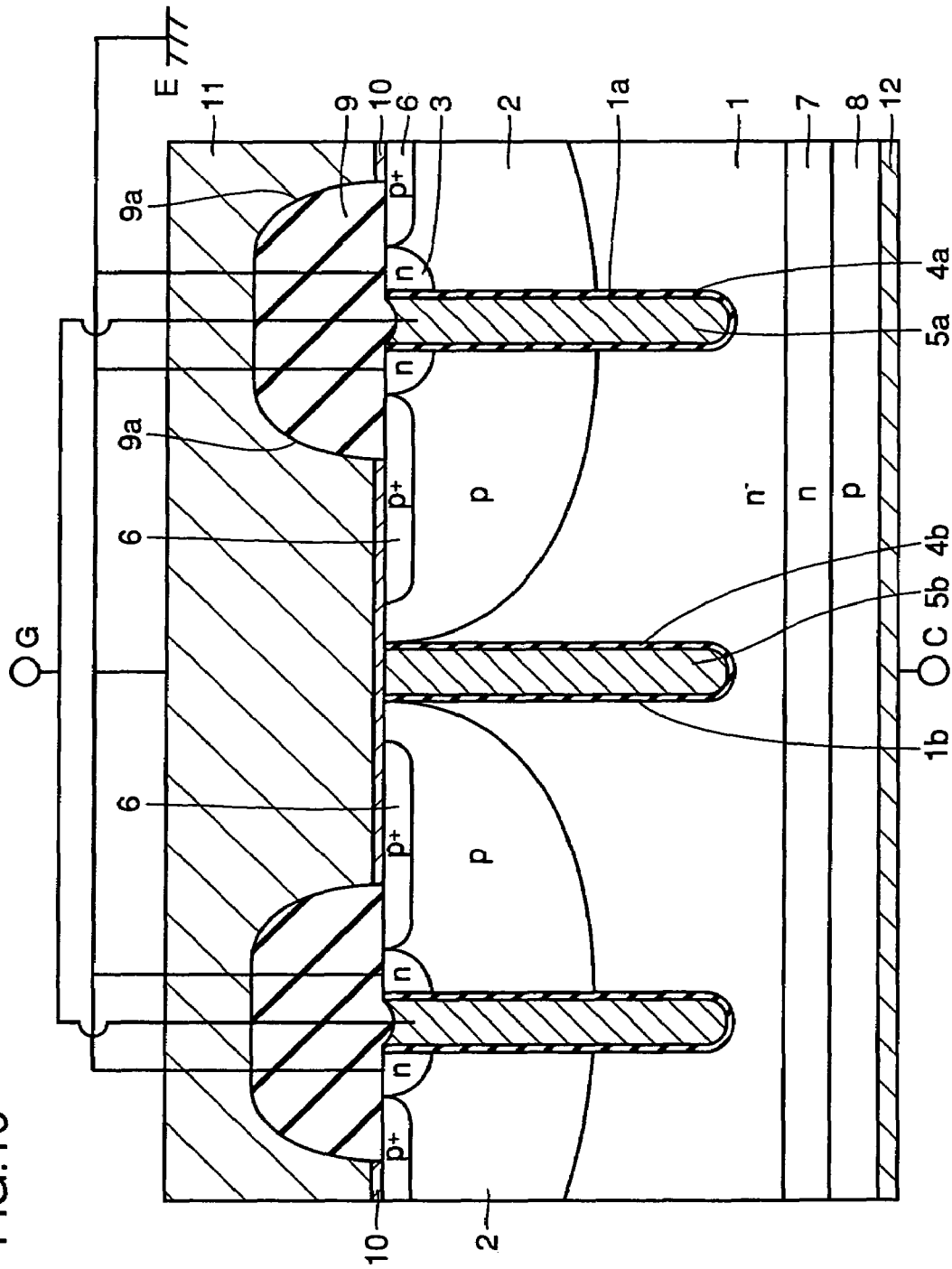
FIG. 16 is a cross sectional view schematically showing a configuration of a semiconductor device according to Embodiment 7 of the present invention.

FIG. 16 is a cross sectional view schematically showing the configuration of a semiconductor device according to Embodiment 7 of the present invention. In reference to FIG. 16, the configuration of the present embodiment differs from the configuration of Embodiment 1 in the point that the depth of p-type body region 2 in the emitter trench portion differs from that in the gate trench portion. In the present embodiment, p-type body region 2 is formed so as to be deep in the gate trench portion and so as to be shallow in the emitter trench portion.

Therefore, the length wherein the emitter trench portion is opposed to n⁻ silicon substrate 1 is greater than the length wherein the gate trench is opposed to n⁻ silicon substrate 1. That is to say, the ratio of the length wherein n⁻ silicon substrate 1 is opposed to stabilizing plate 5b to the length wherein p-type body region 2 is opposed to stabilizing plate 5b is greater than the ratio of the length wherein n⁻ silicon substrate 1 is opposed to gate electrode 5a to the length wherein p-type body region 2 is opposed to gate electrode 5a.

The length wherein stabilizing plate 5b is opposed to n⁻ silicon substrate 1 is greater than the length wherein gate electrode 5a is opposed to n⁻ silicon substrate 1 in the above manner and, therefore, the capacitance of stabilizing plate capacitor Cf can be made greater than that of capacitor Cd on the drain side.

Here, the other parts of the configuration are approximately the same as in the configuration of the above described Embodiment 1 and, therefore, the same symbols are attached to the same members, of which the descriptions are omitted.

In the present embodiment, the capacitance of stabilizing plate capacitor Cf can be made greater than that of capacitor Cd on the drain side by controlling the depth of each portion in p-type body region 2 and, therefore, oscillation at the time of short circuiting can be suppressed in the same manner as in Embodiment 1.

In addition, the same effects as in Embodiment 1 can be gained with respect to effects other than the above.

The configuration of the present embodiment wherein the depth of p-type body region 2 is controlled may be applied to the configuration of FIG. 11. In this case, a configuration as shown in FIG. 17, for example, can be gained.

Figure 17:
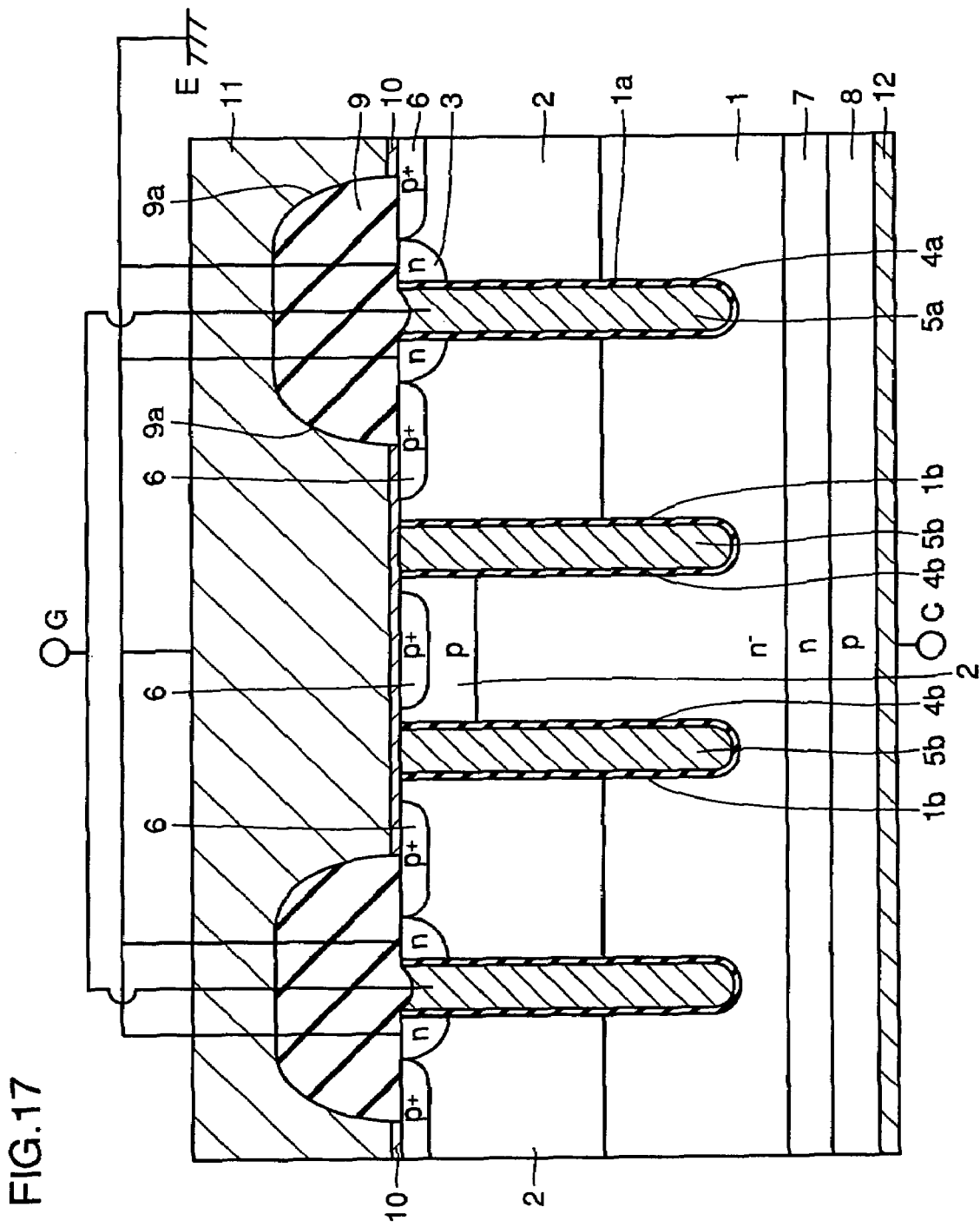
FIG. 17 is a schematic cross sectional view showing another configuration of the semiconductor device according to Embodiment 7 of the present invention.

In reference to FIG. 17, the depth of p-type body region 2, sandwiched between a plurality of emitter trenches, from the first main surface becomes shallower than the depth of the other parts in p-type body region 2 from the first main surface. Thereby, the capacitance of stabilizing plate capacitor Cf can be made greater than that of capacitor Cd on the drain side in the same manner as described above and it becomes possible to suppress oscillation at the time of short circuiting.

Here, though in the configuration shown in FIG. 17 a case is described wherein two emitter trenches are provided in a region sandwiched between two MOS transistor portions, three, or more, emitter trenches may be provided and, in this case, the depth of p-type body region 2 in the vicinity of, at least, one emitter trench may be shallow vis-à-vis the first main surface.

In addition, p-type body region is erased so that n⁻ silicon substrate 1 becomes extended in a region in the vicinity of stabilizing plate 5b or in a region sandwiched between stabilizing plates 5b. Here, in the case that the depth of p-type body region 2 is made shallow or p-type body region 2 is erased, it is necessary to ensure that main withstanding voltage does not become low.

In addition, the p-type impurity concentration in the vicinity of stabilizing plate 5b of p-type body region 2 is made lower than the impurity concentration of the other regions in p-type body region 2 and, thereby, the same effects as above can be gained.

(Embodiment 8)

FIG. 18 is a cross sectional view schematically showing the configuration of a semiconductor device according to Embodiment 8. In reference to FIG. 18, the configuration of the present embodiment has a configuration wherein MOS transistor portions are formed in both the first main surface and in the second main surface of a semiconductor substrate of which the thickness is, for example, 100 μm to 200 μm. p-type body regions 2 made of a p-type semiconductor, of which the concentration is, for example, approximately $1 \times 10^{16}$ cm³ to $1 \times 10^{18}$ cm³ and of which the depth is approximately 3 μm, are formed on both the first main surface side and on the second main surface side of an n⁻ silicon substrate 1, of which the concentration is approximately $1 \times 10^{14}$ cm⁻³.

In addition, n-type emitter regions 3 made of an n-type semiconductor, of which the concentration is, for example, $1 \times 10^{19}$ cm⁻³, or greater, and of which the depth is approximately 0.5 μm, are formed in both the first main surface and in the second main surface within respective p-type body regions 2. In addition, a p⁺ impurity diffusion region 6 for forming a low resistance contact with a p-type body region 2 is formed adjoining each n-type emitter region 3 so as to have a high concentration of, approximately, $1 \times 10^{20}$ cm⁻³.

Trenches 1a for gates that penetrate n-type emitter regions 3 and p-type body regions 2 so as to reach to n⁻ silicon substrate 1 are created having a depth of, for example, 3 μm to 10 μm in both the first main surface and second main surface. Gate insulating films 4a made of, for example, silicon oxide films are formed along the inner surface of these trenches 1a for gates. Gate electrodes 5a made of a polycrystal silicon, into which phosphorus, for example, is introduced so as to have a high concentration, are formed so as to fill in trenches 1a for gates. Gate electrodes 5a are electrically connected to control electrodes for providing gate potential G.

The gate trenches are formed of trenches 1a for gates, gate insulating films 4a and gate electrodes 5a in the above manner. In addition, an insulating gate type field effect transistor portion (here MOS transistor portion) having n⁻ silicon substrate 1 as a drain and having n-type emitter region 3 as a source is formed of n⁻ silicon substrate 1, n-type emitter region 3 and gate electrode 5a.

Emitter trenches are formed in the respective first and second main surfaces sandwiched between two MOS transistor portions.

This emitter trenches have trenches 1b for emitters, insulating film 4b for emitters and conductive layers 5b for emitters. A trench 1b for an emitter is created so as to penetrate a p-type body region 2 and so as to reach to n⁻ silicon substrate 1 and is created so as to have a depth of from 3 μm to 10 μm. An insulating film 4b for an emitter made of, for example, a silicon oxide film is formed along the inner surface of this trench 1b for an emitter. A conductive layer 5b for an emitter that is made of a polycrystal silicon into which phosphorus, for example, is introduced so as to have a high concentration and that becomes a stabilizing plate is formed so as to fill in trench 1b for an emitter.

Stabilizing plate 5b formed on the first main surface side is electrically connected to a first electrode 11 made of, for example, an aluminum compound that is formed on the first main surface via a barrier metal layer 10. In addition, this first electrode 11 is electrically connected to p⁺ impurity diffusion region 6 and to n-type emitter region 3 in the first main surface via barrier metal layer 10.

In addition, stabilizing plate 5b formed on the second main surface side is electrically connected to a second electrode 11 made of, for example, an aluminum compound that is formed on the second main surface via a barrier metal layer 10. In addition, this second electrode 11 is electrically connected to p⁺ impurity diffusion region 6 and to n-type emitter region 3 in the second main surface via barrier metal layer 10.

In the above described configuration, a signal of, for example, −15V at the off time and of +15V at the on time is inputted to gate electrodes 5a formed in the first and second main surfaces, respectively, in reference to the potential of the first and second electrodes 11. On the other hand, a voltage of approximately half of the main withstanding voltage is applied between the first and second electrodes 11, at a maximum, and depending on the magnitude thereof, one electrode becomes an emitter and the other becomes a collector and they are, in general, arbitrarily switched.

Therefore, in the configuration wherein MOS transistor portions are positioned in both the first and second main surfaces, a change in the potential on the drain side of a MOS transistor portion becomes great in comparison with the configuration shown in FIG. 2 and, therefore, oscillation tends to easily occur. Accordingly, in order to suppress oscillation it is extremely effective to provide stabilizing plate 5b that suppresses the change in the potential on the drain side of the MOS transistor portion, in the same manner as in the configuration of the present embodiment.

Here, it is preferable for stabilizing plate capacitor Cf formed between stabilizing plate 5*b* and n⁻ silicon substrate 1 to have a capacitance greater than that of capacitor Cd on the drain side formed between gate electrode 5*a* and n⁻ silicon substrate 1. Thereby, it becomes possible to further suppress oscillation at the time of short circuiting.

Here, though in FIG. 18 a case is described wherein stabilizing plates 5*b* are provided on both the first and second main surface sides, the effects of oscillation suppression can, of course, be gained even in the case that stabilizing plate 5*b* is only provided on either the first or second main surface side.

In addition, it is obvious that the oscillation suppression effects are increased in the same manner even in the case that the structure according to any of Embodiments 2 to 7 is used in, at least, either of the first or second main surfaces.

(Embodiment 9)

The present embodiment relates to the terminal structure of the arranged plurality of cells of the IGBTs in each of the configurations of the above described Embodiments 1 to 7.

Figure 20:
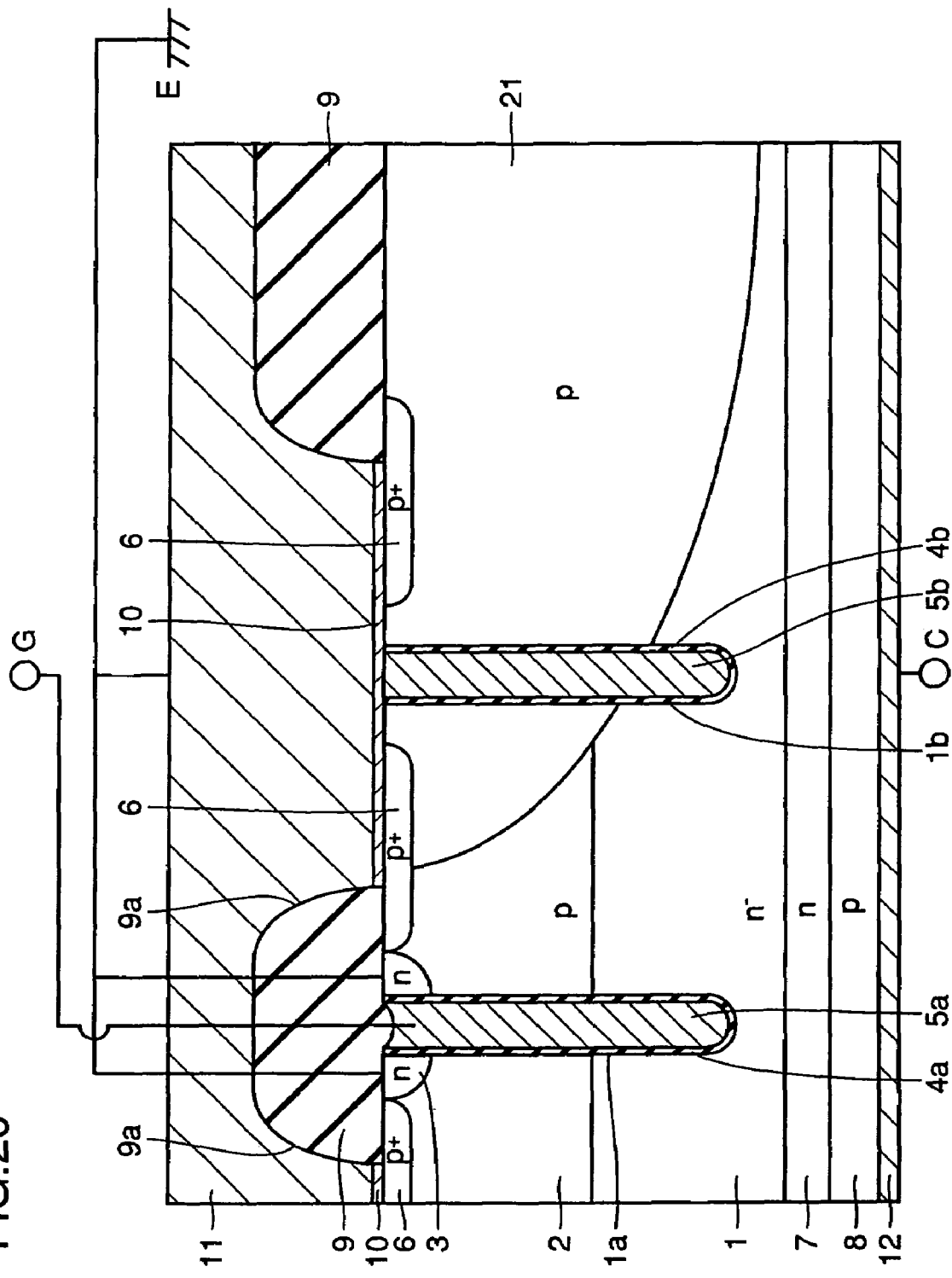
FIG. 20 is a cross sectional view schematically showing a configuration of a semiconductor device according to Embodiment 9 of the present invention.

FIG. 20 is a cross sectional view schematically showing the configuration of a semiconductor device according to Embodiment 9 of the present invention. Here, FIG. 20 shows, as an example, the structure wherein a plurality of cells, each of which is the IGBT according to Embodiment 1 shown in FIG. 2, is arranged.

In reference to FIG. 20, though the left side of the drawing is omitted, a plurality of cells of the IGBTs, each of which is the same as of Embodiment 1 shown, for example, in FIG. 2, is arranged. A p-type impurity diffusion region 21 and an emitter trench are provided in the first main surface of a terminal portion of the arranged plurality of cells.

p-type impurity diffusion region 21, of which the depth is, for example, deeper than p-type body region 2 and of which the concentration is approximately $1 \times 10^{16}$ cm⁻³ to $1 \times 10^{18}$ cm⁻³, is formed so as to surround the channel formation region. In addition, the emitter trench has trench 1*a* for an emitter that penetrates p-type impurity diffusion region 21 so as to reach to n⁻ silicon substrate 1, insulating film 4*b* for an emitter formed along the inner surface of this trench 1*b* for an emitter and a conductive layer 5*b* for an emitter that becomes a stabilizing plate so as to fill in trench 1*b* for an emitter.

This stabilizing plate 5*b* is electrically connected to emitter electrode 11 formed in the first main surface via barrier metal layer 10. In addition, p-type impurity diffusion region 21 is electrically connected to emitter electrode 11 via p⁺ impurity diffusion region 6 for forming a low resistance contact and via barrier metal layer 10.

Here, the other parts of the configuration are approximately the same as in the configuration of the above described Embodiment 1 and, therefore, the same symbols are attached to the same members, of which the descriptions are omitted.

In the present embodiment, a change in potential that has occurred in a drain portion within a cell region is restricted from having effects outside of the cell region by arranging stabilizing plate 5*b* in a terminal portion of the cell region and, therefore, the effect of increasing the withstanding capacity is gained.

Here, though in reference to FIG. 20, a case is described wherein one stabilizing plate 5*b* is arranged in a cell terminal portion, oscillation suppression effects can be further enhanced by arranging two, or more, stabilizing plates 5*b*.

Figure 21:
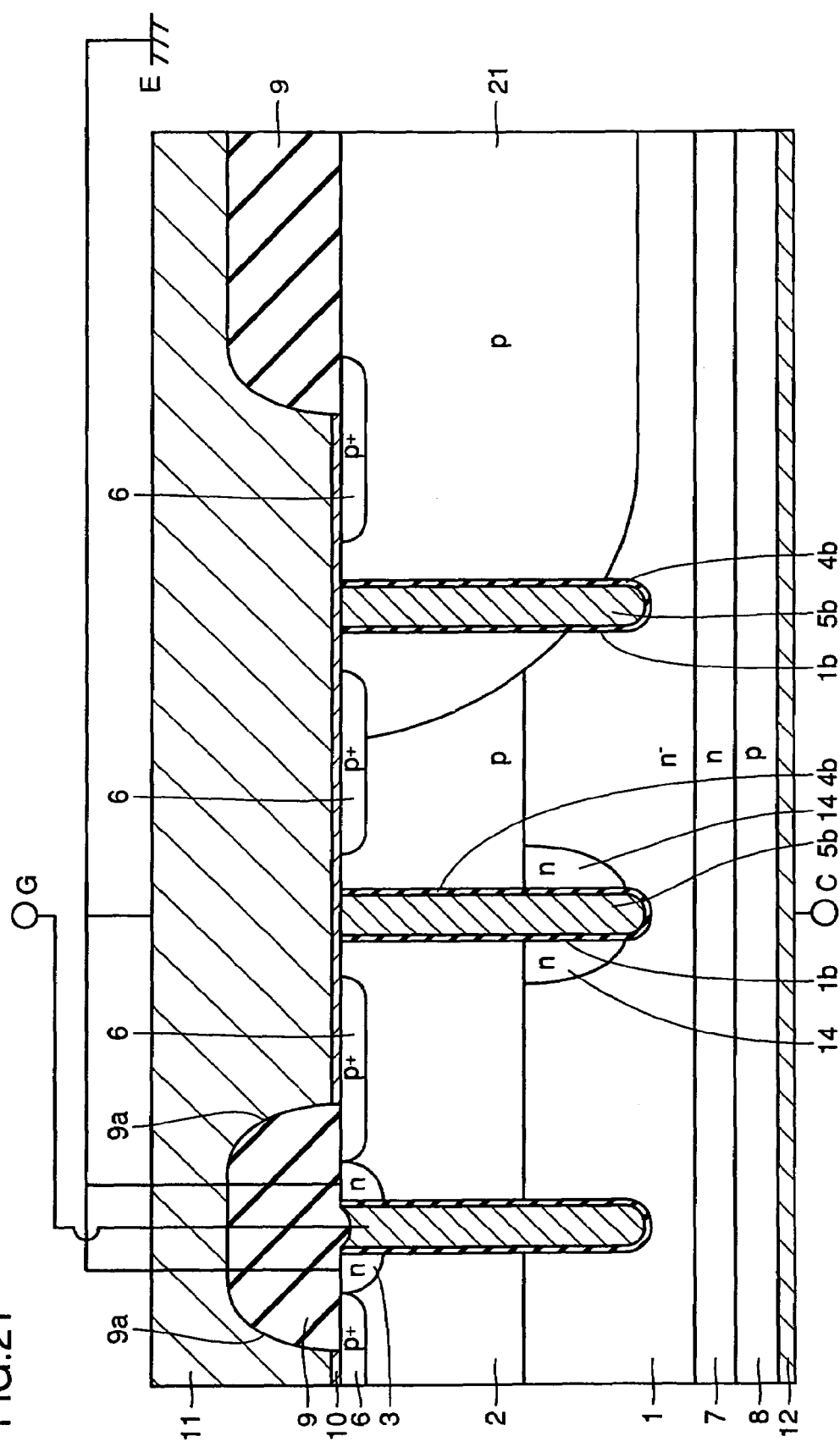
FIG. 21 is a schematic cross sectional view showing another configuration of the semiconductor device according to Embodiment 9 of the present invention.

FIG. 21 is a schematic cross sectional view showing the configuration of a case wherein a plurality (for example two) of stabilizing plates is arranged in a cell terminal portion. In reference to FIG. 21, the configuration of stabilizing plate 5*b* that is arranged in the outermost periphery from among two stabilizing plates 5*b* arranged in the cell terminal portion has the same configuration as that shown in FIG. 20. In addition, stabilizing plate 5*b* that is arranged between stabilizing plate 5*b* arranged in the outermost periphery and the cell region has approximately the same configuration as the configuration of Embodiment 6 shown in, for example, FIG. 12.

That is to say, an n⁺ impurity diffusion region 14, of which the n-type impurity concentration is higher than that of n⁻ silicon substrate 1, is formed in the vicinity of a region in n⁻ silicon substrate 1 that is a opposed to stabilizing plate 5*b*.

Here, the parts of the configuration other than the above are approximately the same as in the above described configuration of FIG. 20 and, therefore, the same symbols are attached to the same members, of which the descriptions are omitted.

Oscillation suppression effects can be further enhanced by arranging a plurality of stabilizing plates 5*b* in a cell terminal portion in the above manner.

In addition, it is obvious that a change in potential within a cell region can be restricted from having effects on the electrical field mitigating structure portion by using a stabilizing plate according to the present invention even in the case that the structure for mitigating an electrical field is a structure different from the above, such as a field plate structure or a bevel structure.

Figure 57:
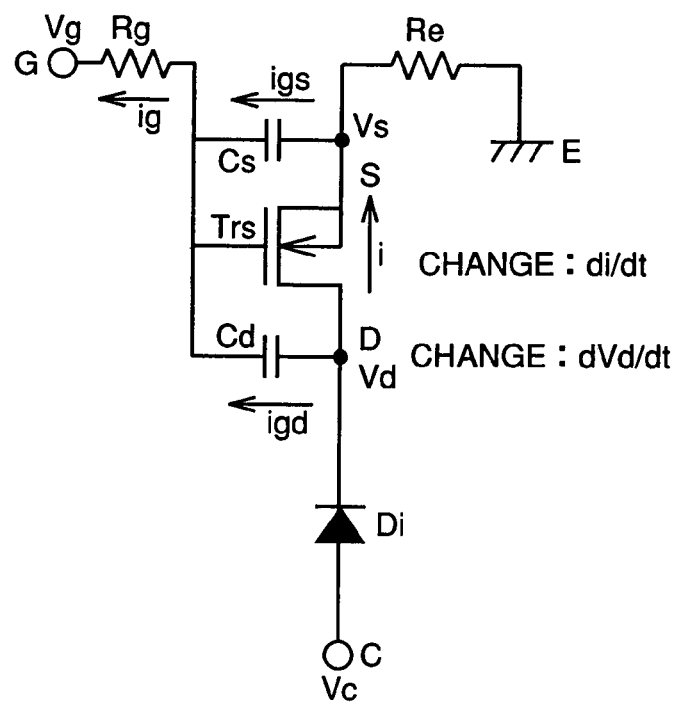
FIG. 57 is a diagram showing the circuit structure of an IGBT.

In addition, these structures can be applied in the structure in a cell terminal portion of the cell structure of a high voltage withstanding semiconductor device according to the prior art as shown in FIGS. 57, 59 and 60.

(Embodiment 10)

Figure 22:
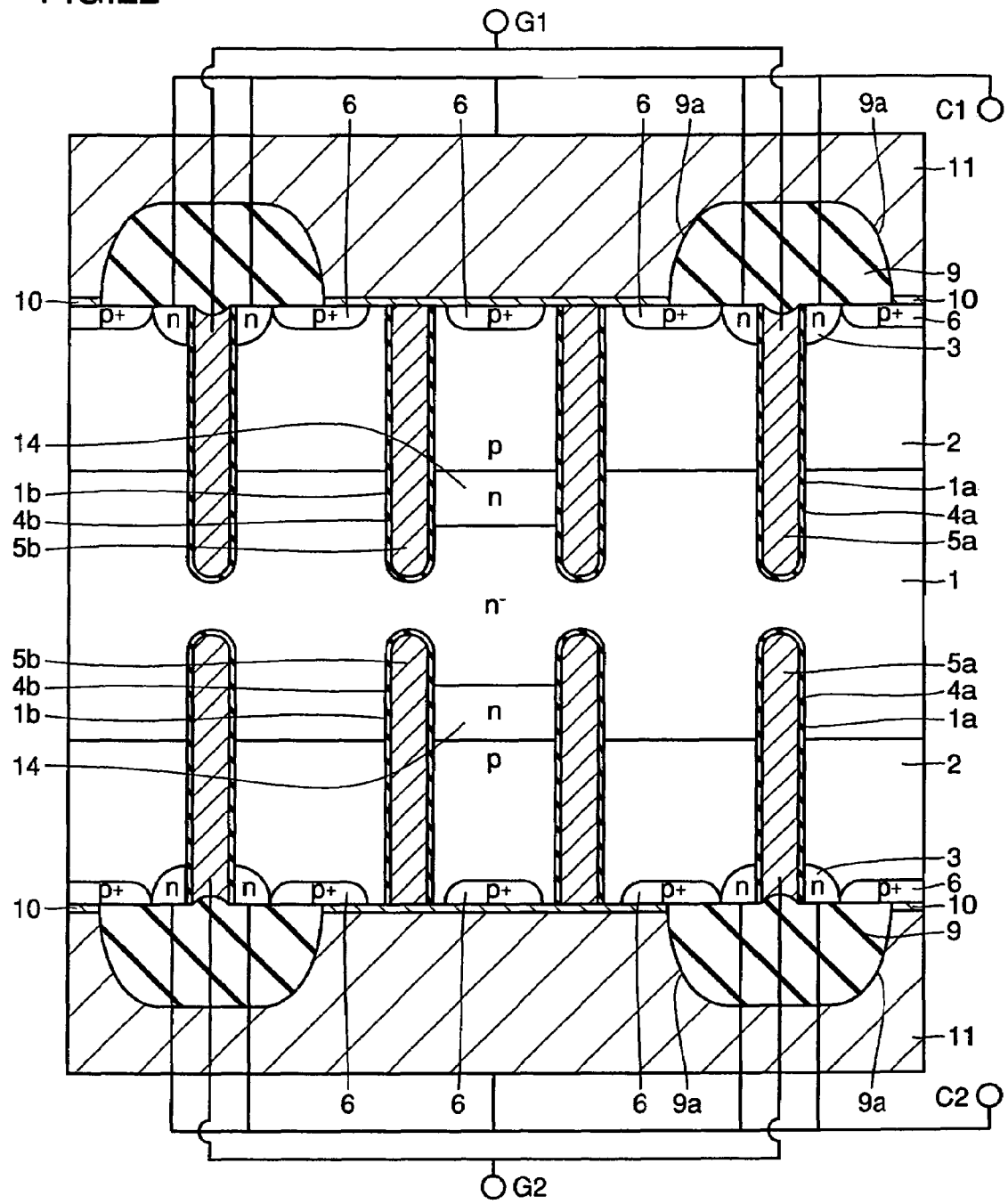
FIG. 22 is a cross sectional view schematically showing a configuration of a semiconductor device according to Embodiment 10 of the present invention.

Though in the configuration of Embodiment 8 shown in FIG. 18 the configuration wherein one stabilizing plate 5*b* each is arranged in a region sandwiched between MOS transistor structures of both the first main surface and the second main surface is described, a plurality of (for example two) stabilizing plates 5*b* may be arranged in both the first main surface and the second main surface as shown in FIG. 22. In addition, in this case, an n⁺ impurity diffusion region 14 of a high concentration may be provided in a portion of n⁻ silicon substrate 1 sandwiched between a plurality of stabilizing plates 5*b*.

Oscillation suppression effects can be further enhance by providing a plurality of stabilizing plates 5*b* in both the first main surface and the second main surface and, in addition, by providing n⁺ impurity diffusion region 14 in the above described manner.

Figure 23:
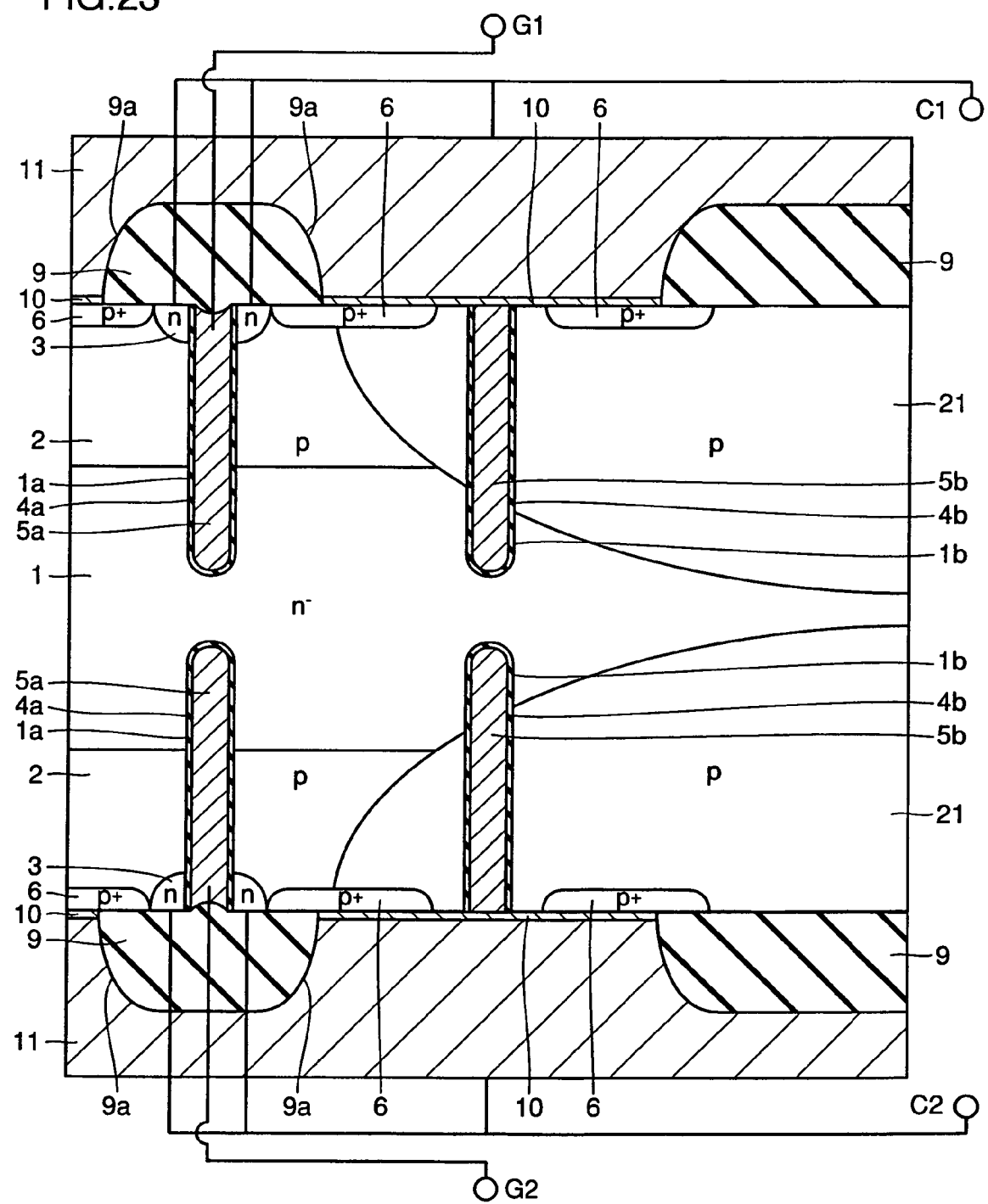
FIG. 23 is a schematic cross sectional view showing another configuration of the semiconductor device according to Embodiment 10 of the present invention.
Figure 24:
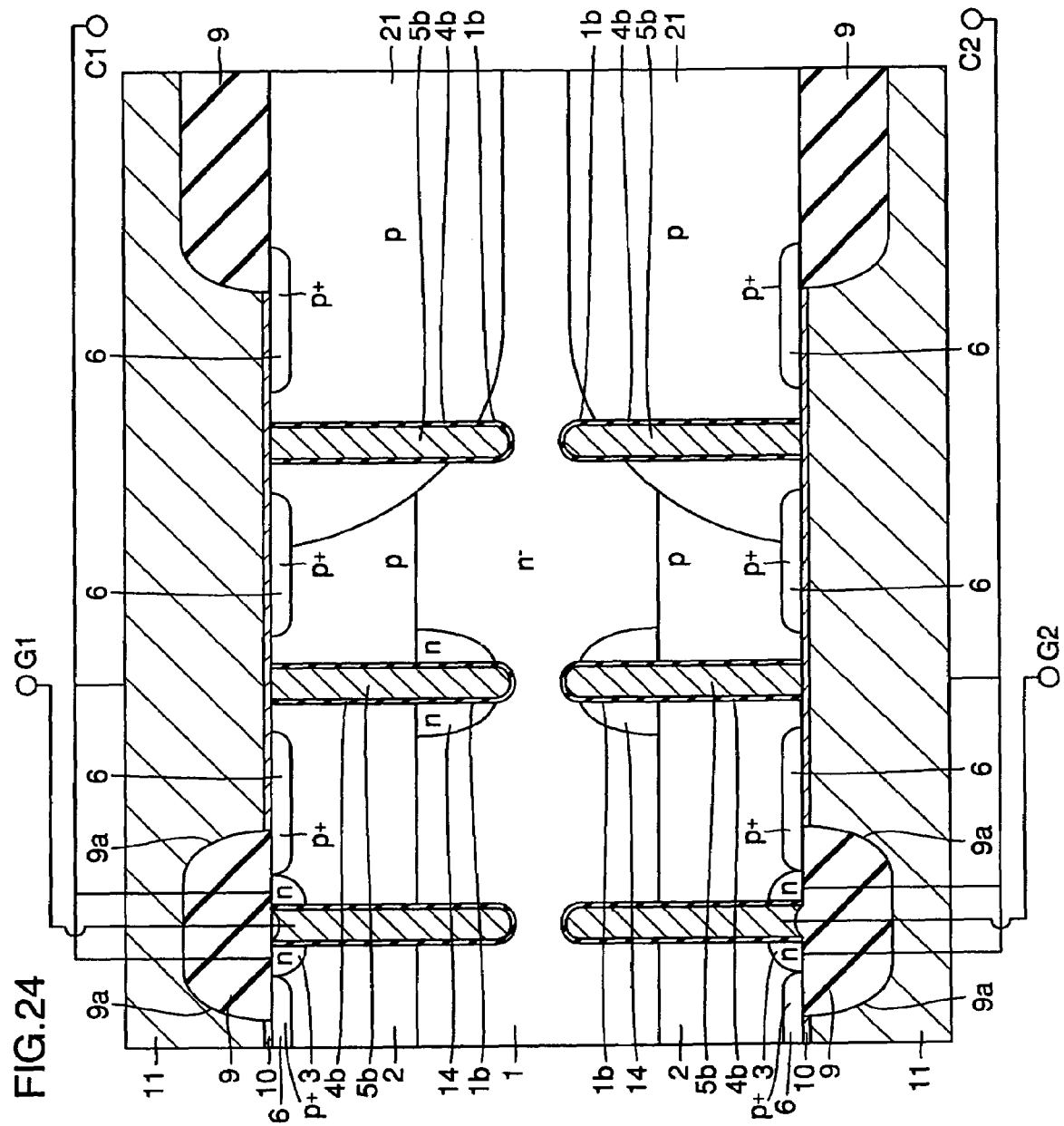
FIG. 24 is a schematic cross sectional view showing another configuration of the semiconductor device according to Embodiment 10 of the present invention.

In addition, the configuration of the cell region terminal portion in the configuration of FIG. 18 may be a configuration as shown in FIG. 20. In this case, emitter trenches and p-type impurity diffusion regions 21 are formed in both the first main surface and the second main surface of the cell region terminal portions, as shown in FIG. 23. In addition, the configuration of the cell region terminal portions in the configuration of FIG. 18 may be a configuration as shown in FIG. 21. In this case, the configuration becomes such as shown in FIG. 24.

(Other Embodiments)

The other configurations of the present invention in addition to the configurations of the above described Embodiments 1 to 10 can be applied to a variety of high voltage withstanding semiconductor devices. In the following, examples are described wherein the structures of the present invention are applied to a variety of high voltage withstanding semiconductor devices.

Figure 25:
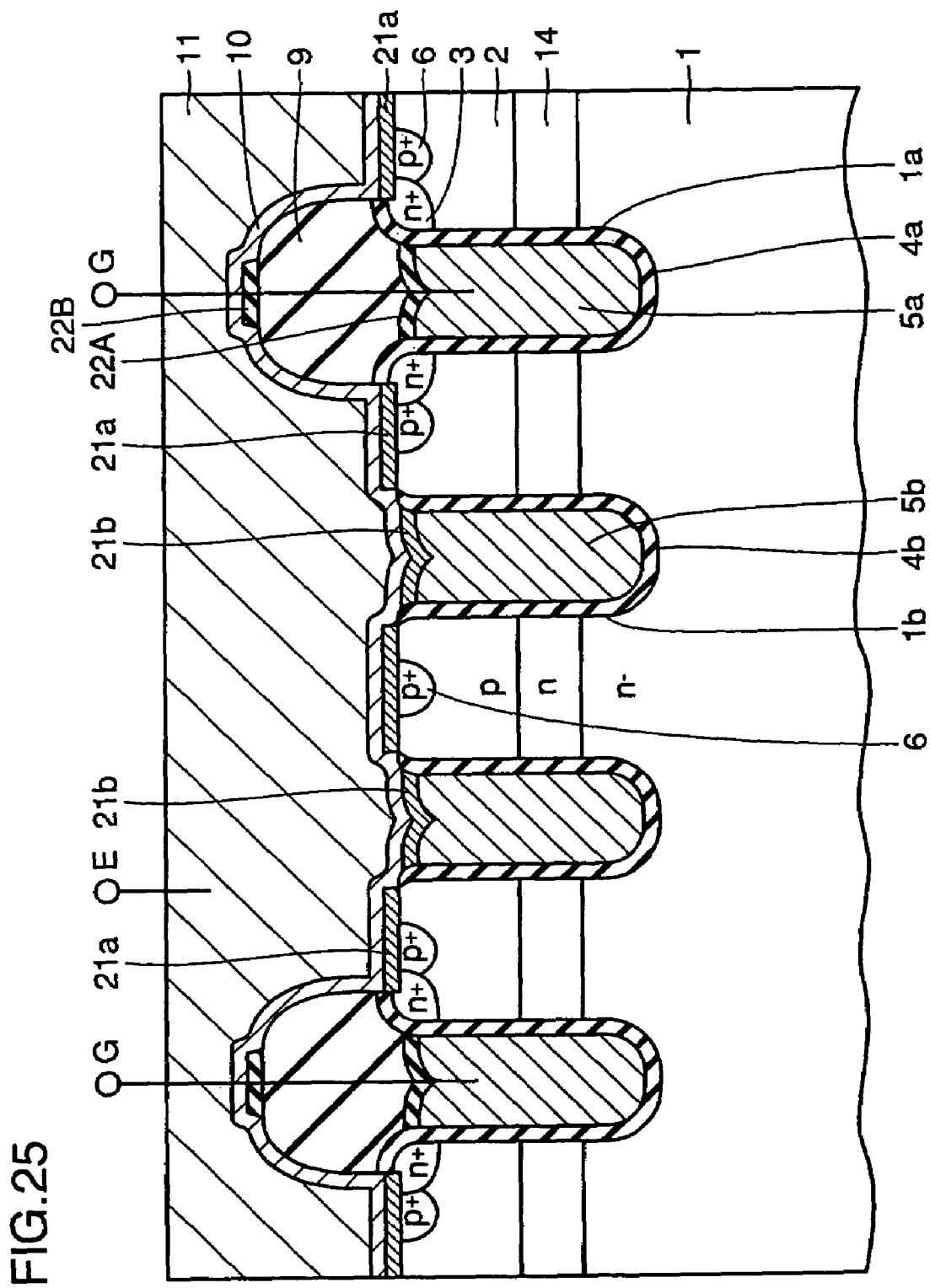
FIGS. 25 to 51 are schematic cross sectional views showing the configurations of a variety of semiconductor devices according to other embodiments of the present invention.

FIG. 25 is a cross sectional view schematically showing the configuration of a semiconductor device according to another embodiment of the present invention. In reference to FIG. 25, an n-type impurity diffusion region 14 of a high concentration and a p-type body region 2 are formed on the first main surface side of n⁻ silicon substrate 1. An n-type emitter region 3 and a p⁺ impurity diffusion region 6 for forming a low resistance contact with a p-type body region 2 are formed in the first main surface within this p-type body region 2.

A trench 1a for a gate that penetrates n-type emitter region 3, p-type body region 2 and n-type impurity diffusion region 14 so as to reach to n⁻ silicon substrate 1 is created in the first main surface. A gate insulating film 4a is formed along the inner surface of this trench 1a for a gate and a gate electrode 5a is formed so as to fill in trench 1a for a gate.

This n⁻ silicon substrate 1, n-type emitter region 3 and gate electrode 5a form a MOS transistor structure having n⁻ silicon substrate 1 as a drain and having n-type emitter region 3 as a source. In addition, a gate trench is formed of trench 1a for a gate, gate insulating film 4a and gate electrode 5a.

A plurality of (for example two) emitter trenches are created in the first main surface sandwiched between two MOS transistor structures as described above. Each of these emitter trenches is formed of a trench 1b for an emitter, an insulating film 4a for an emitter and a conductive layer 5b for an emitter.

Trench 1b for an emitter is created so as to penetrate p-type body region 2 and n-type impurity diffusion region 14 and so as to reach to n⁻ silicon substrate 1. Insulating film 4b for an emitter is formed so as to extend along the inner surface of this trench 1b for an emitter and conductive layer 5b for an emitter that becomes a stabilizing plate is formed so as to fill in trench 1b for an emitter. In addition, p⁺ impurity diffusion region 6 for forming a low resistance contact with p-type body region 2 is formed in the first main surface sandwiched between the plurality of emitter trenches and a silicide layer 21a is formed thereon.

Insulating films 9 and 22B are formed above gate electrode 5a via an insulating film 22A made of, for example, a silicon oxide film. In addition, silicide layer 21a and 21b are formed on the first main surface and on stabilizing plate 5b. A barrier metal layer 10 and an emitter electrode 11 are formed so as to cover the entirety of the first main surface. Thereby, emitter electrode 11 is electrically connected to stabilizing plate 5b, n-type emitter region 3 and p⁺ impurity diffusion region 6.

Here, the structure on the second main surface side of n⁻ silicon substrate 1 may have a configuration wherein an n-type buffer region 7, a p-type collector region 8 and a collector electrode 12 are formed, as shown in, for example, FIG. 2 or may have a configuration differing from this. Since a plurality of configurations can be applied in such a manner, a figure showing the structure of the second main surface side of n⁻ silicon substrate 1 is omitted.

The present embodiment is also formed so that stabilizing plate capacitor Cf formed between stabilizing plate 5b and n⁻ silicon substrate 1 has a capacitance greater than that of capacitor Cd on the drain side formed between gate electrode 5a and n⁻ silicon substrate 1. Thereby, it becomes possible to suppress oscillation at the time of short circuiting in the same manner as in the above described Embodiments 1 to 10.

Figure 26:
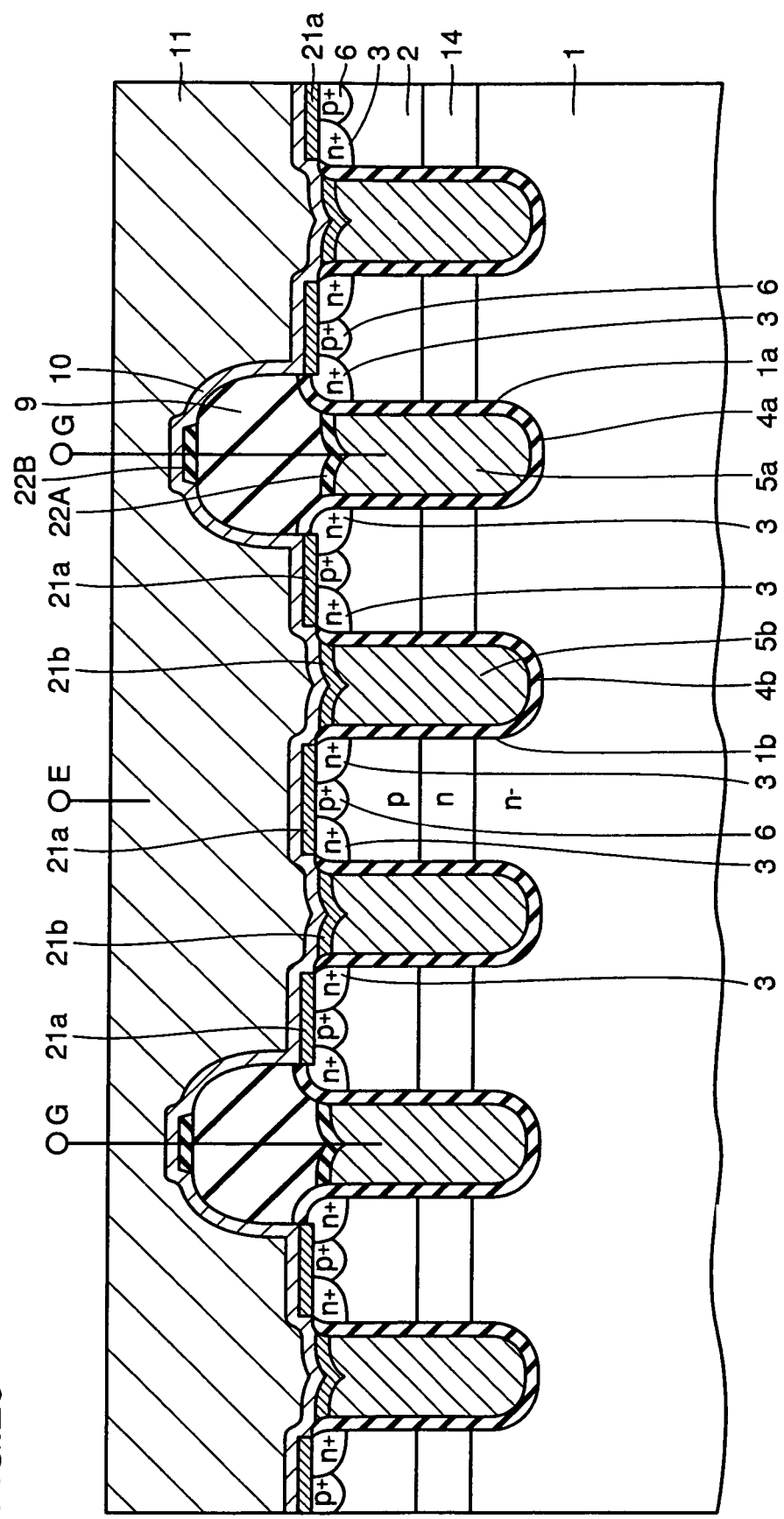

In the configuration of FIG. 25, a configuration as shown in FIG. 26 wherein an n⁺ impurity diffusion region 3 is added to a sidewall of trench 1b for an emitter that is in the first main surface may be adopted.

Figure 27:
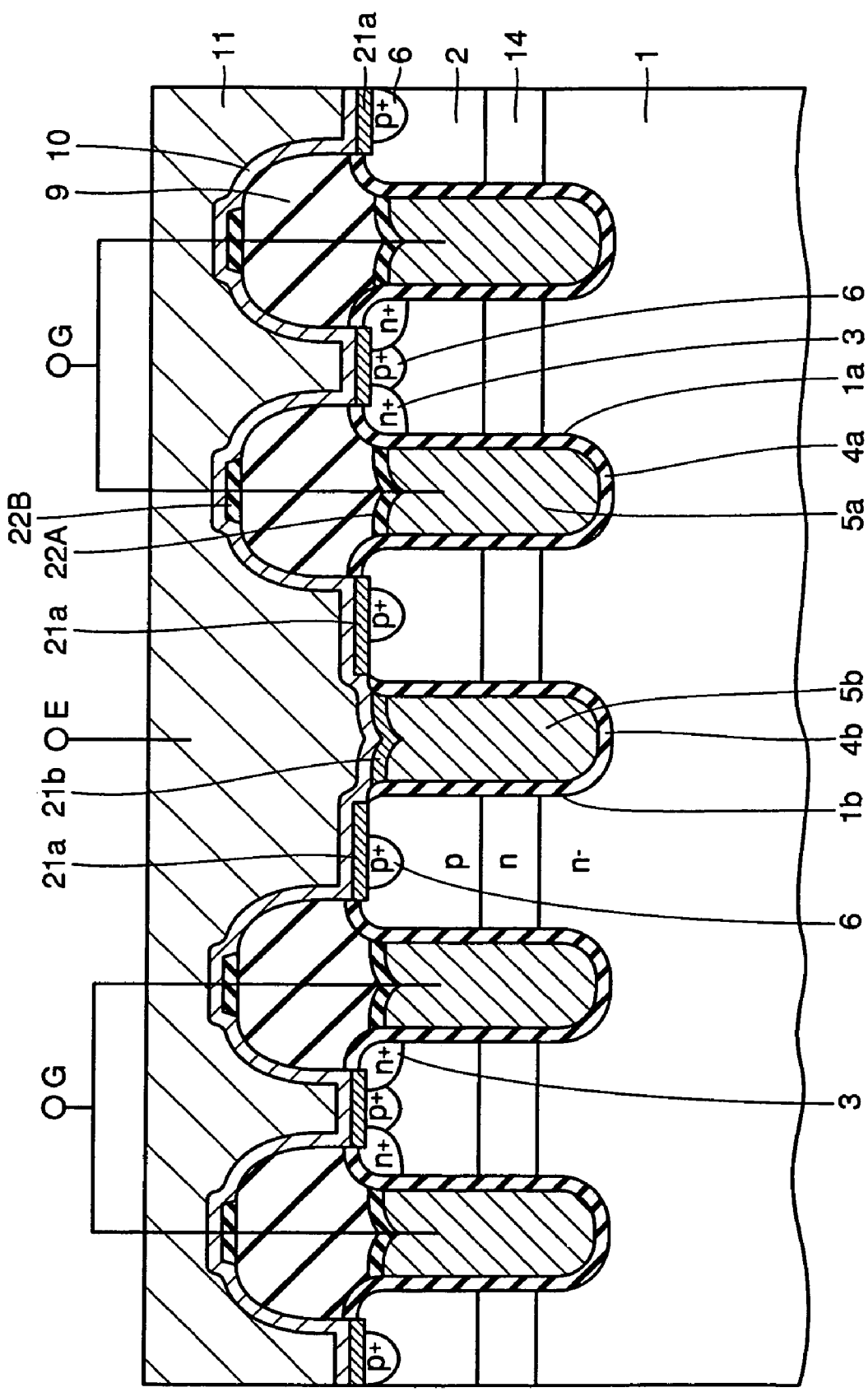

In addition, though in the configuration of FIG. 25, n-type emitter region 3 is provided on both sidewalls of trench 1a for a gate, n-type emitter region 3 may be provided only on one sidewall of trench 1a for a gate, as shown in FIG. 27. In addition, as shown in FIG. 27, only one stabilizing plate 5b may be arranged in a region sandwiched between the MOS transistor structures.

Figure 28:
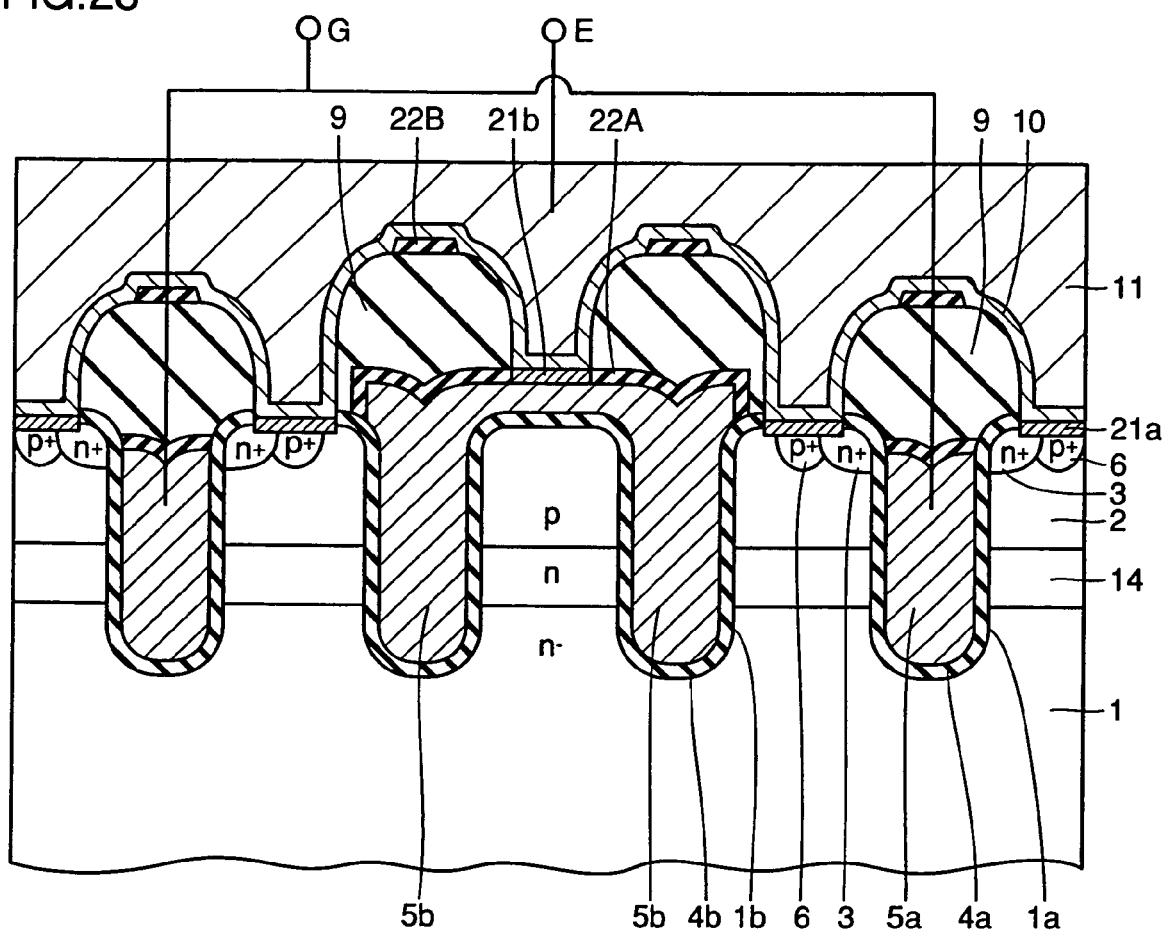

In addition, though in the configuration of FIG. 25, stabilizing plates 5b that fill in respective trenches 1b for emitters are formed as conductive layers separated from each other, a plurality of trenches 1b for emitters may be filled in with a stabilizing plate 5b made of a single integrated layer as shown in FIG. 28. In this case, stabilizing plate 5b is electrically connected to barrier metal layer 10 and to emitter electrode 11 via silicide layer 21 formed on bridge portions connecting portions within respective trenches 1b for emitters. In addition, insulating layers 22A, 9 and 22B are formed on stabilizing plate 5b in regions other than the regions on which silicide layer 21b is formed.

Figure 29:
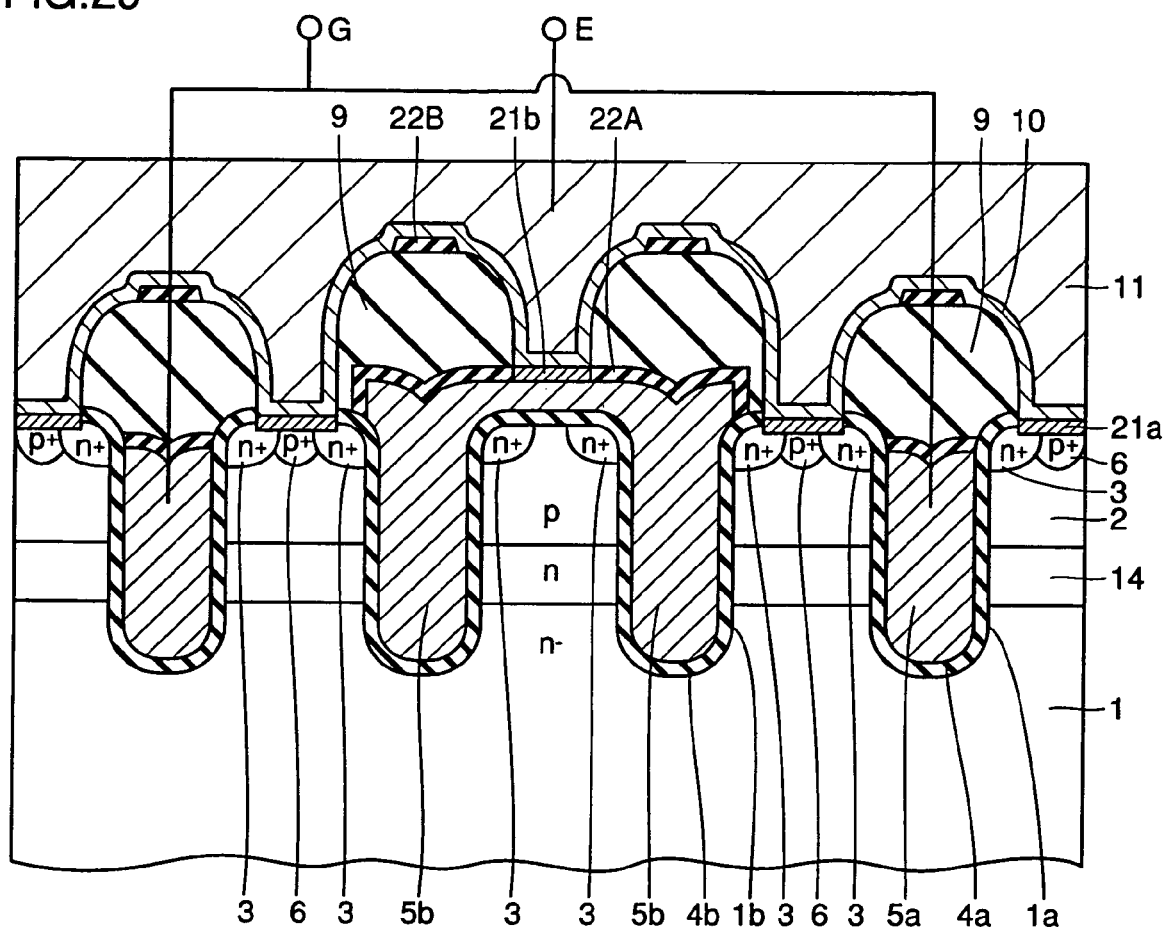

In addition, in the configuration of FIG. 28, a configuration as shown in FIG. 29 wherein an n⁺ impurity diffusion region 3 is added to a sidewall of trench 1b for an emitter that is in the first main surface, may be adopted.

Figure 30:
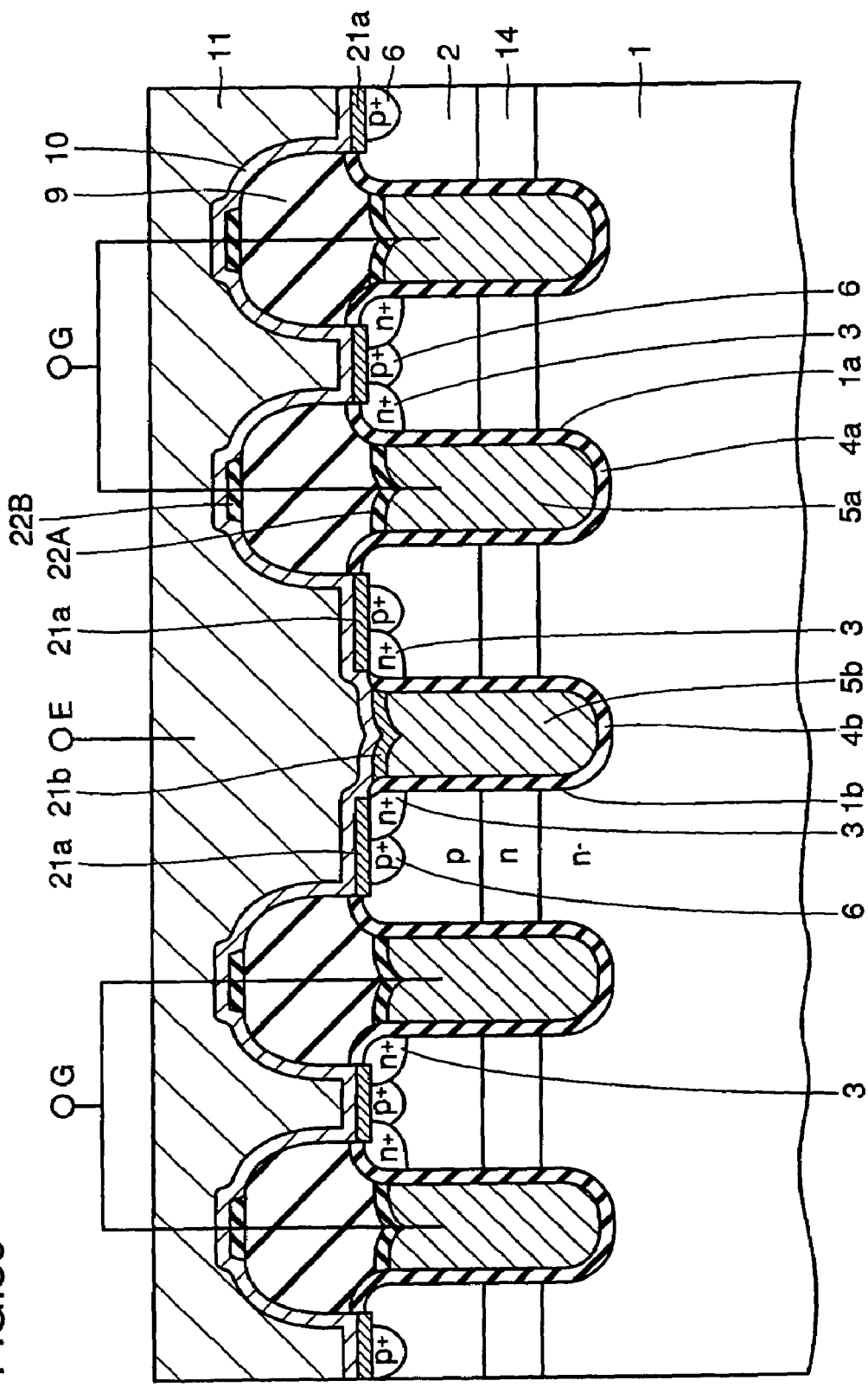

In addition, in the configuration of FIG. 27, also, a configuration as shown in FIG. 30 wherein an n⁺ impurity diffusion region 3 is added to a sidewall of trench 1b for an emitter that is in the first main surface, may be adopted.

Figure 31:
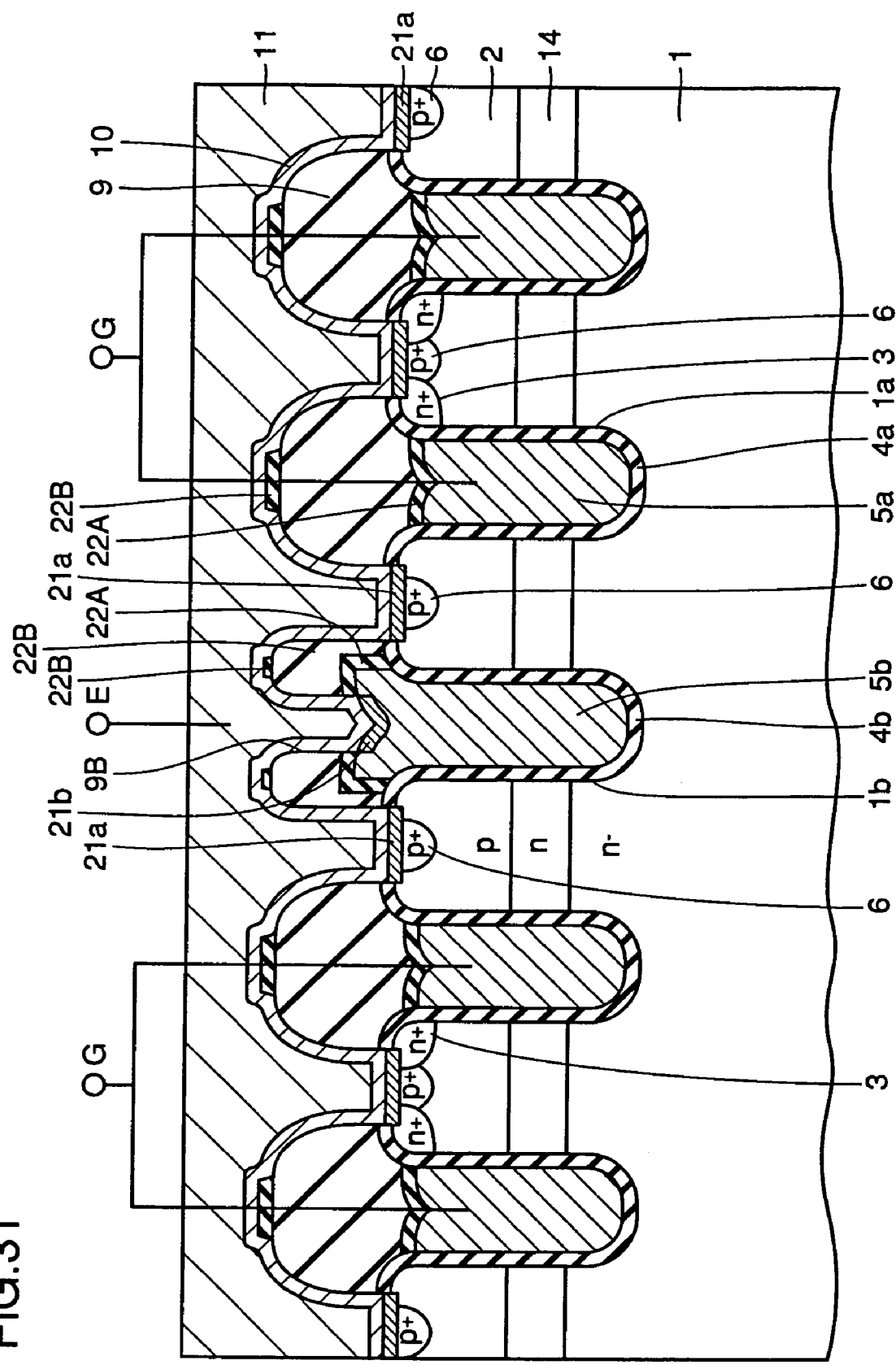

In addition, though in the configuration of FIG. 27, the upper surface of stabilizing plate 5b is positioned within trench 1b for an emitter, it may stick out in an upward direction from trench 1b for an emitter as shown in FIG. 31. In this case, silicide layer 21b is formed in a portion wherein emitter electrode 11 is connected to stabilizing plate 5b while insulating layers 22A, 9 and 22B are formed on the other portions.

Figure 32:
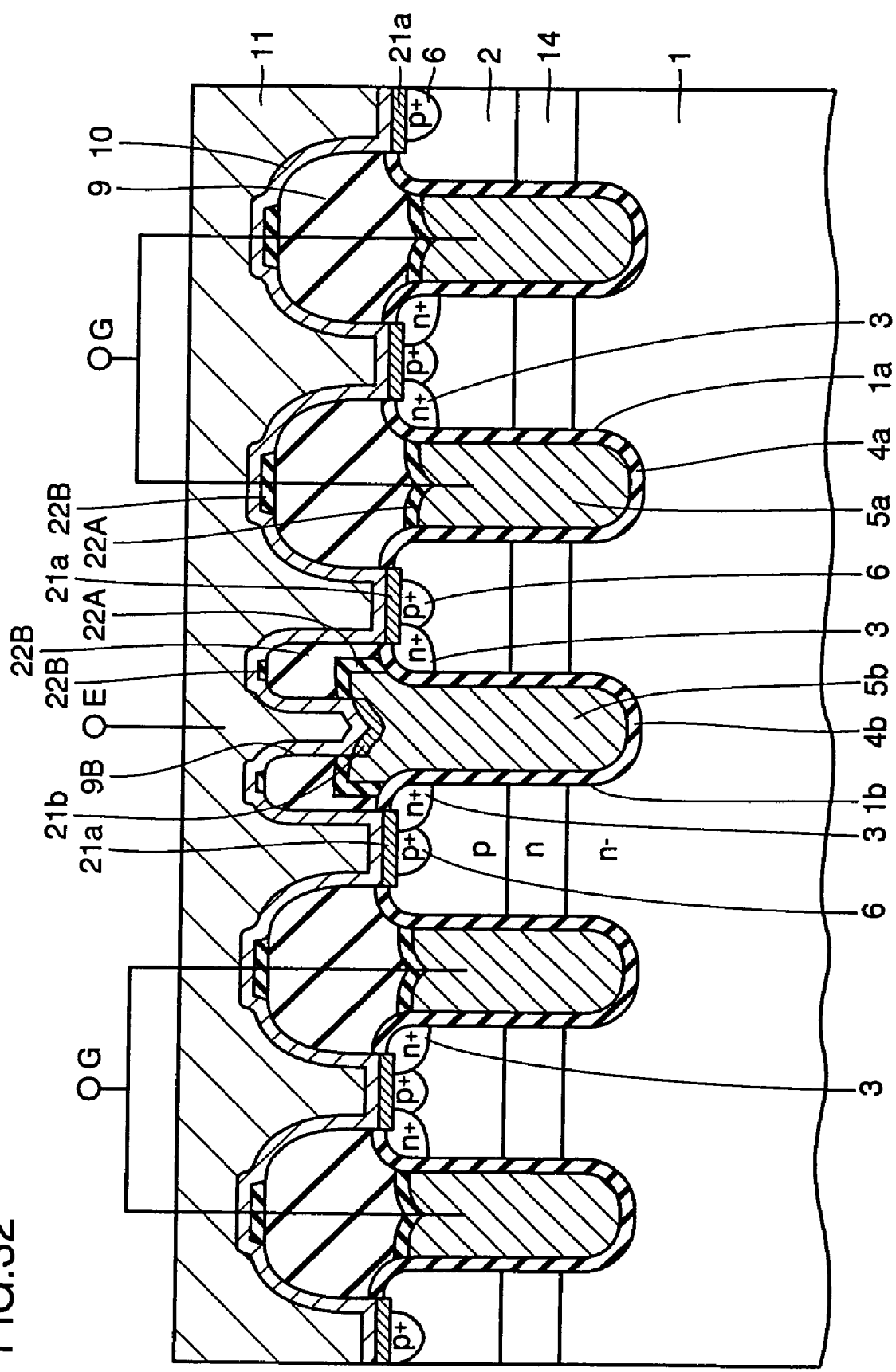

In addition, in the configuration of FIG. 31, a configuration as shown in FIG. 32 wherein an n⁺ impurity diffusion region 3 is added to a sidewall of trench 1b for an emitter that is in the first main surface, may be adopted.

Figure 33:
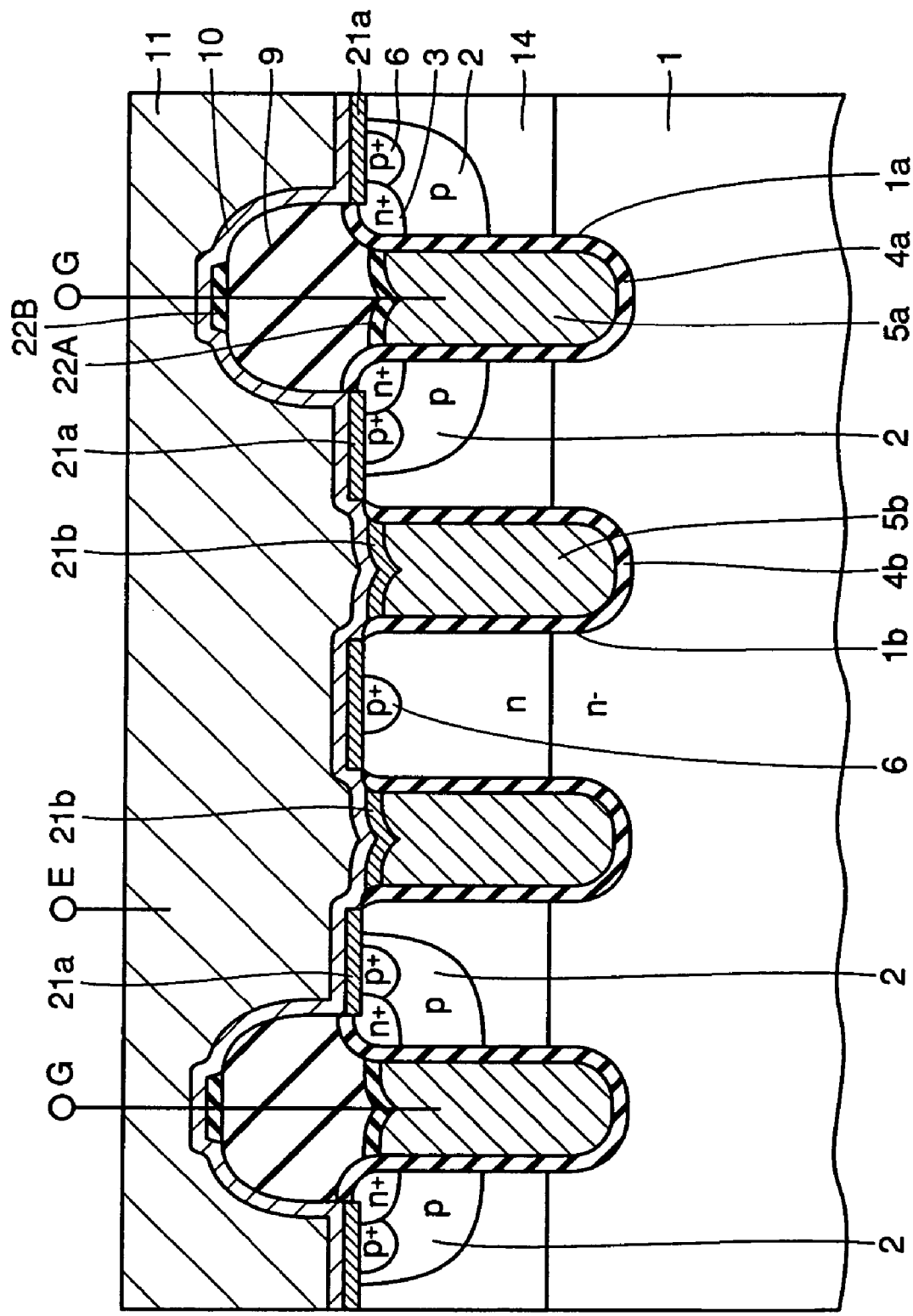

In addition, though in the configuration of FIG. 25, a configuration wherein p-type body region 2 is uniformly distributed over the entirety of the first main surface, it may be positioned on only a sidewall portion of trench 1a for a gate as shown in FIG. 33.

Figure 34:
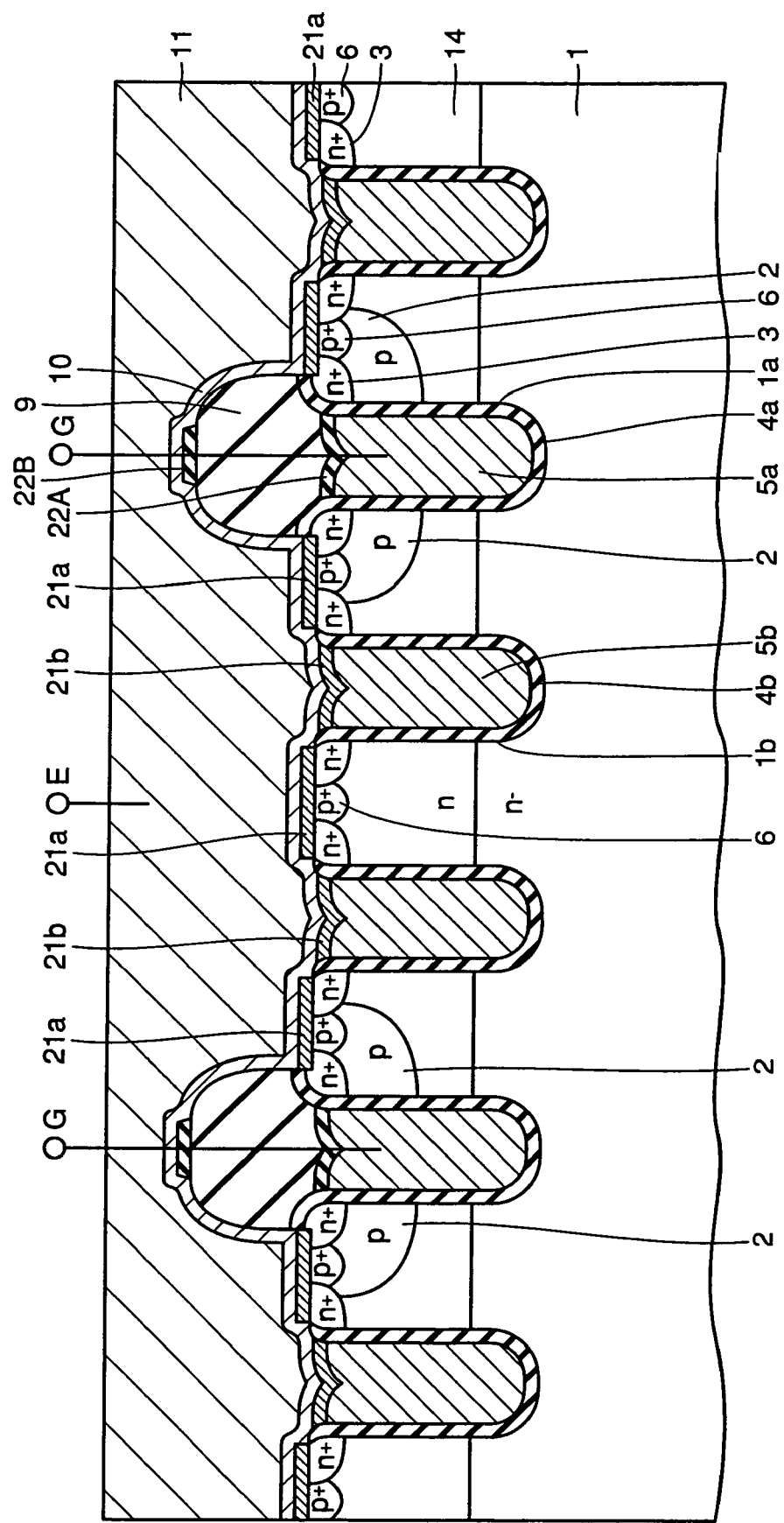

In addition, in the configuration of FIG. 33, a configuration as shown in FIG. 34 wherein an n⁺ impurity diffusion region 3 is added to a sidewall of trench 1b for an emitter that is in the first main surface, may be adopted.

Figure 35:
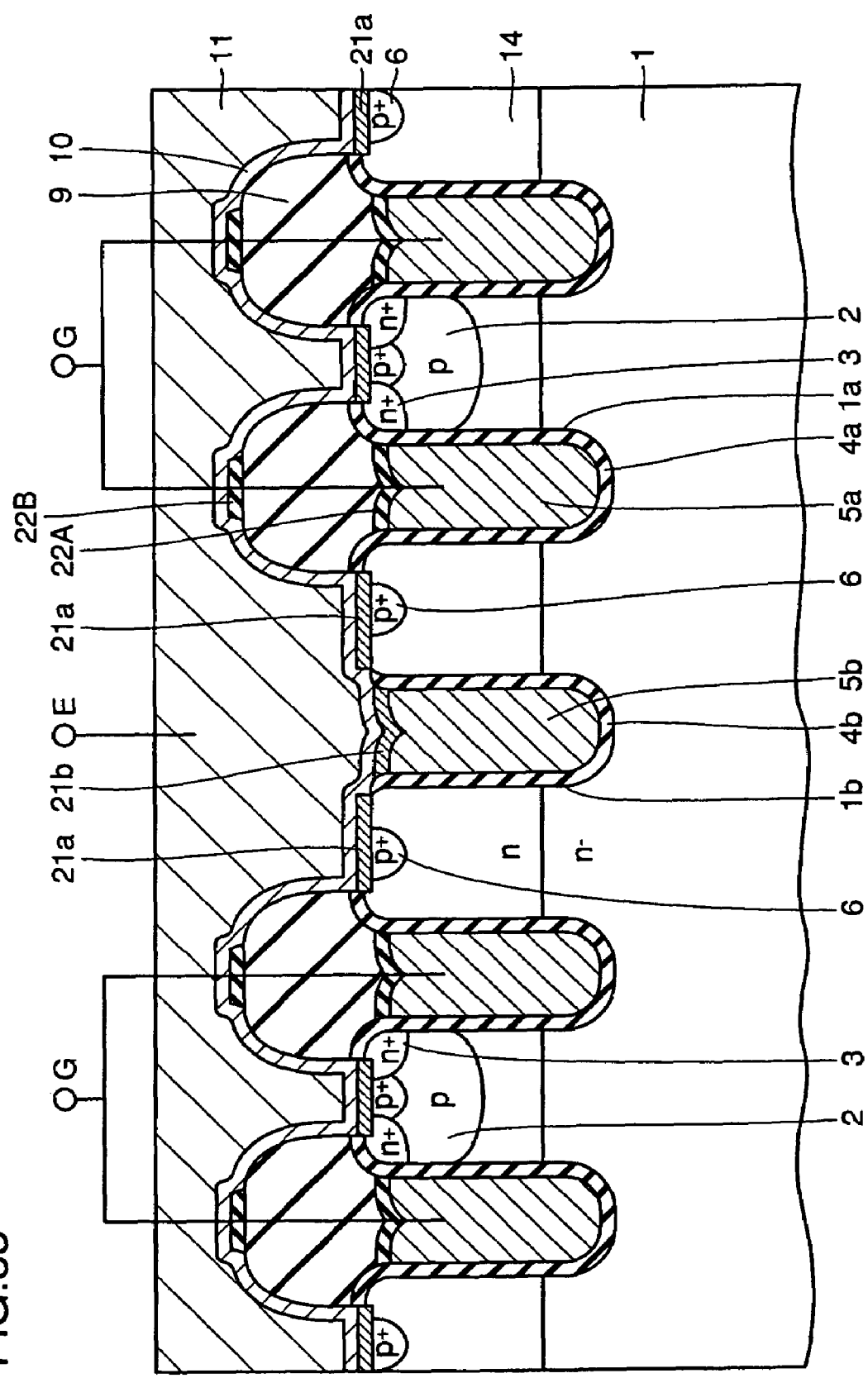

In addition, though in the configuration of FIG. 27, also, a configuration wherein p-type body region 2 is uniformly distributed over the entirety of the first main surface, it may be positioned on only a sidewall portion of trench 1a for a gate as shown in FIG. 35.

Figure 36:
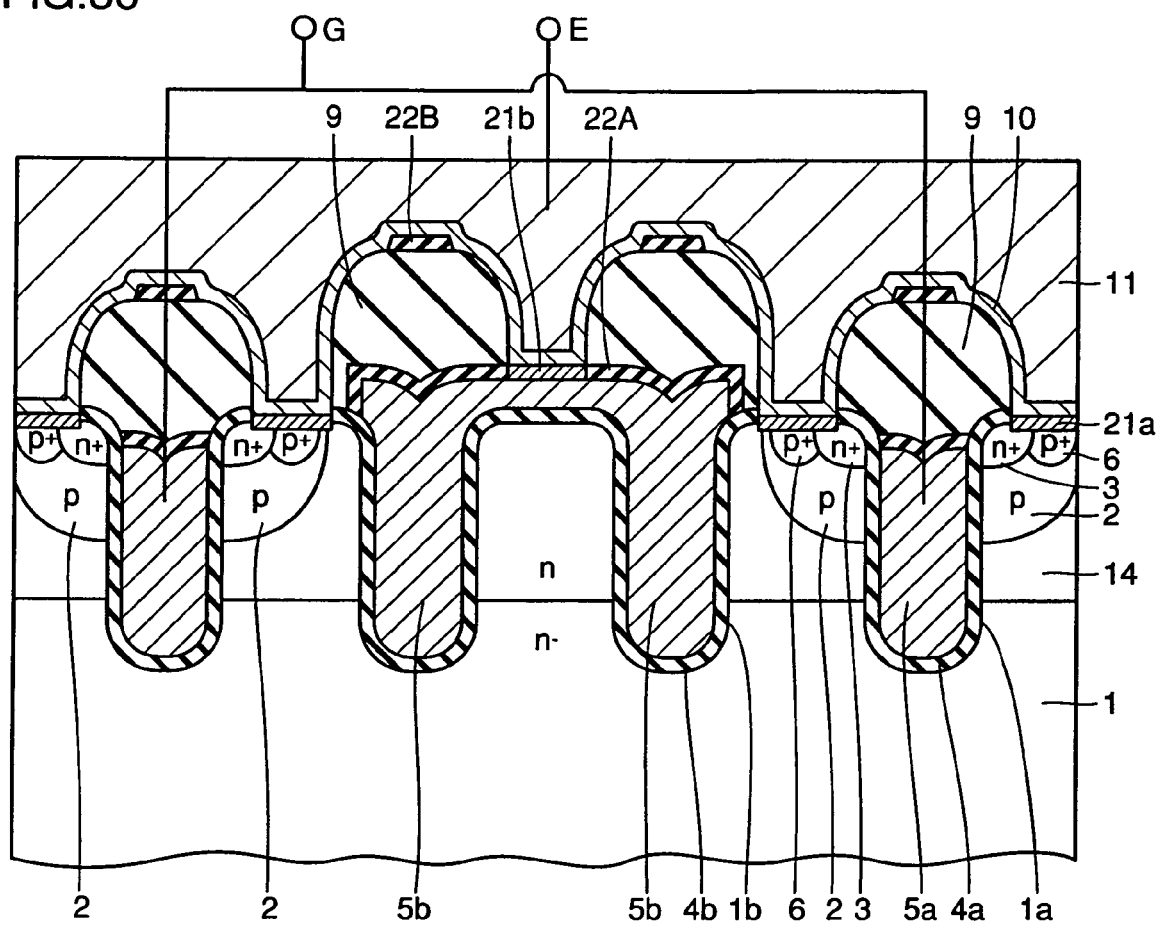

In addition, though in the configuration of FIG. 28, also, a configuration wherein p-type body region 2 is uniformly distributed over the entirety of the first main surface, it may be positioned on only a sidewall portion of trench 1a for a gate as shown in FIG. 36.

Figure 37:
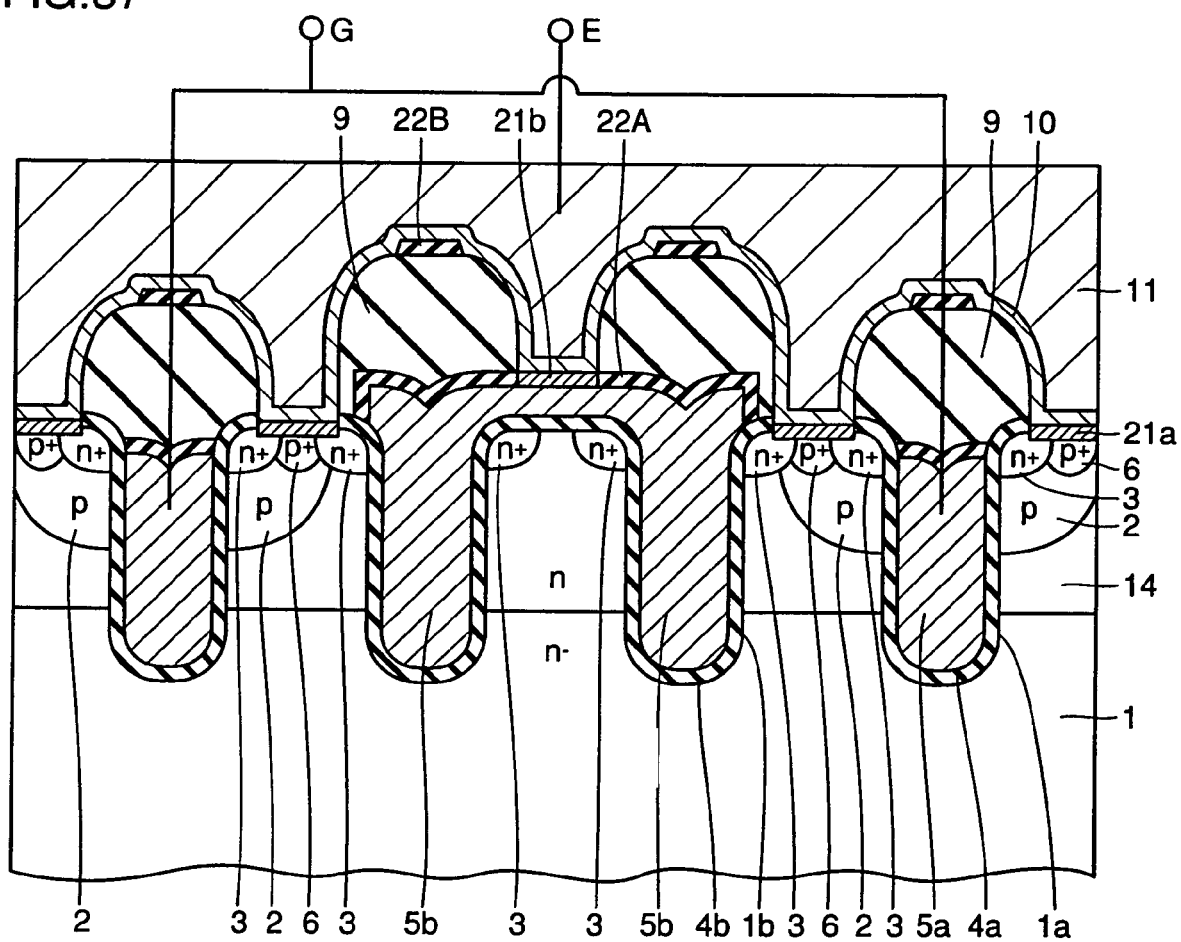

In addition, in the configuration of FIG. 36, a configuration as shown in FIG. 37 wherein an n⁺ impurity diffusion region 3 is added to a sidewall of trench 1b for an emitter that is in the first main surface, may be adopted.

Figure 38:
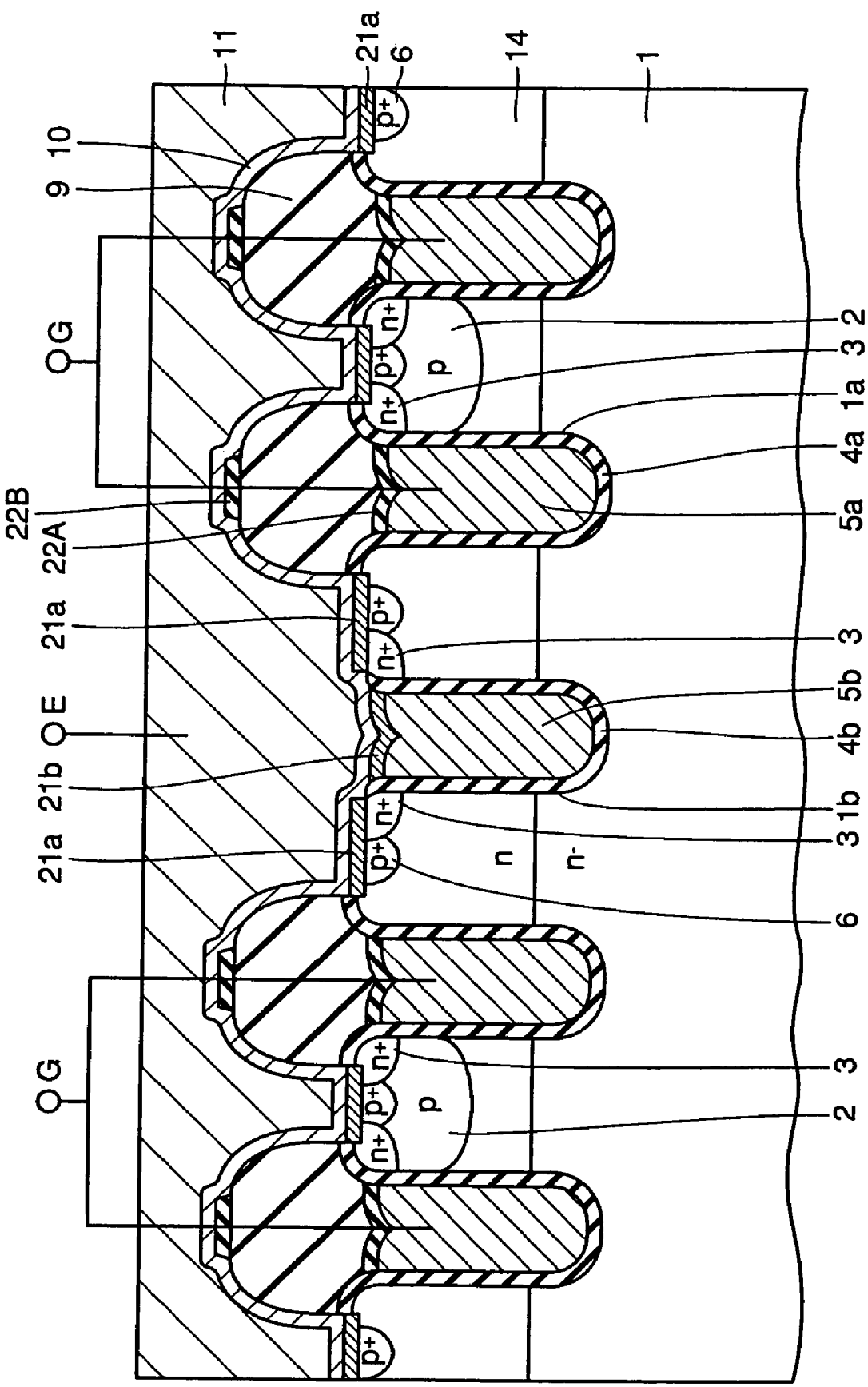

In addition, in the configuration of FIG. 35, also, a configuration as shown in FIG. 38 wherein an n+ impurity diffusion region 3 is added to a sidewall of trench 1b for an emitter that is in the first main surface, may be adopted.

Figure 39:
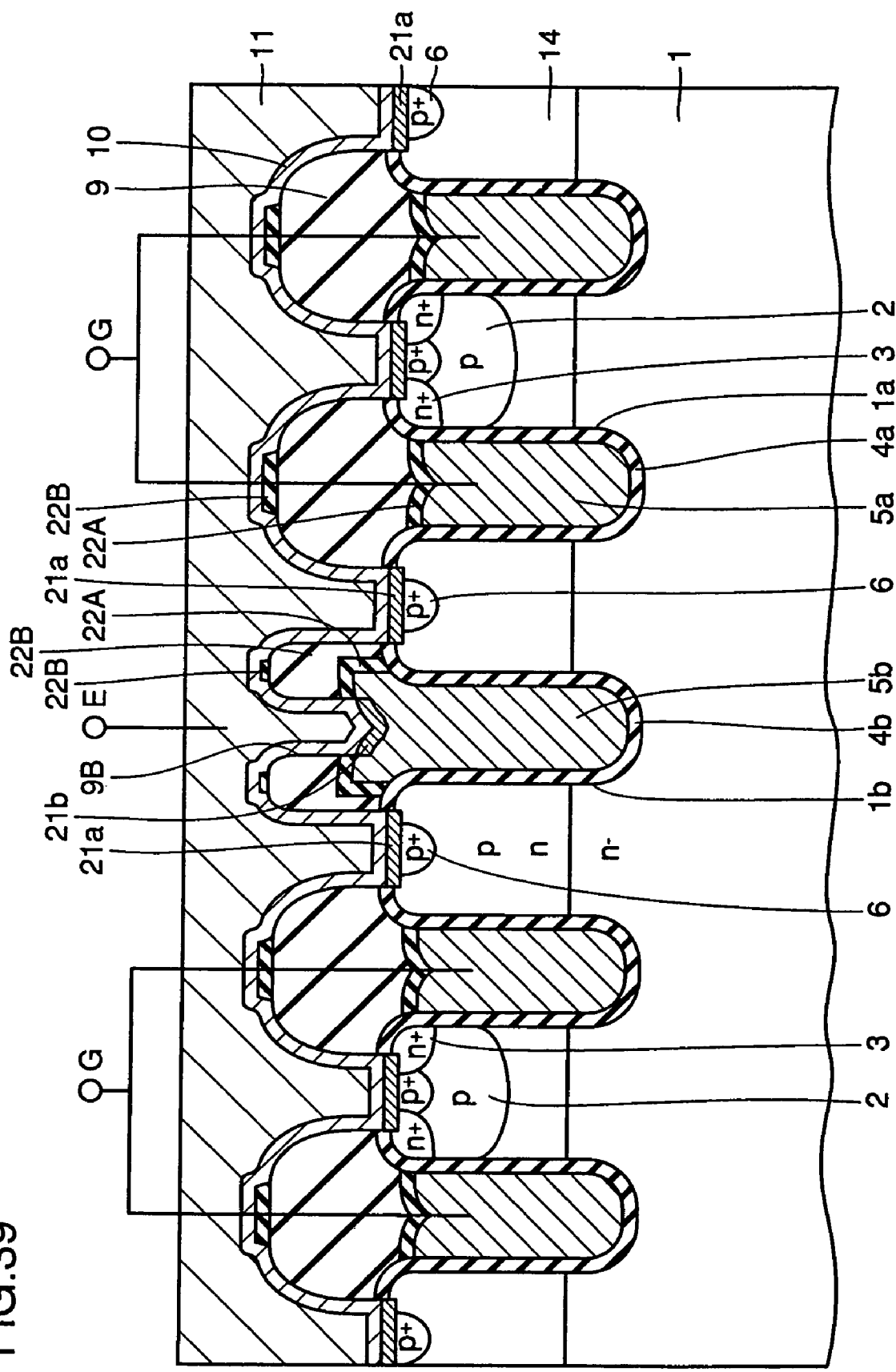

In addition, though in the configuration of FIG. 31, a configuration wherein p-type body region 2 is uniformly distributed over the entirety of the first main surface, it may be positioned on only a sidewall portion of trench 1a for a gate as shown in FIG. 39.

Figure 40:
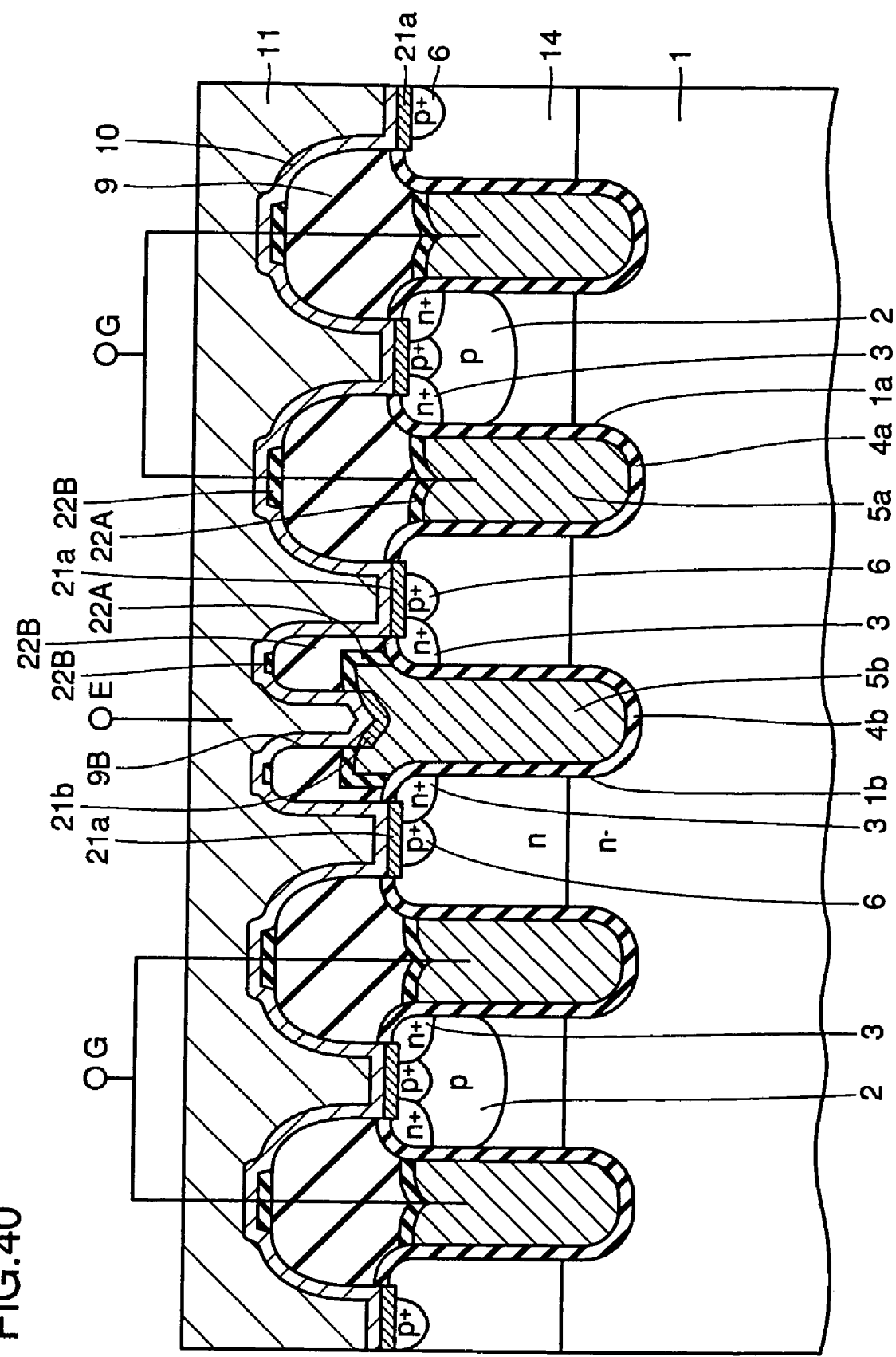
Figure 41:
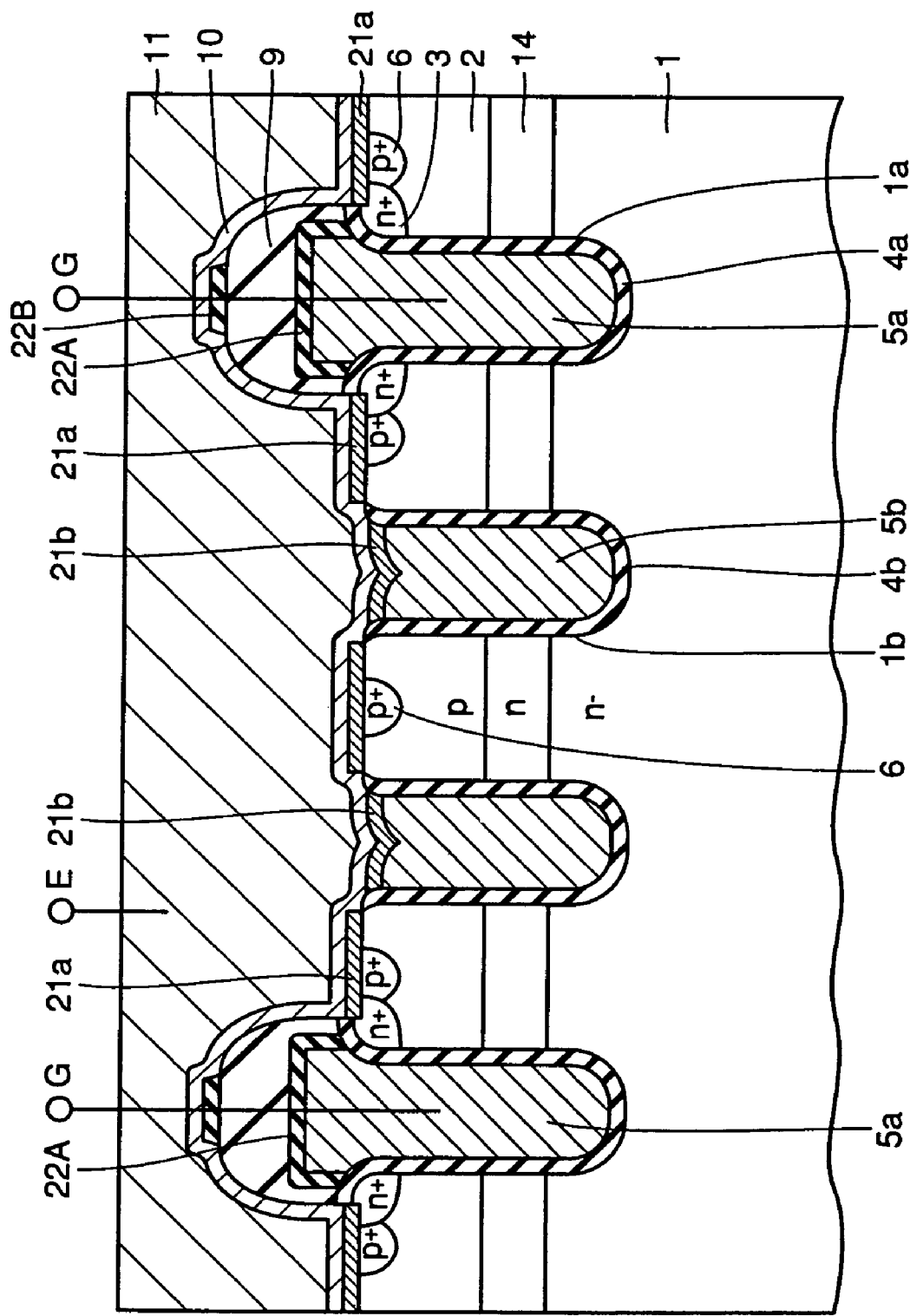
Figure 42:
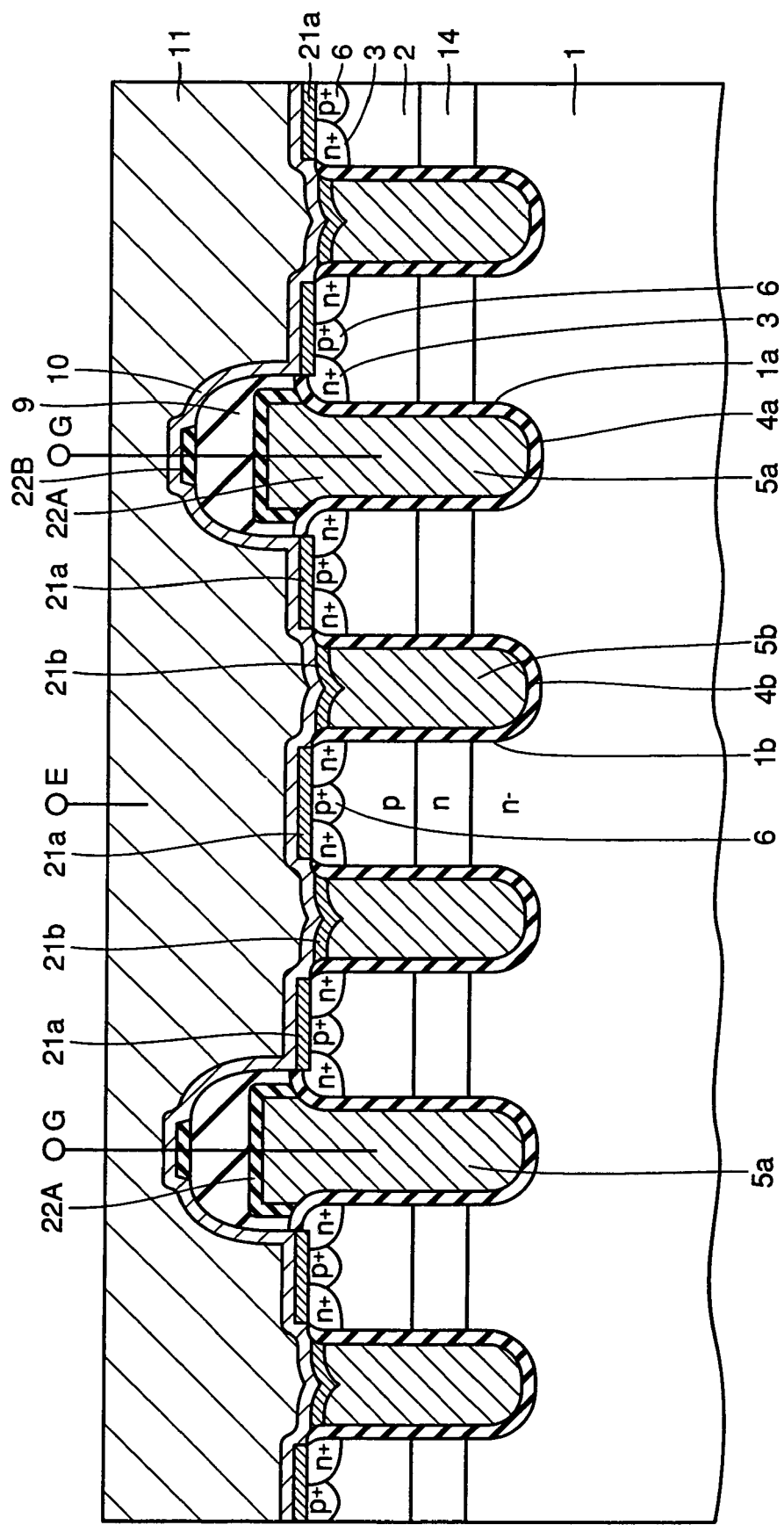
Figure 43:
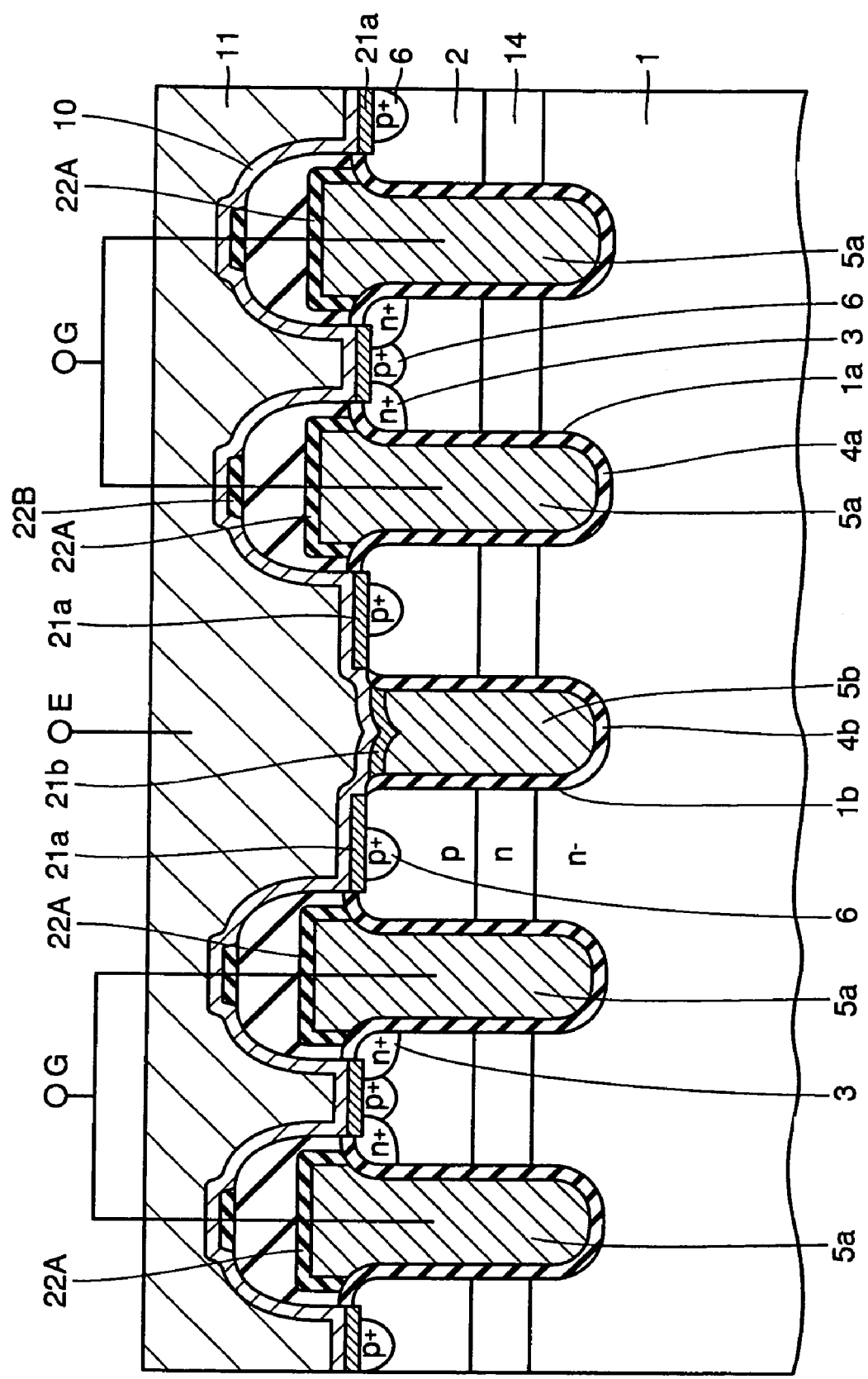
Figure 44:
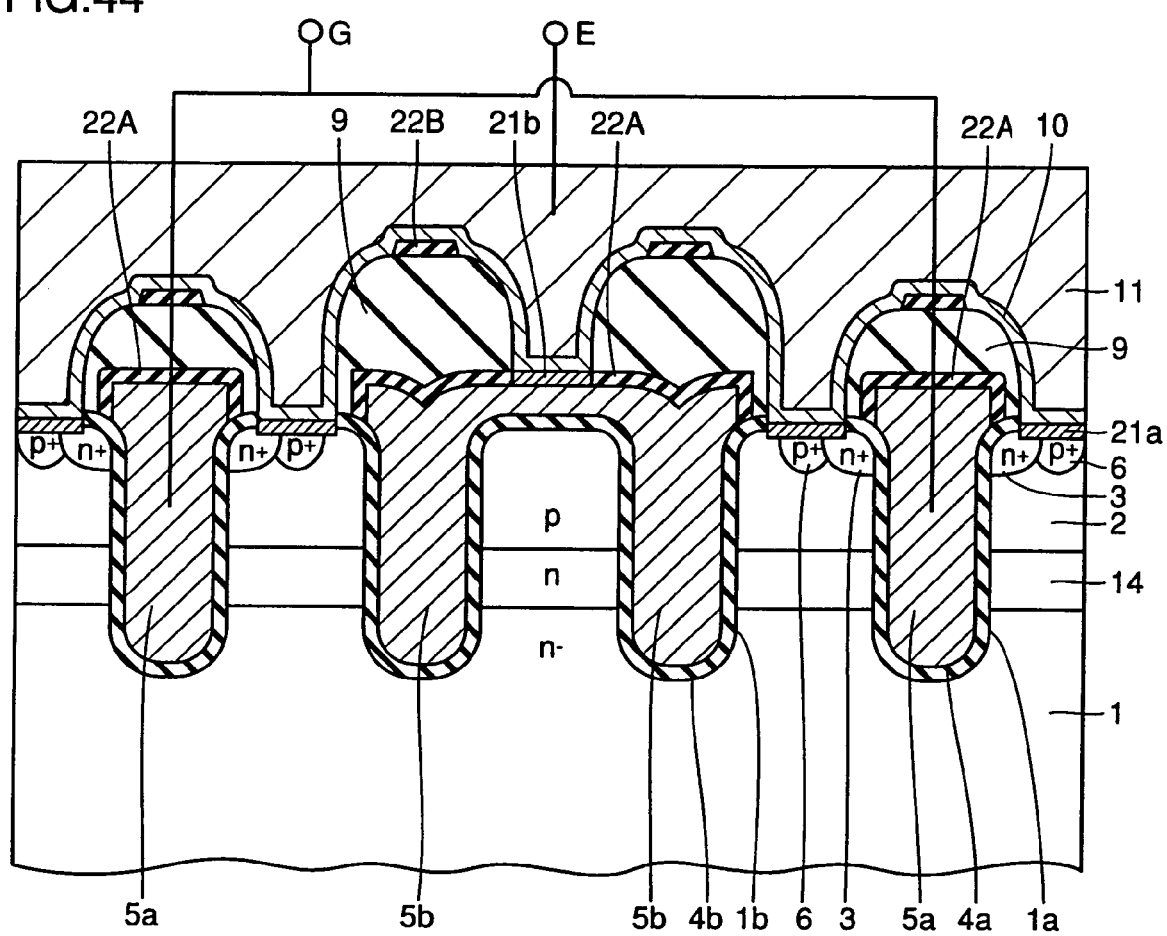
Figure 45:
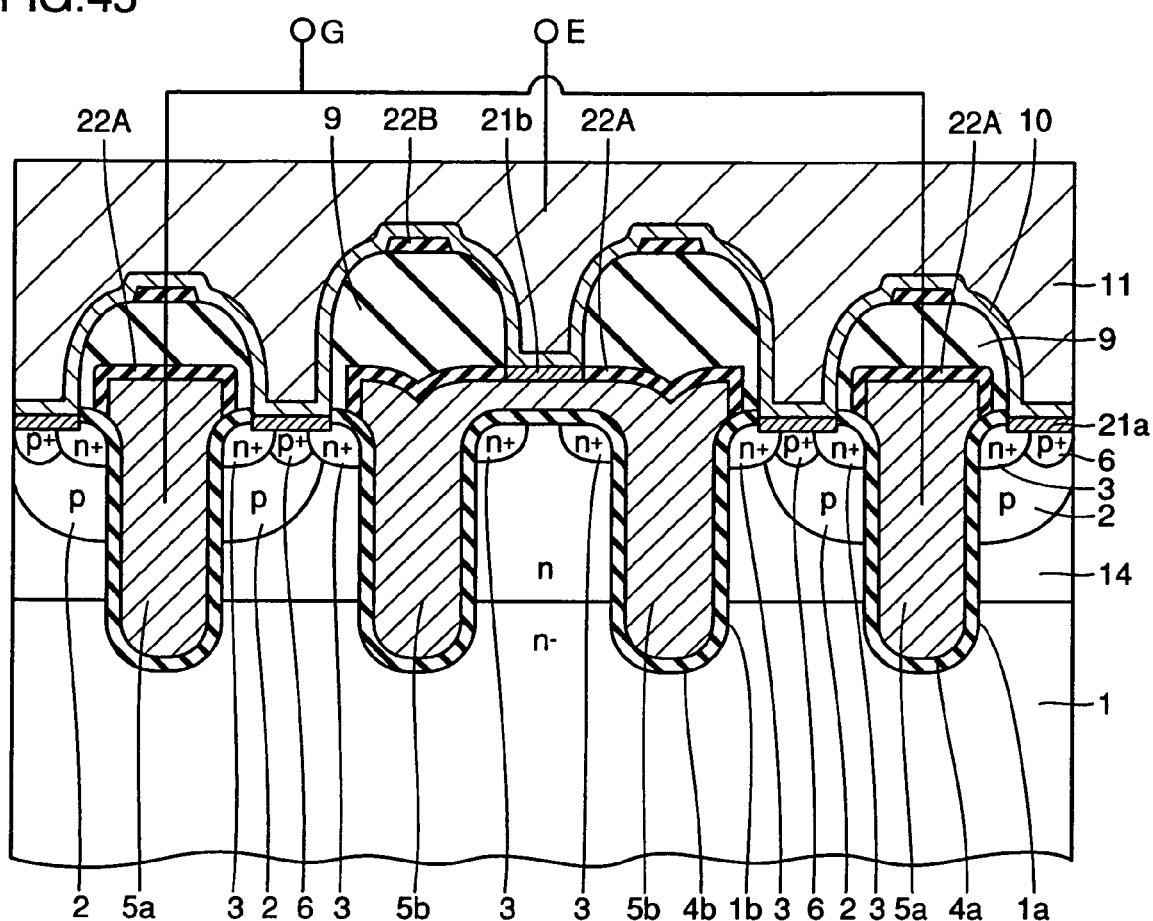
Figure 46:
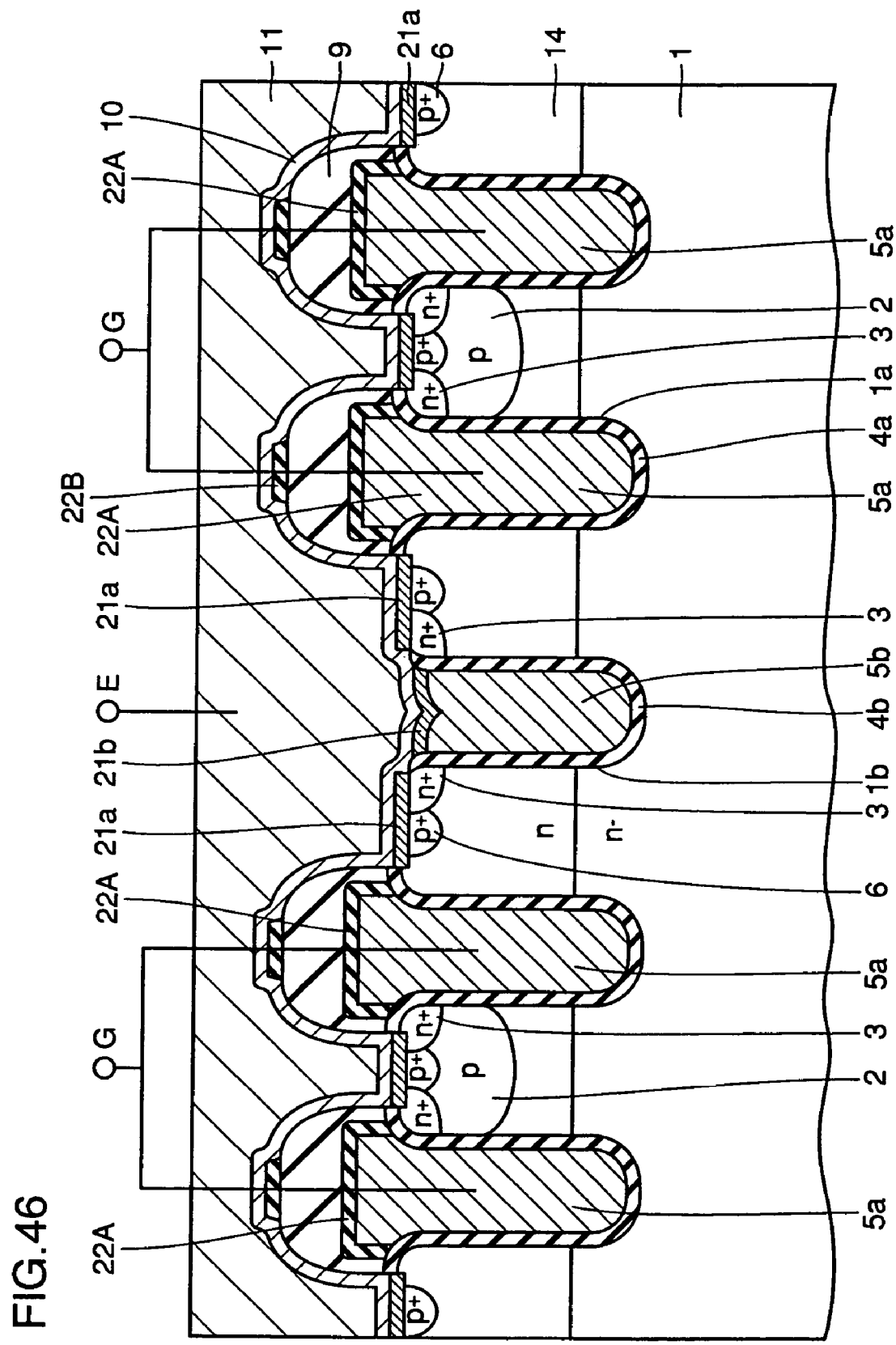
Figure 47:
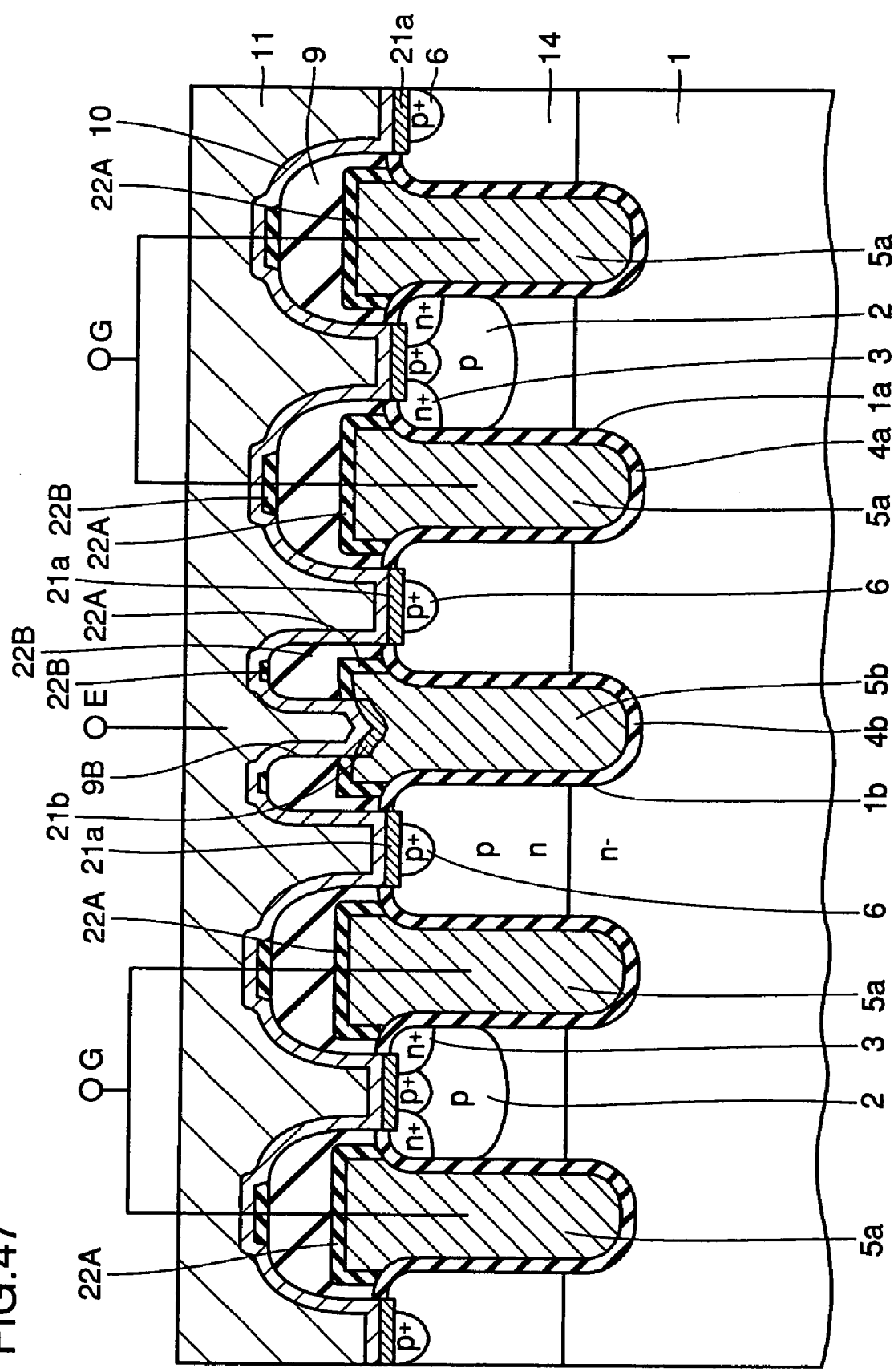
Figure 48:
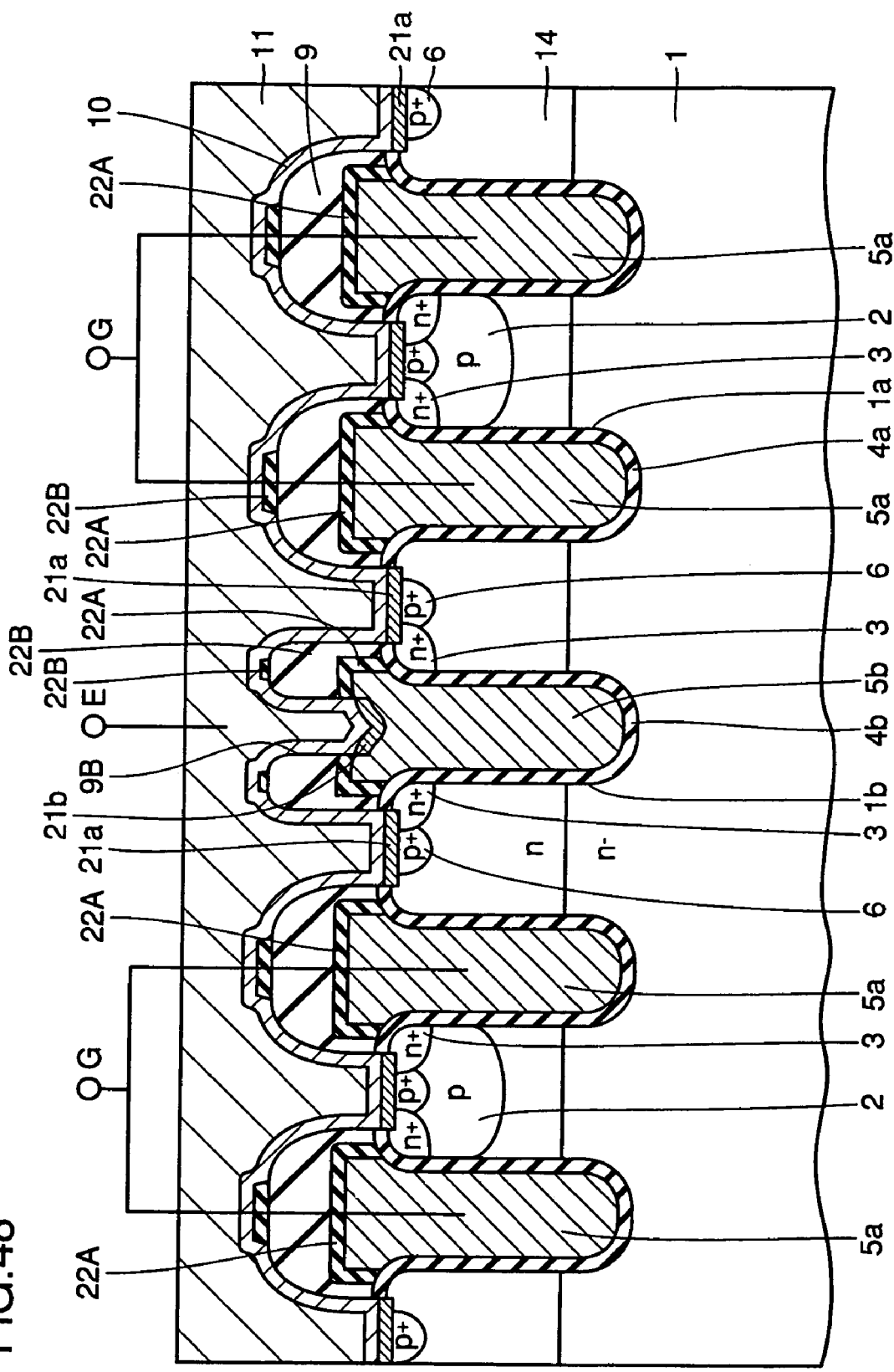

In addition, in the configuration of FIG. 39, a configuration as shown in FIG. 40 wherein an n+ impurity diffusion region 3 is added to a sidewall of trench 1b for an emitter that is in the first main surface, may be adopted.

In addition, though in the structures shown in FIGS. 25 to 40, cases are described wherein the upper surface of gate electrode 5a is positioned within trench 1a for a gate, it may stick out above trench 1a for a gate. The configurations wherein the upper surface of gate electrode 5a sticks out above trench 1a for a gate are shown in FIGS. 41 to 49. The configuration of FIG. 41, corresponding to the configuration of FIG. 25, the configuration of FIG. 42, corresponding to the configuration of FIG. 26, the configuration of FIG. 43, corresponding to the configuration of FIG. 27, the configuration of FIG. 44, corresponding to the configuration of FIG. 28, the configuration of FIG. 45, corresponding to the configuration of FIG. 37, the configuration of FIG. 46, corresponding to the configuration of FIG. 38, the configuration of FIG. 47, corresponding to the configuration of FIG. 39, the configuration of FIG. 48, corresponding to the configuration of FIG. 40, are altered so that the upper surface of gate electrode 5a sticks out above trench 1a for a gate.

Figure 49:
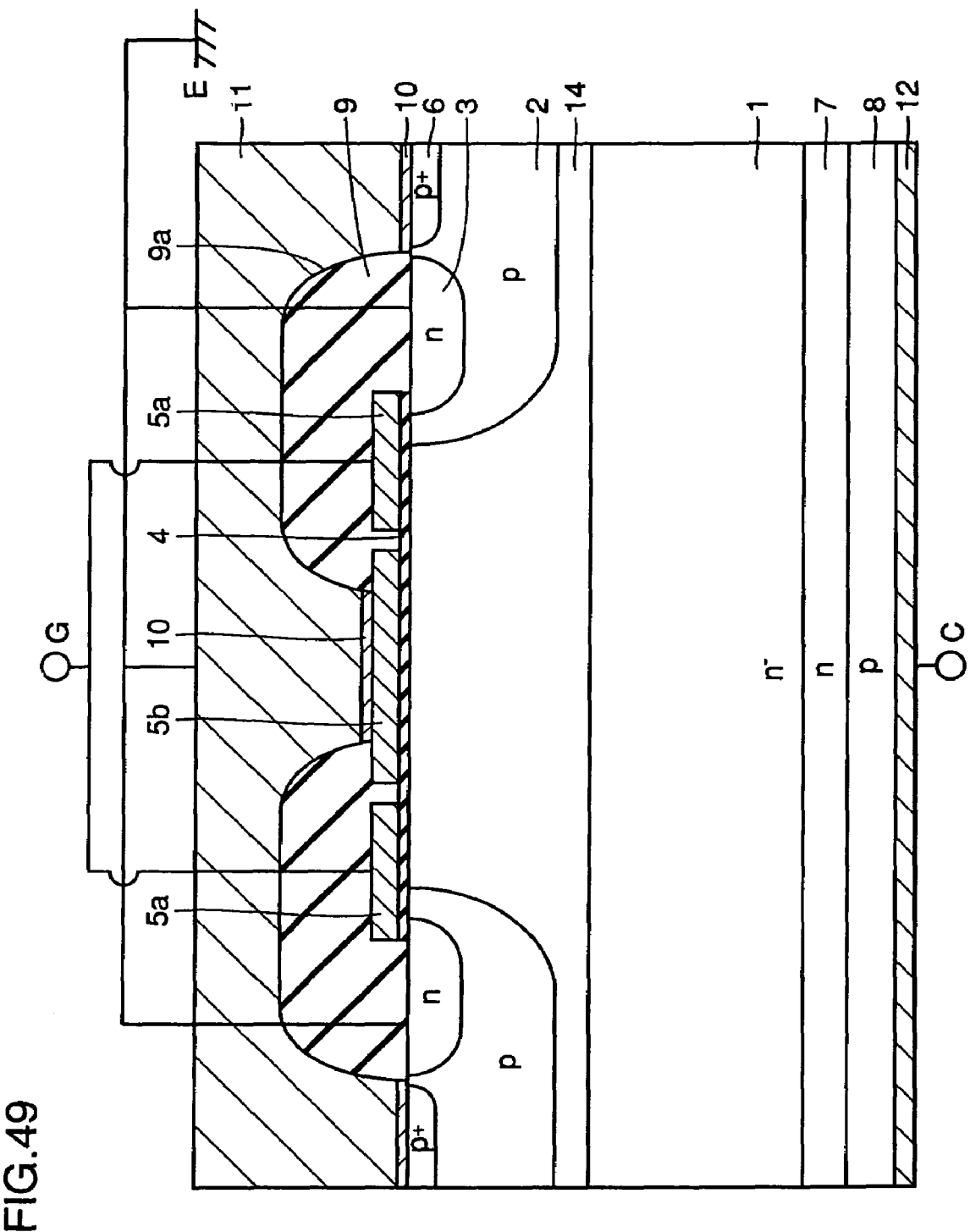

In addition, the concentration on the first main surface side of n− silicon substrate 1 may be of a high concentration in the plane gate structure shown in FIG. 8. For example, n-type impurity diffusion region 14 of a high concentration may be formed on the first main surface side of n− silicon substrate 1 as shown in FIG. 49. Thereby, stabilizing plate capacitor Cf can be given a large capacitance and oscillation at the time of short circuiting can be further suppressed.

Figure 50:
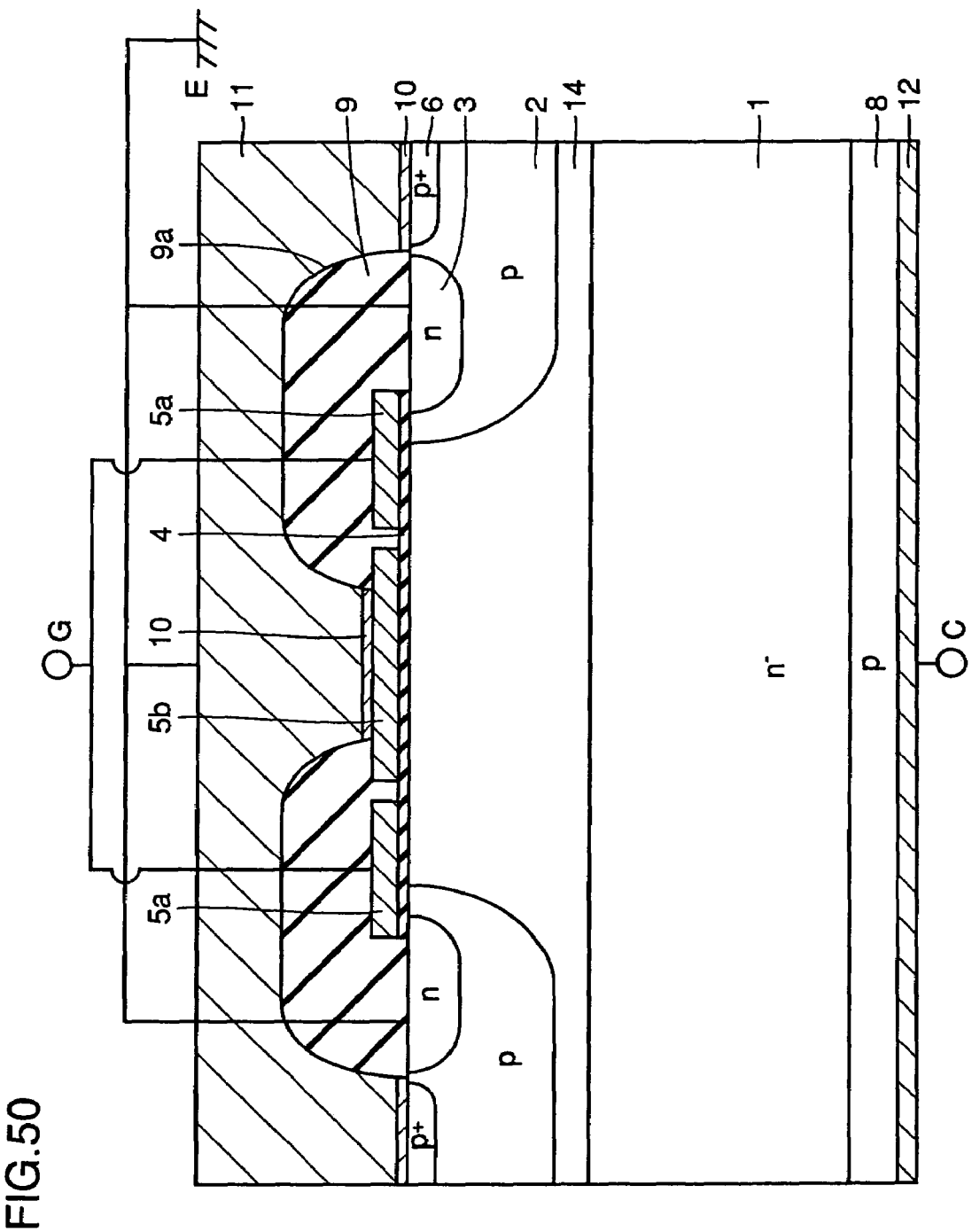
Figure 51:
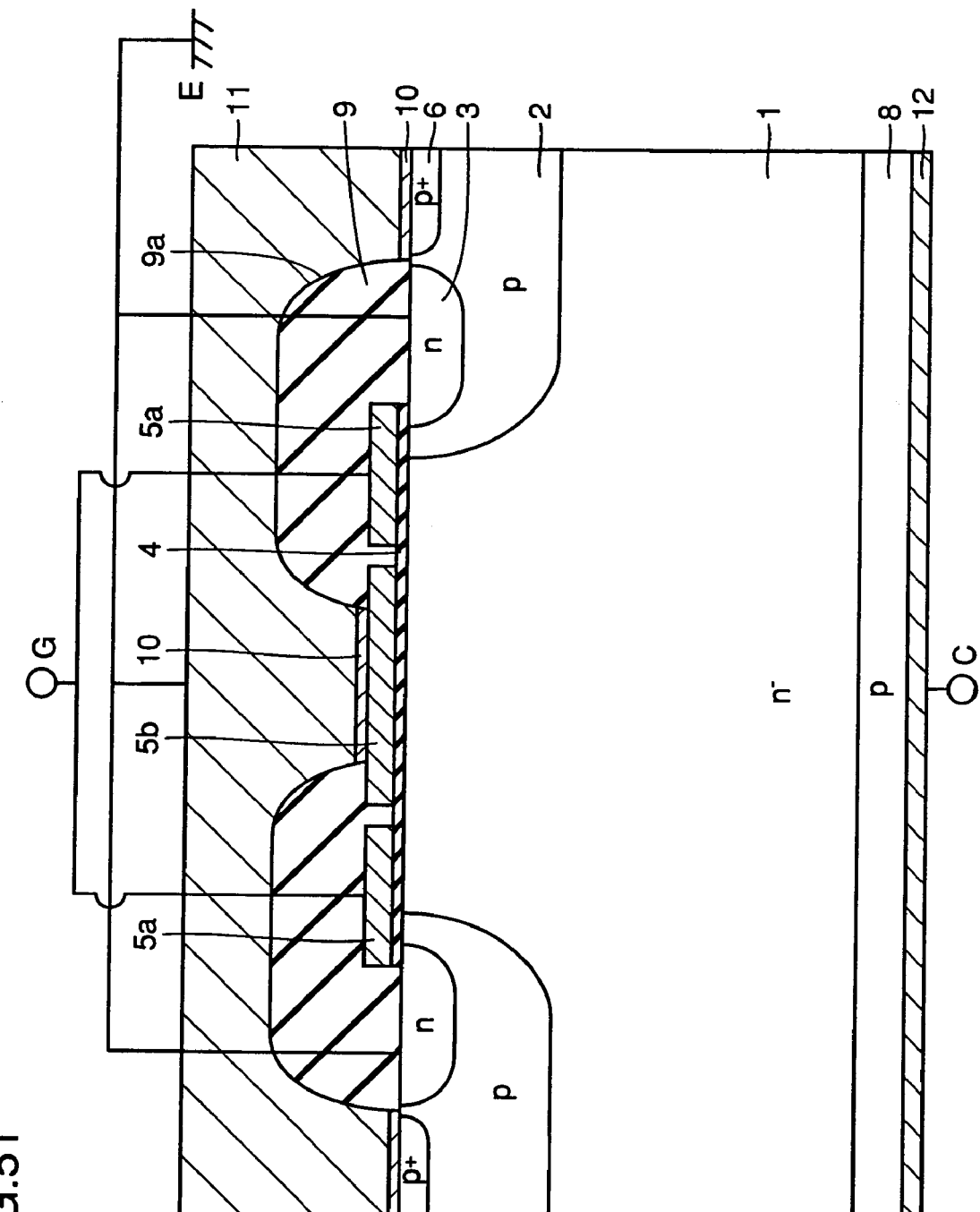

In addition, the configuration of FIG. 49 may be converted to the configuration shown in FIG. 50 by omitting n-type buffer region 7. In addition, the configuration shown in FIG. 8 may be converted to the configuration shown in FIG. 51 by omitting n-type buffer region 7.

Furthermore, though cases wherein n-type buffer region 7 exists are shown in the above with respect to the trench MOS gate structure having an emitter trench (stabilizing plate) of the present invention, the same effects can be gained in the configuration wherein n-type buffer region 7 is omitted.

Here, though in the above described Embodiments 1 to 10, as well as in other embodiments, cases are described wherein stabilizing plate capacitor Cf has a capacitance greater than that of capacitor Cd on the drain side, effects of oscillation suppression can be gained even in the case that stabilizing plate capacitor Cf has a capacitance greater than 20% of that of capacitor Cd on the drain side.

In addition, though a case is described wherein gate electrode 5a and stabilizing plate 5b are conductors, gate electrode 5a and stabilizing plate 5b may be semiconductors.

In addition, though an IGBT is described in the above, it is possible to apply the present invention to the all of the elements having an insulating gate type field effect transistor portion.

The embodiments disclosed herein should be considered illustrative from all points of view and are not limitative. The scope of the present invention is not defined by the above description but, rather, is defined by the claims and is intended to include the meanings equivalent to the claims and all modifications within the scope.

INDUSTRIAL APPLICABILITY

The present invention relates to the structure of a high voltage withstanding element, in particular, to the structure of an IGBT and, specifically, the effects thereof can be exercised to the maximum in a trench gate IGBT. In addition, the present invention can be advantageously applied to a semiconductor device, and to a manufacturing method for the same, so that suppression of current causing short circuiting, reduction of gate capacitance, suppression of oscillation at the time of short circuiting and reduction in loss are simultaneously achieved.

The invention claimed is:

1. A semiconductor device, characterized by comprising:
   a semiconductor substrate having a first main surface and a second main surface which are opposed to each other;
   first and second insulating gate type field effect transistor portions respectively having source regions and drain regions, which are opposed to each other sandwiching channel formation regions, and gate electrodes which are opposed to said channel formation regions sandwiching gate insulating films;
   a first stabilizing plate, made of a conductor or of a semiconductor, which is opposed to said drain region of said first insulating gate type field effect transistor portion sandwiching a first insulating film for a plate and that forms, together with said drain region of said first insulating gate type field effect transistor portion, a capacitor; and
   a second stabilizing plate, made of a conductor or of a semiconductor, which is opposed to said drain region of said second insulating gate type field effect transistor portion sandwiching a second insulating film for a plate and that forms, together with said drain region of said second insulating gate type field effect transistor portion, a capacitor,
   wherein said first insulating gate type field effect transistor portion is formed on said first main surface while said second insulating gate type field effect transistor portion is formed in said second main surface and a current is allowed to flow between said first and second insulating gate type field effect transistor portions.

2. The semiconductor device according to claim 1, characterized in that
   a first stabilizing plate capacitor formed between said first stabilizing plate and said drain region of said first insulating gate type field effect transistor portion has a capacitance greater than that of a first gate-drain capacitor formed between said gate electrode and said drain region of said first insulating gate type field effect transistor portion, and
   a second stabilizing plate capacitor formed between said second stabilizing plate and said drain region of said second insulating gate type field effect transistor portion has a capacitance greater than that of a second gate-drain capacitor formed between said gate electrode and said drain region of said second insulating gate type field effect transistor portion.

3. The semiconductor device according to claim 1, characterized in that
   a plurality of transistors of the same type as said first insulating gate type field effect transistor is arranged side by side and two or more plates of the same type as said first stabilizing plate are arranged in a region sandwiched between two of said first insulating gate type field effect transistors, a plurality of transistors of the same type as said second insulating gate type field effect transistor is arranged side by side and two or more plates of the same type as said second stabilizing plate are arranged in a region sandwiched between two of said second insulating gate type field effect transistors and in that the impurity concentration of a region in said drain region sandwiched between said two or more first stabilizing plates and the impurity concentration of a region in said drain region sandwiched between said two or more second stabilizing plates are higher than the impurity concentration of the other regions in said drain region.

4. The semiconductor device according to claim 1, characterized in that said semiconductor substrate has a first trench for a gate created in said first main surface and a second trench for a gate created in said second main surface, said gate electrode of said first insulating gate type field effect transistor portion fills in said first trench for a gate and said gate electrode of said second insulating gate type field effect transistor portion fills in said second trench for a gate.

5. The semiconductor device according to claim 4, characterized in that said gate electrode of said first insulating gate type field effect transistor portion has two sides opposed to each other and is opposed to said channel formation region of said first insulating gate type field effect transistor portion in each of said two sides and said gate electrode of said second insulating gate type field effect transistor portion has two sides opposed to each other and is opposed to said channel formation region of said second insulating gate type field effect transistor portion in each of said two sides.

6. The semiconductor device according to claim 1, characterized in that a plurality of cells each of which includes said first and second insulating gate type field effect transistor portions are arranged side by side and said first and second stabilizing plate are arranged in a terminal portion of said arranged plurality of cells.

* * * * *